(12) United States Patent
Brindle et al.

(10) Patent No.: US 8,742,502 B2
(45) Date of Patent: *Jun. 3, 2014

(54) METHOD AND APPARATUS FOR USE IN IMPROVING LINEARITY OF MOSFETS USING AN ACCUMULATED CHARGE SINK-HARMONIC WRINKLE REDUCTION

(75) Inventors: Christopher N. Brindle, Poway, CA (US); Jie Deng, South Burlington, VT (US); Alper Genc, San Diego, CA (US); Chieh-Kai Yang, Poway, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/277,108

(22) Filed: Oct. 19, 2011

(65) Prior Publication Data

US 2012/0267719 A1    Oct. 25, 2012

Related U.S. Application Data

(60) Continuation-in-part of application No. 13/053,211, filed on Mar. 22, 2011, now Pat. No. 8,129,787, which is a division of application No. 11/484,370, filed on Jul. 10, 2006, now Pat. No. 7,910,993.

(60) Provisional application No. 61/405,165, filed on Oct. 20, 2010, provisional application No. 60/698,523, filed on Jul. 11, 2005.

(51) Int. Cl.
    *H01L 27/12*    (2006.01)
(52) U.S. Cl.
    USPC .................................................. 257/347
(58) Field of Classification Search
    USPC ......... 455/333, 425, 550.1; 257/105, 40, 347, 257/402, 403, 59, 327, 61, 333, 337, 338, 257/346, 334, 349
    See application file for complete search history.

(56) References Cited

U.S. PATENT DOCUMENTS

| | | | |
|---|---|---|---|
| 3,646,361 A | 2/1972 | Pfiffner |
| 3,699,359 A | 10/1972 | Shelby |
| 3,975,671 A | 8/1976 | Stoll |
| 3,988,727 A | 10/1976 | Scott |
| 4,053,916 A | 10/1977 | Cricchi et al. |

(Continued)

FOREIGN PATENT DOCUMENTS

| | | |
|---|---|---|
| CN | 1256521 | 6/2000 |
| CN | 1256521 A | 6/2000 |

(Continued)

OTHER PUBLICATIONS

Peregrine Semiconductor Corporation, Response filed in the EPO dated May 16, 2011 for related appln No. 11153281.8, 7 pgs.

(Continued)

*Primary Examiner* — Dao H Nguyen
*Assistant Examiner* — Tram H Nguyen
(74) *Attorney, Agent, or Firm* — Jaquez & Land LLP; Martin J. Jaquez, Esq.

(57) ABSTRACT

A method and apparatus for use in improving linearity sensitivity of MOSFET devices having an accumulated charge sink (ACS) are disclosed. The method and apparatus are adapted to address degradation in second- and third-order intermodulation harmonic distortion at a desired range of operating voltage in devices employing an accumulated charge sink.

8 Claims, 27 Drawing Sheets

(56) References Cited

U.S. PATENT DOCUMENTS

| | | | |
|---|---|---|---|
| 4,244,000 A | 1/1981 | Ueda et al. | |
| 4,256,977 A | 3/1981 | Hendrickson | |
| 4,316,101 A | 2/1982 | Minner | |
| 4,317,055 A | 2/1982 | Yoshida et al. | |
| 4,367,421 A | 1/1983 | Baker | |
| 4,390,798 A | 6/1983 | Kurafuji | |
| RE31,749 E | 11/1984 | Yamashiro | |
| 4,638,184 A | 1/1987 | Kimura | |
| 4,736,169 A | 4/1988 | Weaver et al. | |
| 4,739,191 A | 4/1988 | Puar | |
| 4,746,960 A | 5/1988 | Valeri et al. | |
| 4,810,911 A | 3/1989 | Noguchi | |
| 4,825,145 A | 4/1989 | Tanaka et al. | |
| 4,849,651 A | 7/1989 | Estes, Jr. | |
| 4,890,077 A | 12/1989 | Sun | |
| 4,891,609 A | 1/1990 | Eilley | |
| 4,929,855 A | 5/1990 | Ezzeddine | |
| 4,939,485 A | 7/1990 | Eisenberg | |
| 4,984,040 A | 1/1991 | Yap | |
| 4,985,647 A | 1/1991 | Kawada | |
| 4,999,585 A | 3/1991 | Burt et al. | |
| 5,012,123 A | 4/1991 | Ayasli et al. | |
| 5,023,494 A | 6/1991 | Tsukii et al. | |
| 5,061,907 A | 10/1991 | Rasmussen | |
| 5,061,911 A | 10/1991 | Weidman et al. | |
| 5,081,706 A | 1/1992 | Kim | |
| 5,124,762 A | 6/1992 | Childs et al. | |
| 5,146,178 A | 9/1992 | Nojima et al. | |
| 5,182,529 A | 1/1993 | Chern | |
| 5,208,557 A | 5/1993 | Kersh, III | |
| 5,272,457 A | 12/1993 | Heckaman et al. | |
| 5,274,343 A | 12/1993 | Russell et al. | |
| 5,285,367 A | 2/1994 | Keller | |
| 5,306,954 A | 4/1994 | Chan et al. | |
| 5,313,083 A | 5/1994 | Schindler | |
| 5,317,181 A | 5/1994 | Tyson | |
| 5,345,422 A | 9/1994 | Redwine | |
| 5,350,957 A | 9/1994 | Cooper et al. | |
| 5,375,257 A | 12/1994 | Lampen | |
| 5,416,043 A | 5/1995 | Burgener et al. | |
| 5,442,327 A | 8/1995 | Longbrake et al. | |
| 5,446,418 A | 8/1995 | Hara et al. | |
| 5,448,207 A | 9/1995 | Kohama | |
| 5,477,184 A | 12/1995 | Uda et al. | |
| 5,488,243 A | 1/1996 | Tsuruta et al. | |
| 5,492,857 A | 2/1996 | Reedy et al. | |
| 5,493,249 A | 2/1996 | Manning | |
| 5,548,239 A | 8/1996 | Kohama | |
| 5,553,295 A | 9/1996 | Pantelakis et al. | |
| 5,554,892 A | 9/1996 | Norimatsu | |
| 5,572,040 A | 11/1996 | Reedy et al. | |
| 5,576,647 A | 11/1996 | Sutardja | |
| 5,596,205 A | 1/1997 | Reedy et al. | |
| 5,597,739 A | 1/1997 | Sumi et al. | |
| 5,600,169 A | 2/1997 | Burgener et al. | |
| 5,629,655 A | 5/1997 | Dent | |
| 5,663,570 A | 9/1997 | Reedy et al. | |
| 5,670,907 A | 9/1997 | Gorecki et al. | |
| 5,681,761 A | 10/1997 | Kim | |
| 5,694,308 A | 12/1997 | Cave | |
| 5,699,018 A | 12/1997 | Yamamoto et al. | |
| 5,717,356 A | 2/1998 | Kohama | |
| 5,729,039 A | 3/1998 | Beyer et al. | |
| 5,731,607 A | 3/1998 | Kohama | |
| 5,734,291 A | 3/1998 | Tasdighi et al. | |
| 5,748,053 A | 5/1998 | Kameyama et al. | |
| 5,760,652 A | 6/1998 | Yamamoto et al. | |
| 5,774,792 A | 6/1998 | Tanaka et al. | |
| 5,777,530 A | 7/1998 | Nakatuka | |
| 5,784,687 A | 7/1998 | Itoh et al. | |
| 5,793,246 A | 8/1998 | Costello et al. | |
| 5,801,577 A | 9/1998 | Tailliet | |
| 5,807,772 A | 9/1998 | Takemura | |
| 5,808,505 A | 9/1998 | Tsukada | |
| 5,812,939 A | 9/1998 | Kohama | |
| 5,818,099 A | 10/1998 | Burghartz | |
| 5,818,278 A | 10/1998 | Yamamoto et al. | |
| 5,818,283 A | 10/1998 | Tonami et al. | |
| 5,818,289 A | 10/1998 | Chevallier et al. | |
| 5,818,766 A | 10/1998 | Song | |
| 5,821,800 A | 10/1998 | Le et al. | |
| 5,825,227 A | 10/1998 | Kohama et al. | |
| 5,861,336 A | 1/1999 | Reedy et al. | |
| 5,863,823 A | 1/1999 | Burgener | |
| 5,864,328 A | 1/1999 | Kajimoto | |
| 5,874,836 A | 2/1999 | Nowak et al. | |
| 5,874,849 A | 2/1999 | Marotta et al. | |
| 5,878,331 A | 3/1999 | Yamamoto et al. | |
| 5,883,396 A | 3/1999 | Reedy et al. | |
| 5,883,541 A | 3/1999 | Tahara et al. | |
| 5,892,400 A | 4/1999 | van Saders et al. | |
| 5,895,957 A | 4/1999 | Reedy et al. | |
| 5,903,178 A | 5/1999 | Miyatsuji et al. | |
| 5,912,560 A | 6/1999 | Pasternak | |
| 5,917,362 A | 6/1999 | Kohama | |
| 5,920,093 A | 7/1999 | Huang et al. | |
| 5,920,233 A | 7/1999 | Denny | |
| 5,926,466 A | 7/1999 | Ishida et al. | |
| 5,930,638 A | 7/1999 | Reedy et al. | |
| 5,945,867 A | 8/1999 | Uda et al. | |
| 5,959,335 A | 9/1999 | Bryant et al. | |
| 5,969,560 A | 10/1999 | Kohama et al. | |
| 5,973,363 A | 10/1999 | Staab et al. | |
| 5,973,382 A | 10/1999 | Burgener et al. | |
| 5,973,636 A | 10/1999 | Okubo et al. | |
| 5,986,518 A | 11/1999 | Dougherty | |
| 5,990,580 A | 11/1999 | Weigand | |
| 6,020,781 A | 2/2000 | Fujioka | |
| 6,057,555 A | 5/2000 | Reedy et al. | |
| 6,057,723 A | 5/2000 | Yamaji et al. | |
| 6,064,275 A | 5/2000 | Yamauchi | |
| 6,064,872 A | 5/2000 | Vice | |
| 6,066,993 A | 5/2000 | Yamamoto et al. | |
| 6,081,165 A | 6/2000 | Goldman | |
| 6,081,694 A | 6/2000 | Matsuura et al. | |
| 6,094,088 A | 7/2000 | Yano | |
| 6,114,923 A | 9/2000 | Mizutani | |
| 6,118,343 A | 9/2000 | Winslow | |
| 6,122,185 A | 9/2000 | Utsunomiya et al. | |
| 6,133,752 A | 10/2000 | Kawagoe | |
| 6,160,292 A | 12/2000 | Flaker et al. | |
| 6,169,444 B1 | 1/2001 | Thurber, Jr. | |
| 6,173,235 B1 | 1/2001 | Maeda | |
| 6,177,826 B1 | 1/2001 | Mashiko et al. | |
| 6,188,247 B1 | 2/2001 | Storino et al. | |
| 6,188,590 B1 | 2/2001 | Chang et al. | |
| 6,195,307 B1 | 2/2001 | Umezawa et al. | |
| RE37,124 E | 4/2001 | Monk et al. | |
| 6,215,360 B1 | 4/2001 | Callaway, Jr. | |
| 6,218,890 B1 | 4/2001 | Yamaguchi et al. | |
| 6,249,027 B1 * | 6/2001 | Burr | 257/350 |
| 6,249,446 B1 | 6/2001 | Shearon et al. | |
| 6,288,458 B1 | 9/2001 | Berndt | |
| 6,297,687 B1 | 10/2001 | Sugimura | |
| 6,300,796 B1 | 10/2001 | Troutman et al. | |
| 6,308,047 B1 | 10/2001 | Yamamoto et al. | |
| 6,310,508 B1 | 10/2001 | Westerman | |
| 6,316,983 B1 | 11/2001 | Kitamura | |
| 6,337,594 B1 | 1/2002 | Hwang | |
| 6,356,536 B1 | 3/2002 | Repke | |
| 6,365,488 B1 | 4/2002 | Liao | |
| 6,380,793 B1 | 4/2002 | Bancal et al. | |
| 6,380,796 B1 | 4/2002 | Sakai et al. | |
| 6,392,440 B2 | 5/2002 | Nebel | |
| 6,400,211 B1 | 6/2002 | Yokomizo et al. | |
| 6,407,614 B1 | 6/2002 | Takahashi | |
| 6,414,863 B1 | 7/2002 | Bayer et al. | |
| 6,429,632 B1 | 8/2002 | Forbes et al. | |
| 6,429,723 B1 | 8/2002 | Hastings | |
| 6,452,232 B1 | 9/2002 | Adan | |
| 6,461,902 B1 | 10/2002 | Xu et al. | |
| 6,486,511 B1 | 11/2002 | Nathanson et al. | |
| 6,486,729 B2 | 11/2002 | Imamiya | |
| 6,504,212 B1 | 1/2003 | Allen et al. | |

(56) References Cited

U.S. PATENT DOCUMENTS

| | | |
|---|---|---|
| 6,504,213 B1 | 1/2003 | Ebina |
| 6,512,269 B1 | 1/2003 | Bryant et al. |
| 6,537,861 B1 | 3/2003 | Kroell et al. |
| 6,559,689 B1 | 5/2003 | Clark |
| 6,563,366 B1 | 5/2003 | Kohama |
| 6,617,933 B2 | 9/2003 | Ito et al. |
| 6,631,505 B2 | 10/2003 | Arai |
| 6,632,724 B2 | 10/2003 | Henley et al. |
| 6,642,578 B1 | 11/2003 | Arnold et al. |
| 6,653,697 B2 | 11/2003 | Hidaka et al. |
| 6,677,641 B2 | 1/2004 | Kocon |
| 6,684,065 B2 | 1/2004 | Bult |
| 6,693,326 B2 | 2/2004 | Adan |
| 6,693,498 B1 | 2/2004 | Sasabata et al. |
| 6,698,082 B2 | 3/2004 | Crenshaw et al. |
| 6,698,498 B1 | 3/2004 | Ziegelaar et al. |
| 6,704,550 B1 | 3/2004 | Kohama et al. |
| 6,711,397 B1 | 3/2004 | Petrov et al. |
| 6,714,065 B2 | 3/2004 | Komiya et al. |
| 6,717,458 B1 | 4/2004 | Potanin |
| 6,774,701 B1 | 8/2004 | Heston et al. |
| 6,781,805 B1 | 8/2004 | Urakawa |
| 6,788,130 B2 | 9/2004 | Pauletti et al. |
| 6,790,747 B2 | 9/2004 | Henley et al. |
| 6,801,076 B1 | 10/2004 | Merritt |
| 6,803,680 B2 | 10/2004 | Brindle et al. |
| 6,804,502 B2 | 10/2004 | Burgener et al. |
| 6,816,016 B2 | 11/2004 | Sander et al. |
| 6,819,938 B2 | 11/2004 | Sahota |
| 6,830,963 B1 | 12/2004 | Forbes |
| 6,836,172 B2 | 12/2004 | Okashita |
| 6,871,059 B1 | 3/2005 | Piro et al. |
| 6,879,502 B2 | 4/2005 | Yoshida et al. |
| 6,882,210 B2 | 4/2005 | Asano et al. |
| 6,891,234 B1 | 5/2005 | Connelly et al. |
| 6,898,778 B2 | 5/2005 | Kawanaka |
| 6,903,596 B2 | 6/2005 | Geller et al. |
| 6,908,832 B2 | 6/2005 | Farrens et al. |
| 6,917,258 B2 | 7/2005 | Kushitani et al. |
| 6,947,720 B2 | 9/2005 | Razavi et al. |
| 6,969,668 B1 | 11/2005 | Kang et al. |
| 6,975,271 B2 | 12/2005 | Adachi et al. |
| 6,978,122 B2 | 12/2005 | Kawakyu et al. |
| 6,978,437 B1 | 12/2005 | Rittman et al. |
| 7,023,260 B2 | 4/2006 | Thorp et al. |
| 7,042,245 B2 | 5/2006 | Hidaka |
| 7,045,873 B2 | 5/2006 | Chen et al. |
| 7,056,808 B2 | 6/2006 | Henley et al. |
| 7,057,472 B2 | 6/2006 | Kukamachi et al. |
| 7,058,922 B2 | 6/2006 | Kawanaka |
| 7,082,293 B1 | 7/2006 | Rofougaran et al. |
| 7,092,677 B1 | 8/2006 | Zhang et al. |
| 7,109,532 B1 | 9/2006 | Lee et al. |
| 7,123,898 B2 | 10/2006 | Burgener et al. |
| 7,129,545 B2 | 10/2006 | Cain |
| 7,132,873 B2 | 11/2006 | Hollmer |
| 7,138,846 B2 | 11/2006 | Suwa et al. |
| 7,161,197 B2 | 1/2007 | Nakatsuka et al. |
| 7,173,471 B2 | 2/2007 | Nakatsuka et al. |
| 7,199,635 B2 | 4/2007 | Nakatsuka et al. |
| 7,212,788 B2 | 5/2007 | Weber et al. |
| 7,266,014 B2 * | 9/2007 | Wu et al. ................ 365/185.01 |
| 7,269,392 B2 | 9/2007 | Nakajima et al. |
| 7,307,490 B2 | 12/2007 | Kizuki |
| 7,345,342 B2 | 3/2008 | Challa |
| 7,345,521 B2 | 3/2008 | Takahashi et al. |
| 7,355,455 B2 | 4/2008 | Hidaka |
| 7,391,282 B2 | 6/2008 | Nakatsuka et al. |
| 7,404,157 B2 | 7/2008 | Tanabe |
| 7,432,552 B2 | 10/2008 | Park |
| 7,460,852 B2 | 12/2008 | Burgener et al. |
| 7,515,882 B2 | 4/2009 | Kelcourse et al. |
| 7,546,089 B2 | 6/2009 | Bellantoni |
| 7,561,853 B2 | 7/2009 | Miyazawa |
| 7,616,482 B2 | 11/2009 | Prall |
| 7,659,152 B2 | 2/2010 | Gonzalez et al. |
| 7,733,156 B2 | 6/2010 | Brederlow et al. |
| 7,733,157 B2 | 6/2010 | Brederlow et al. |
| 7,741,869 B2 | 6/2010 | Hidaka |
| 7,796,969 B2 | 9/2010 | Kelly et al. |
| 7,860,499 B2 | 12/2010 | Burgener et al. |
| 7,890,891 B2 | 2/2011 | Stuber et al. |
| 7,910,993 B2 * | 3/2011 | Brindle et al. ................ 257/347 |
| 7,928,759 B2 | 4/2011 | Hidaka |
| 7,982,265 B2 | 7/2011 | Challa et al. |
| 8,081,928 B2 | 12/2011 | Kelly |
| 8,129,787 B2 | 3/2012 | Brindle et al. |
| 8,405,147 B2 | 3/2013 | Brindle et al. |
| 8,527,949 B1 * | 9/2013 | Pleis et al. ................ 717/121 |
| 8,583,111 B2 | 11/2013 | Burgener et al. |
| 8,669,804 B2 | 3/2014 | Ranta et al. |
| 2001/0015461 A1 | 8/2001 | Ebina |
| 2001/0031518 A1 | 10/2001 | Kim et al. |
| 2001/0040479 A1 | 11/2001 | Zhang |
| 2001/0045602 A1 | 11/2001 | Maeda et al. |
| 2002/0115244 A1 | 8/2002 | Park et al. |
| 2002/0126767 A1 | 9/2002 | Ding et al. |
| 2002/0195623 A1 | 12/2002 | Horiuchi |
| 2003/0002452 A1 | 1/2003 | Sahota |
| 2003/0141543 A1 | 7/2003 | Bryant et al. |
| 2003/0160515 A1 | 8/2003 | Yu et al. |
| 2003/0181167 A1 | 9/2003 | Iida |
| 2003/0201494 A1 | 10/2003 | Maeda et al. |
| 2003/0205760 A1 | 11/2003 | Kawanaka et al. |
| 2004/0021137 A1 | 2/2004 | Fazan et al. |
| 2004/0061130 A1 | 4/2004 | Morizuka |
| 2004/0080364 A1 | 4/2004 | Sander et al. |
| 2004/0129975 A1 | 7/2004 | Koh et al. |
| 2004/0204013 A1 | 10/2004 | Ma et al. |
| 2004/0242182 A1 | 12/2004 | Hidaka et al. |
| 2005/0017789 A1 | 1/2005 | Burgener et al. |
| 2005/0077564 A1 | 4/2005 | Forbes |
| 2005/0079829 A1 | 4/2005 | Ogawa et al. |
| 2005/0121699 A1 | 6/2005 | Chen et al. |
| 2005/0127442 A1 | 6/2005 | Veeraraghavan |
| 2005/0167751 A1 | 8/2005 | Nakajima et al. |
| 2005/0212595 A1 | 9/2005 | Kusunoki et al. |
| 2005/0264341 A1 | 12/2005 | Hikita et al. |
| 2006/0009164 A1 | 1/2006 | Kataoka |
| 2006/0194558 A1 | 8/2006 | Kelly |
| 2006/0194567 A1 | 8/2006 | Kelly et al. |
| 2006/0267093 A1 * | 11/2006 | Tang et al. ................ 257/347 |
| 2007/0018247 A1 | 1/2007 | Brindle et al. |
| 2007/0023833 A1 | 2/2007 | Okhonin et al. |
| 2007/0045697 A1 | 3/2007 | Cheng et al. |
| 2007/0069291 A1 | 3/2007 | Stuber et al. |
| 2007/0120103 A1 | 5/2007 | Burgener et al. |
| 2007/0279120 A1 | 12/2007 | Brederlow et al. |
| 2007/0290744 A1 | 12/2007 | Adachi et al. |
| 2008/0073719 A1 * | 3/2008 | Fazan et al. ................ 257/347 |
| 2008/0076371 A1 | 3/2008 | Dribinsky et al. |
| 2008/0191788 A1 | 8/2008 | Chen et al. |
| 2008/0303080 A1 | 12/2008 | Bhattacharyya |
| 2009/0029511 A1 * | 1/2009 | Wu ................ 438/261 |
| 2009/0117871 A1 | 5/2009 | Burgener et al. |
| 2011/0163779 A1 | 7/2011 | Hidaka |
| 2011/0169550 A1 | 7/2011 | Brindle et al. |
| 2011/0227637 A1 | 9/2011 | Stuber et al. |
| 2012/0169398 A1 * | 7/2012 | Brindle et al. ................ 327/434 |
| 2013/0293280 A1 | 11/2013 | Brindle et al. |

FOREIGN PATENT DOCUMENTS

| | | |
|---|---|---|
| DE | 19832565 | 8/1999 |
| DE | 112011103554 | 9/2013 |
| EP | 385641 | 9/1990 |
| EP | 0622901 | 11/1994 |
| EP | 782267 | 7/1997 |
| EP | 0788185 | 8/1997 |
| EP | 913939 | 5/1999 |
| EP | 625831 | 11/1999 |
| EP | 1006584 A2 | 6/2000 |
| EP | 1006584 | 7/2000 |
| EP | WO03032431 | 4/2003 |

(56) References Cited

FOREIGN PATENT DOCUMENTS

| | | |
|---|---|---|
| EP | 1925030 | 5/2008 |
| EP | 2348532 | 7/2011 |
| EP | 2348532 A2 | 7/2011 |
| EP | 2348533 | 7/2011 |
| EP | 2348533 A2 | 7/2011 |
| EP | 2348534 | 7/2011 |
| EP | 2348534 A2 | 7/2011 |
| EP | 2348535 | 7/2011 |
| EP | 2348535 A2 | 7/2011 |
| EP | 2348536 | 7/2011 |
| EP | 2348536 A2 | 7/2011 |
| EP | 2387094 | 11/2011 |
| JP | 55-75348 | 6/1980 |
| JP | 1254014 | 10/1989 |
| JP | 02-161769 | 6/1990 |
| JP | 2161769 | 6/1990 |
| JP | 04-34980 | 2/1992 |
| JP | 4183008 | 6/1992 |
| JP | 5299995 | 11/1993 |
| JP | 6112795 | 4/1994 |
| JP | 06-314985 | 11/1994 |
| JP | 06-334506 | 12/1994 |
| JP | 6334506 | 12/1994 |
| JP | A-06-334506 | 12/1994 |
| JP | 7046109 | 2/1995 |
| JP | 07-070245 | 3/1995 |
| JP | 07106937 | 4/1995 |
| JP | 8023270 | 1/1996 |
| JP | 8070245 | 3/1996 |
| JP | 8148949 | 6/1996 |
| JP | 11163704 | 6/1996 |
| JP | 8251012 | 9/1996 |
| JP | 08-307305 | 11/1996 |
| JP | A-08-307305 | 11/1996 |
| JP | 8330930 | 12/1996 |
| JP | 9008627 | 1/1997 |
| JP | 9041275 | 2/1997 |
| JP | 9055682 | 2/1997 |
| JP | 9092785 | 4/1997 |
| JP | 9148587 | 6/1997 |
| JP | 09163721 | 6/1997 |
| JP | 9163721 | 6/1997 |
| JP | 09-200021 | 7/1997 |
| JP | 9181641 | 7/1997 |
| JP | 9186501 | 7/1997 |
| JP | 09200021 | 7/1997 |
| JP | 9200074 | 7/1997 |
| JP | 9238059 | 9/1997 |
| JP | 9243738 | 9/1997 |
| JP | 09-008621 | 10/1997 |
| JP | 09-284114 | 10/1997 |
| JP | 9270659 | 10/1997 |
| JP | 9284114 | 10/1997 |
| JP | 9284170 | 10/1997 |
| JP | 9298493 | 10/1997 |
| JP | 9326642 | 12/1997 |
| JP | 10079467 | 3/1998 |
| JP | 10-93471 | 4/1998 |
| JP | 10-242477 | 9/1998 |
| JP | 10-242829 | 9/1998 |
| JP | 10242826 | 9/1998 |
| JP | A-10-242829 | 9/1998 |
| JP | 10-344247 | 12/1998 |
| JP | 10335901 | 12/1998 |
| JP | 11026776 | 1/1999 |
| JP | 11112316 | 4/1999 |
| JP | 11-136111 | 5/1999 |
| JP | 11163642 | 6/1999 |
| JP | 11205188 | 7/1999 |
| JP | 11274804 | 10/1999 |
| JP | 2000031167 | 1/2000 |
| JP | 2000183353 | 6/2000 |
| JP | 2000188501 | 7/2000 |
| JP | 2000208614 | 7/2000 |
| JP | 2000223713 | 8/2000 |
| JP | 2000243973 | 9/2000 |
| JP | 2000277703 | 10/2000 |
| JP | 2000294786 | 10/2000 |
| JP | 2000311986 | 11/2000 |
| JP | 2001007332 | 1/2001 |
| JP | 2001089448 | 3/2001 |
| JP | 2001-119281 | 4/2001 |
| JP | 2001157487 | 5/2001 |
| JP | 2001156182 | 6/2001 |
| JP | 2001274265 | 10/2001 |
| JP | 2004515937 | 5/2002 |
| JP | 2002164441 | 6/2002 |
| JP | 2003060451 | 2/2003 |
| JP | 2003101407 | 4/2003 |
| JP | 2003143004 | 5/2003 |
| JP | 2003167615 | 6/2003 |
| JP | 2003189248 | 7/2003 |
| JP | 2003332583 | 11/2003 |
| JP | 2002156602 | 12/2003 |
| JP | 2004-147175 | 5/2004 |
| JP | 2004166470 | 6/2004 |
| JP | 2004199950 | 7/2004 |
| JP | 2004288978 | 10/2004 |
| JP | 2005-251931 | 9/2005 |
| JP | 5215850 | 3/2013 |
| KR | 1994027615 | 12/1994 |
| WO | WO86/01037 | 2/1986 |
| WO | WO9523460 | 8/1995 |
| WO | WO9806174 | 2/1998 |
| WO | WO9935695 | 7/1999 |
| WO | WO0227920 | 4/2002 |
| WO | WO2007/008934 A1 | 1/2007 |
| WO | WO2007/035610 A2 | 3/2007 |
| WO | WO2007033045 A2 | 3/2007 |
| WO | WO2012054642 | 4/2012 |

OTHER PUBLICATIONS

Hoffman, Niels, Extended Search Report received from the EPO dated May 8, 2012 for related appln. No. 11153281.8, 4 pgs.

Peregrine Semiconductor Corporation, Response filed in the EPO dated May 16, 2011 for related appln No. 11153313.9, 8 pgs.

Hoffman, Niels, Extended Search Report received from the EPO dated May 8, 2012 for related appln. No. 11153313.9, 4 pgs.

Peregrine Semiconductor Corporation, Translation of Response filed in the Chinese Patent Office on Feb. 29, 2012 for related appln. No. 200680025128.7, 1 pg.

Peregrine Semiconductor Corporation, Translation of Response filed in the Chinese Patent Office on Jun. 20, 2012 for related appln. No. 200680025128.7, 12 pgs.

Stuber, et al., Response filed in the USPTO for related U.S. Appl. No. 11/520,912, dated Sep. 8, 2009, 3 pgs.

Nguyen, Tram Hoang, Office Action received from the USPTO dated Apr. 11, 2012 for related U.S. Appl. No. 13/412,529, 6 pgs.

Shingleton, Michael B., Notice of Allowance received from the USPTO dated Jun. 4, 2012 for related U.S. Appl. No. 11/881,816, 13 pgs.

Stuber, et al., Response filed in the USPTO dated Feb. 21, 2012 for related U.S. Appl. No. 13/028,144, 3 pgs.

Tat, Binh C., Office Action received from the USPTO dated Apr. 12. 2012 for related U.S. Appl. No. 13/028,144, 19 pgs.

Unterberger, Michael, extended European Search Report received from the EPO dated Sep. 30, 2011 for related appln. No. 10011669. 8-2220, 9 pgs.

Peregrine Semiconductor Corporation, Response filed in EPO dated May 15, 2012 for related appln. No. 10011669.8, 19 pgs.

Weman, Eva, Communication of a Notice of Opposition received from the EPO dated Nov. 8, 2011 for related appln. No. 028000982.7, 34 pgs.

Kelly, Dylan, Amendment filed in the USPTO dated Dec. 20, 2012 for related U.S. Appl. No. 11/347,671, 10 pgs.

Kelly, Dylan, Comments on Examiner's Statement of Reasons for Allowance filed in the USPTO dated Nov. 16, 2011 for related U.S. Appl. No. 11/347,671, 4 pgs.

F. Hameau and O. Rozeau, "Radio-Frequency Circuits Integration Using CMOS SOI 0.25µm Technology", 2002 RF IC Design Workshop Europe, Mar. 19-22, 2002, Grenoble, France.

(56) References Cited

OTHER PUBLICATIONS

O. Rozeau et al., "SOI Technologies Overview for Low-Power Low-Voltage Radio-Frequency Applications," Analog Integrated Circuits and Signal Processing, 25, pp. 93-114, Boston, MA, Kluwer Academic Publishers, Nov. 2000.
C. Tinella et al., "A High-Performance CMOS-SOI Antenna Switch for the 2.55-GHz Band, "IEEE Journal of Solid-State Circuits, vol. 38, No. 7, Jul. 2003.
H. Lee et al., "Analysis of body bias effect with PD-SOI for analog and RF applications," Solid State Electron., vol. 46, pp. 1169-1176, 2002.
J.-H. Lee, et al., "Effect of Body Structure on Analog Performance of SOI NMOSFETs," Proceedings, 1998 IEEE International SOI Conference, Oct. 5-8, 1998, pp. 61-62.
C. F. Edwards, et al., "The Effect of Body Contact Series Resistance on SOI CMOS Amplifier Stages," IEEE Transactions on Electron Devices, vol. 44, No. 12, Dec. 1997 pp. 2290-2294.
S. Maeda, et al., Substrate-bias Effect and Source-drain Breakdown Characteristics in Body-tied Short-channel SOI MOSFETs, IEEE Transactions on Electron Devices, vol. 46, No. 1, Jan. 1999 pp. 151-158.
F. Assaderaghi, et al., "Dynamic Threshold-voltage MOSFET (DTMOS) for Ultra-low Voltage VLSI," IEEE Transactions on Electron Devices, vol. 44, No. 3, Mar. 1997, pp. 414-422.
G. O. Workman and J. G. Fossum, "A Comparative Analysis of the Dynamic Behavior of BTG/SOI MOSFETs and Circuits with Distributed Body Resistance," IEEE Transactions on Electron Devices, vol. 45, No. 10, Oct. 1998 pp. 2138-2145.
T.-S. Chao, et al., "High-voltage and High-temperature Applications of DTMOS with Reverse Schottky Barrier on Substrate Contacts," IEEE Electron Device Letters, vol. 25, No. 2, Feb. 2004, pp. 86-88.
Kuang, et al., "SRAM Bitline Circuits on PD SOI: Advantages and Concerns", IEEE Journal of Solid-State Circuits, vol. 32, No. 6, Jun. 1997.
Chung, et al., "SOI MOSFET Structure with a Junction-Type Body Contact for Suppression of Pass Gate Leakage", IEEE Transactions on Electron Devices, vol. 48, No. 7, Jul. 2001.
Lee, et al., "Effects of Gate Structures on the RF Performance in PD SOI MOSFETs", IEEE Microwave and Wireless Components Letters, vol. 15, No. 4, Apr. 2005.
Hirano, et al., "Impact of Actively Body-bias Controlled (ABC) SOI SRAM by using Direct Body Contact Technology for Low-Voltage Application" IEEE, 2003, pp. 2.4.1-2.4.4.
Lee, et al., "Harmonic Distortion Due to Narrow Width Effects in Deep sub-micron SOI-CMOS Device for analog-RF applications", 2002 IEEE International SOI Conference, Oct. 2002.
Orndorff, et al., "CMOS/SOS/LSI Switching Regulator Control Device", ISSCC 78, Feb. 17, 2978, IEEE International Solid-State Circuits Conference, pp. 234-235 and 282.
Kuo, et al., "Low-Voltage SOI CMOS VLSI Devices and Circuits", 2001, Wiley Interscience, New York, XP001090589, pp. 57-60 and 349-354.
Tat, Binh C., International Search Report and Written Opinion received from USRO dated Jul. 3, 2008 in related application No. PCT/US06/36240, 10 pgs.
Tat, Binh C., Office Action received from USPTO dated Sep. 15, 2008 for related U.S. Appl. No. 11/520,912, 18 pgs.
Shingleton, Michael B., Office Action dated Oct. 7, 2008 received from the USPTO for related U.S. Appl. No. 11/881,816, 4 pgs.
Hoffman, Niels, Communication from the EPO dated Feb. 4, 2009 for related appln No. 06786943.8, 7 pgs.
Shingleton, Michael B., Communication received from the USPTO dated Apr. 28, 2009 for related U.S. Appl. No. 11/881,816, 3 pgs.
Tat, Binh C., Office Action received from USPTO dated Jul. 8, 2009 for related U.S. Appl. No. 11/520,912, 6 pgs.
Dribinsky, et al, Response filed in USPTO dated Aug. 28, 2009 for related U.S. Appl. No. 11/881,816, 5 pgs.
Photocopy of a translation of an Office Action dated Jul. 31, 2009 for related Chinese appln. No. 200680025128.7, 3 pages.
Stuber, Michael, et al., Photocopy of a Response that was filed in the UPSTO for related U.S. Appl. No. 11/520,060, dated Sep. 8, 2009, 3 pgs.
Tat, Binh C., Office Action received from the USPTO dated Dec. 10, 2009 for related U.S. Appl. No. 11/520,912, 19 pages.
Shingleton, Michael B., Office Action received from the USPTO dated Jan. 19, 2010 for related U.S. Appl. No. 11/881,816, 16 pgs.
Brindle, Chris, et al., Translation of a Response filed in the Chinese Patent Office for related appln No. 200680025128.7 dated Nov. 30, 2009, 3 pages.
Morena, Enrico, Supplementary European Search Report for related appln. No. 06814836.0, dated Feb. 17, 2010, 8 pages.
Kuang, J.B., et al., "A Floating-Body Charge Monitoring Technique for Partially Depleted SOI Technology", Int. J. of Electronics, vol. 91, No. 11, Nov. 11, 2004, pp. 625-637.
Stuber, et al., Amendment filed in the USPTO for related U.S. Appl. No. 11/520,912, dated Jun. 10, 2010, 25 pages.
Sedra, Adel A., et al., "Microelectronic Circuits", Fourth Edition, University of Toronto, Oxford University Press, 1982, 1987, 1991 and 1998, pp. 374-375.
Tat, Binh C., Notice of Allowance received from the USPTO for related U.S. Appl. No. 11/520,912, dated Sep. 16, 2010, 13 pages.
Brindle, et al., Response filed in the EPO for related application No. 06 814 836.0-1235 dated Oct. 12, 2010, 24 pages.
Bolam, et al., "Reliability Issues for Silicon-on-Insulator", IBM Microelectronics Division, IEEE 2000, pp. 6.4.1-6.4.4.
Hu, et al., "A Unified Gate Oxide Reliability Model", IEEE 37th Annual International Reliability Physics Symposium, San Diego, CA 1999, pp. 47-51.
Tat, Binh C., Office Action received from USPTO for related U.S. Appl. No. 11/520,912, dated Sep. 15, 2008, 18 pgs.
Nguyen, Tran Hoang, Office Action received from the USPTO dated Sep. 19, 2008 for related U.S. Appl. No. 11/484,370, 7 pgs.
Brindle, et al., Response filed in the USPTO dated Jan. 20, 2009 for related U.S. Appl. No. 11/484,370, 7 pgs.
Nguyen, Tram Hoang, Office Action received from the USPTO dated Apr. 23, 2009 for related U.S. Appl. No. 11/484,370, 11 pgs.
Brindle, et al., Response filed in the USPTO dated Aug. 24, 2009 for related U.S. Appl. No. 11/484,370, 8 pgs.
Nguyen, Tram Hoang, Office Action received from the USPTO dated Jan. 6, 2010 for related U.S. Appl. No. 11/484,370, 46 pgs.
Brindle, et al., Amendment filed in the USPTO dated Jul. 6, 2010 for related U.S. Appl. No. 11/484,370, 32 pgs.
Nguyen, Tram Hoang, Notice of Allowance received from the USPTO dated Nov. 12, 2010 for related U.S. Appl. No. 11/484,370, 21 pgs.
Hoffmann, N., Summons to Attend Oral Proceedings pursuant to Rule 115(1) EPC received from the EPO dated Jul. 22, 2011 for related appln. No. 06786943.8, 8 pgs.
Stuber, Michael, et al., Photocopy of an Amendment filed in the USPTO dated Mar. 16, 2009 for related U.S. Appl. No. 11/520,912, 21 pgs.
Shingleton, Michael B., Advisory Action received from the USPTO dated Mar. 18, 2011 for related U.S. Appl. No. 11/881,816, 3 pgs.
Shingleton, Michael B., Interview Summary received from the USPTO dated Apr. 18, 2011 for related U.S. Appl. No. 11/881,816, 3 pgs.
Nguyen, Tram Hoang, Examiner Amendment received from the USPTO dated Nov. 1, 2010 for related U.S. Appl. No. 11/484,370, 7 pgs.
Brindle, et al., Response filed in the EPO for related application No. 06814836.0-1235 dated Oct. 12, 2010, 24 pgs.
Peregrine Semiconductor Corporation, Response to Communication filed in the EPO dated Aug. 12, 2009 for related application No. 06786943,8, 31 pgs.
Iperione, Analia, International Search Report and Written Opinion received from the EPO dated Nov. 7, 2006 for related appln. No. PCT/US2006/026965, 19 pgs.
Geier, Adolf, International Preliminary Report on Patentability received from the EPo dated Jun. 21, 2007 for related appln. No. PCT/US2006/026965, 12 pgs.

(56) References Cited

OTHER PUBLICATIONS

Stuber, et al., Proposed Amended Claims for Examiner's Consideration filed in the USPTO dated Aug. 27, 2010 for related U.S. Appl. No. 11/520,912, 11 pgs.
Stuber, et al., Comments on Examiner's Statement of Reasons for Allowance filed in the USPTO dated Dec. 15, 2010 for related U.S. Appl. No. 11/520,912, 5 pgs.
Huang, "A 0.5 um CMOS T/R Switch for 900-MHz Wireless Applications"; IEEE Journal of Solid-State Circuits, vol. 36, No. 3, Mar. 2001, pp. 486-492.
Lauterbach, et al. "Charge Sharing Concept and New Clocking Scheme for Power Efficiency and Electromagnetic Emission Improvement of Boosted Charge Pumps", IEEE Journal of Solid-State Circuits, vol. 35, No. 5, May 2000, pp. 719-723.
Makioka, et al., "Super Self-Aligned GaAs RF Switch IC with 0.25 dB Extremely Low Insertion Loss for Mobile Communication Systems", IEEE Transactions on Electron Devices, vol. 48, No. 8, Aug. 2001, pp. 1510-1514.
Tieu, Binh, Office Action received from the USPTO dated Jun. 3, 2005 for related U.S. Appl. No. 10/922,135, 8 pgs.
Rodgers, et al., "Silicon UTSi COMS RFIC for CDMA Wireless Communications Systems", Peregrine Semiconductor Corporation, 1999 IEEE MTT-S Digest, p. 485-488.
Megahed, et al., "Low Cost UTSI Technology for RF Wireless Applications", Peregrine Semiconductor Corporation, 1998 IEEE MTT-S Digest p. 981-984.
Burgener, et al., Amendment filed in the USPTO dated Dec. 5, 2005 for related U.S. Appl. No. 10/922,135, 7 pgs.
Burgener, CMOS SOS Switched Offer Useful Features, High Integration, CMOS SOS Switches, Microwaves & RF, Aug. 2001, p. 107-118.
Johnson, et al., "Advanced Thin-Film Silicon-on-Sapphire Technology: Microwave Circuit Applications", IEEE Transactions on Electron Devices, vol. 45, No. 5, May 1998, pp. 1047-1054.
Miyajima, Notice of Reasons for Refusal received from the Japanese Patent Office for appln. No. 2003-535287 dated Feb. 13, 2006, 3 pgs.
Tieu, Binh, Office Action received from USPTO dated Jan. 17, 2006 for related U.S. Appl. No. 10/922,135, 8 pgs.
Burgener, Response filed in the UPSTO including Terminal Disclaimer dated May 16, 2006 for U.S. Appl. No. 10/922,135, 6 pgs.
Tieu, Binh, Notice of Allowance received from the USPTO dated Jun. 2, 2006 for related U.S. Appl. No. 10/922,135, 5 pgs.
Tieu, Binh, Notice of Allowance received from the USPTO dated May 12, 2004 for related U.S. Appl. No. 10/267,531, 7 pgs.
Burgener, et al., Comments on Examiner's Statement of Reasons for Allowance dated Aug. 12, 2004 for related U.S. Appl. No. 10/267,531, 2 pgs.
Dribinsky, et al., Response filed in the USPTO dated Jan. 7, 2009 for related U.S. Appl. No. 11/881,816, 7 pgs.
Weman, Eva, Communication under Rule 71(3) EPC and Annex Form 2004 received from the European Patent Office for related appln. No. 02800982.7 ated Nov. 27, 2009, 68 pgs.
Kelly, Dylan, et al., Response and Terminal Disclaimers filed in the USPTO for related U.S. Appl. No. 11/347,014, dated Mar. 16, 2010, 10 pgs.
Dribinsky, et al., Response filed in the USPTO for related U.S. Appl. No. 11/881,816, dated Jul. 19, 2010, 22 pgs.
Tieu, Binh Kien, Notice of Allowance received from the USPTO for related U.S. Appl. No. 11/347,014, dated Apr. 29, 2010, 12 pgs.
Shingleton, Michael B., Office Action received from the USPTO dated Oct. 14, 2010 for related U.S. Appl. No. 11/881,816, 15 pgs.
Dribinsky, et al., Response filed in the USPTO dated Jan. 14, 2011 for related U.S. Appl. No. 11/881,816, 19 pgs.
Shifrin, Mitchell B., "Monolithic FET Structures for High-Power Control Component Applications", IEEE Transactions on Microwave Theory and Techniques, vol. 37, No. 12, Dec. 1989, pp. 2134-2141.
Miyajima, Ikumi, Notice of Reasons for Refusal received from the JPO dated Oct. 5, 2006 for related appln. No. 2003-535287, 4 pgs.

Tieu, Binh Kien, Office Action received from the USPTO dated Nov. 15, 2007 for related U.S. Appl. No. 11/582,206, 9 pgs.
Dinh, Le T., International Search Report received from the USRO dated Mar. 28, 2003 for related appln No. PCT/US02/32266, 2 pgs.
Burgener, et al., Amendment filed in the USPTO dated May 15, 2008 for related U.S. Appl. No. 11/582,206, 14 pgs.
Tieu, Binh Kien, Notice of Allowance received in the USPTO dated Jul. 15, 2008 for related U.S. Appl. No. 11/582,206, 7 pgs.
Van der Peet, H., Communication Pursuant to Article 94(3) EPC received from the EPO in related appln. No. 02800982.7-2220, dated Jun. 19, 2008, 3 pgs.
Caverly, Robert H., "A Silicon CMOS Monolithic RF and Microwave Switching Element", 1997 European Microwave Conference, Jerusalem, Sep. 1987, 4 pgs.
Van der Peet, H., Communication pursuant to Article 94(3) EPC for related application No. 02800982.7-2220 dated Aug. 6, 2009, 2 pgs.
Tieu, Binh Kien, Office Action received from the USPTO dated Sep. 16, 2009 for related U.S. Appl. No. 11/347,014, 26 pgs.
Shingleton, Michael B, Notice of Allowance received from the USPTO for related U.S. Appl. No. 11/881,816, dated Oct. 12, 2011, 5 pgs.
Tieu, Binh Kien, Notice of Allowance received from the USPTO dated Aug. 11, 2010 for related U.S. Appl. No. 12/315,395, 26 pgs.
Kelly, et al., Comments on Examiner's Statement of Reasons for Allowance filed in the USPTO dated Jul. 29, 2010 for related U.S. Appl. No. 11/347,014, 2 pgs.
Chow, Charles Chiang, Office Action received from the USPTO dated Aug. 19, 2008 for related U.S. Appl. No. 11/347,671, 14 pgs.
Kelly, Dylan, Amendment filed in the USPTO dated Dec. 19, 2008 for related U.S. Appl. No. 11/347,671, 12 pgs.
Chow, Charles Chiang, Office Action received from the USPTO dated Apr. 16, 2009 for related U.S. Appl. No. 11/347,671, 16 pgs.
Kelly, Dylan, Response filed in the USPTO dated Jun. 16, 2009 for related U.S. Appl. No. 11/347,671, 14 pgs.
Chow, Charles Chiang, Office Action received from the USPTO dated Jul. 20, 2009 for related U.S. Appl. No. 11/347,671, 17 pgs.
Kelly, Dylan, Amendment filed in the USPTO dated Jan. 20, 2010 for related U.S. Appl. No. 11/347,671, 18 pgs.
Chow, Charles Chiang, Office Action received from the USPTO dated Apr. 28, 2010 for related U.S. Appl. No. 11/347,671, 20 pgs.
Kelly, Dylan, Amendment filed in the USPTO dated Jul. 28, 2010 for related U.S. Appl. No. 11/347,671, 6 pgs.
Chow, Charles Chiang, Office Action received from the USPTO dated Aug. 20, 2010 for related U.S. Appl. No. 11/347,671, 18 pgs.
Kelly, Dylan, Amendment filed in the USPTO dated Dec. 20, 2010 for related U.S. Appl. No. 11/347,671, 12 pgs.
Chow, Charles Chiang, Office Action received from the USPTO dated Mar. 2, 2011 for related U.S. Appl. No. 11/347,671, 15 pgs.
Kelly, Dylan, Amendment filed in the USPTO dated May 2, 2011 for related U.S. Appl. No. 11/347,671, 6 pgs.
Chow, Charles Chiang, Advisory Action received from the USPTO dated May 12, 2011 for related U.S. Appl. No. 11/347,671, 3 pgs.
Kelly, Dylan, Notice of Appeal filed in the USPTO dated Jun. 2, 2011 for related U.S. Appl. No. 11/347,671, 6 pgs.
Chow, Charles Chiang, Notice of Panel Decision from Pre-Appeal Brief Review dated Jul. 11, 2011 for related U.S. Appl. No. 11/347,671, 2 pgs.
Kelly, Dylan, Supplemental Amendment filed in the USPTO dated Aug. 9, 2011 for related U.S. Appl. No. 11/347,671, 3 pgs.
Chow, Charles Chiang, Notice of Allowance dated Aug. 16, 2011 for related U.S. Appl. No. 11/347,671, 12 pgs.
Peregrine Semiconductor Corporation, Reply filed in the EPO dated Oct. 24, 2011 for related appln. No. 06786943.8, 1 pg.
Chinese Patent Office, a translation of a Chinese Office Action dated Nov. 2, 2011 for related appln. No. 200680025128.7, 12 pgs.
Juhl, Andreas, Decision to refuse a European patent application received from the EPO dated Nov. 18, 2011 for related appln. No. 06786943.8-1528, 4 pgs.
Tat, Binh C., Office Action received from the USPTO dated Jan. 18, 2012 for related U.S. Appl. No. 13/028,144, 33 pgs.
Nguyen, Tram Hoang, Notice of Allowance received from the USPTO dated Nov. 17, 2011 for related U.S. Appl. No. 13/053,211, 41 pgs.

(56) References Cited

OTHER PUBLICATIONS

Hoffmann, Niels, International Search Report received from the EPO dated Feb. 27, 2012, 12 pgs.

Iijima, M, et al., "Boosted Voltage Scheme with Active Body-Biasing Control on PD-SOI for Ultra Low Voltage Operation", IEICE Transactions on Electronics, Institute of Electronics, vol. E90C, No. 4, Apr. 1, 2007, pp. 666-674.

Peregrine Semiconductor Corporation, Response filed in the EPO dated Jan. 17, 2012 for related appln. No. 06786943.8, 1 pg.

Peregrine Semiconductor Corporation, Appeal to the Decision for Refusal filed in the EPO dated Mar. 20, 2012 for related appln No. 06786943.1, 27 pgs.

Peregrine Semiconductor Corporation, Response filed in the EPO dated May 16, 2011 for related appln No. 11153227.1, 5 pgs.

Hoffman, Niels, Extended Search Report received from the EPO dated May 4, 2012 for related appln. No. 11153227.1, 4 pgs.

Peregrine Semiconductor Corporation, Response filed in the EPO dated May 16, 2011 for related appln No. 11153247.9, 6 pgs.

Hoffman, Niels, Extended Search Report received from the EPO dated May 7, 2012 for related appln. No. 111153247.9, 4 pgs.

Peregrine Semiconductor Corporation, Response filed in the EPO dated May 16, 2011 for related appln No. 11153241.2, 5 pgs.

Hoffman, Niels, Extended Search Report received from the EPO dated May 7, 2012 for related appln. No. 11153241.2, 4 pgs.

Wang, Chi-Chang, et al., "Efficiency Improvement in Charge Pump Circuits", IEEE Journal of Solid-State Circuits, vol. 32, No. 6, Jun. 1997, pp. 852-860.

Yamamoto, Kazuya, et al., "A 2.2-V Operation, 2.4-GHz Single-Chip GaAs MMIC Transceiver for Wireless Applications", IEEE Journal of Solid-State Circuits, vol. 34, No. 4, Apr. 1999, pp. 502-512.

Hiramoto, Toshiro, et al., "Low Power and Low Voltage MOSFETs with Variable Threshold Voltage Controlled by Back-Bias", IEICE Trans. Electron, vol. E83-C, No. 2, Feb. 2000, pp. 161-169.

Su, Pin, et al., "On the Body-Source Built-In Potential Lowering of SOI MOSFETs", IEEE Electron Device Letters, vol. 24, No. 2, Feb. 2003, pp. 90-92.

Yang, Min, "Sub-100nm Vertical MOSFET's with Si1-x-y GexCy Source/Drains", a dissertation presented to the faculty of Princeton University, Jun. 2000, 272 pgs.

Ytterdal, T., et al., "MOSFET Device Physics and Operation", Device Modeling for Analog and RF CMOS Circuit Design, 2003 John Wiley & Sons, Ltd., 46 pgs.

Cherne, et al., U.S. Statutory Invention Registration, Reg. No. H1435, published May 2, 1995, 12 pgs.

Fuse, et al., "A 0.5V 200MHz 1-Stage 32b ALU Using a Body Bias Controlled SOI Pass-Gate Logic", IEEE Int'l Solid-State Circuits Conference, Feb. 1997.

Douseki, et al., "A 0.5-V MTCMOS/SIMOX Logic Gate", IEEE Journal of Solid-State Circuits, vol. 32, No. 10, Oct. 1997.

Douseki, et al., "A 0.5v SIMOX-MTMCOS Circuit with 200ps Logic Gate", IEEE Int'l Solid-State Circuits Conference, 1996, pp. 84-85, 423.

Shimomura, et al., "A 1-V 46-ns. 16-mb SOI-DRAM with Body Control Technique", IEEE Journal of Solid-State Circuits, vol. 32, No. 11, Nov. 1997, pp. 1712-1720.

Ueda, et al., "A CAD Compatible SOI/CMOS Gate Array Having Body Fixed Partially Depleted Transistors", IEEE Int'l Solid-State Circuits Conference, Feb. 8, 1997, pp. 288-289.

Workman, et al., "A Comparative Analysis of the Dynamic Behavior of BTG/SOI MOSFETs and Circuits with Distributed Body Resistance", IEEE Transactions on Electron Devices, vol. 45, No. 10, Oct. 1998, pp. 2138-2145.

Kuang, et al., "A Dynamic Body Discharge Technique for SOI Circuit Applications", IEEE Int'l SOI Conference, Oct. 1999, pp. 77-78.

Assaderaghi, et al., "A Dynamic Threshold Voltage MOSFET (DTMOS) for Ultra-Low Voltage Operation", Int'l Electron Devices Meeting, Dec. 1994, pp. 809-812.

Kuang, et al., "A Floating-Body Charge Monitoring Technique for Partially Depleted SOI Technology", Int'l Journal of Electronics, vol. 91, No. 11, Nov. 2004, pp. 625-637.

Gil, et al., "A High Speed and Low Power SOI Inverter Using Active Body-Bias", Proceedings Int'l Symposium on Low Power Electronics and Design, Aug. 1998, pp. 59-63.

Gil, et al., "A High Speed and Low Power Soi Inverter Using Active Body-Bias", Solid-State Electronics, vol. 43, 1999, pp. 791-799.

Kuang, et al., "A High-Performance Body-Charge-Modulated SOI Sense Amplifier", IEEE Int'l SOI Conference, Oct. 2000, pp. 100-101.

Tinella, et al. "A High-Performance CMOS-SOI Antenna Switch for the 2.5 5GHz Band", IEEE Journal of Solid-State Circuits, vol. 38, No. 7, Jul. 2003, All pgs.

Chung, et al., "A New SOI Inverter for Low Power Applications", IEEE SOI Conference, Oct. 1996, pp. 20-21.

Chung, et al., "A New SOI Inverter Using Dynamic Threshold for Low-Power Applications", IEEE Electron Device Letters, vol. 18, No. 6, Jun. 1997, pp. 248-250.

Chung, et al., "A New SOI MOSFET Structure with Junction Type Body Contact", Int'l Electron Device Meeting (IEDM) Technical Digest, 1999, pp. 59-62.

Terauchi, et al., "A Novel 4T SRAM Cell Using "Self-Body-Biased" SOI MOSFET Structure Operating at 0.5 Volt", IEEE Int'l SOI Conference, Oct. 2000, pp. 108-109.

Wang, et all., "A Novel Low-Voltage Silicon-On-Insulator (SOI) CMOS Complementary Pass-Transistor Logic (CPL) Circuit Using Asymmetrical Dynamic Threshold Pass-Transistor (ADTPT) Technique", Proceedings of the 43rd IEEE Midwest Symposium on Circuits and Systems, Aug. 2000, pp. 694-697.

Das, et al., "A Novel Sub-1 V High Speed Circuit Design Technique in Partially Depleted SOI-CMOS Technology with Ultra Low Leakage Power", Proceedings of the 28th European Solid-State Circuits Conference, Sep. 2002, pp. 24-26.

Das, et al., "A Novel Sub-1 V High Speed Circuit Design Technique in Partially Depleted SOI-CMOS Technology with Ultra Low Leakage Power", Proceedings of the 28th European Solid-State Circuits Conference, Sep. 2002, pp. 267-270.

Kanda, et al., "A Si RF Switch MMIC for the Cellular Frequency Band Using SOI-CMOS Technology", Institute of Electronics, Information and Communication Engineers Technical Report, vol. 100, No. 152, Jun. 2000, pp. 79-83.

Hu, et al., "A Unified Gate Oxide Reliability Model", IEEE 37th Annual Int'l Reliability Physics Symposium, 1999, pp. 47-51, San Diego, California.

Nakatani, "A Wide Dynamic Range Switched-LNA in SiGe BICMOS", IEEE Radio Frequency Integrated Circuits Symposium, 2001, pp. 223-226.

Tseng, et al., "AC Floating-Body Effects and the Resultant Analog Circuit Issues in Submicron Floating body and Body-Grounded SOI MOSFET's", IEEE Transactions on Electron Devices, vol. 46, No. 8, Aug. 1999, pgs. All.

Tseng, et al., "AC Floating-Body Effects in Submicron Fully Depleted (FD) SOI nMOSFET's and the Impact on Analog Applications", IEEE Electron Devices, vol. 19, No. 9, Sep. 1998, pp. 351-353.

Wada, et al., "Active Body-Bias SOI-CMOS Driver Circuits", Symposium on VLSI Circuits Digest of Technical Papers, 1997, pp. 29-30.

Stuber, et al., Amendment filed in the USPTO dated Jun. 10, 2010 for related U.S. Appl. No. 11/520,912, 28 pgs.

Saccamango, et al., "An SOI Floating Body Charge Monitor Technique", IEEE Int'l SOI Conference, Oct. 2000, pp. 88-89.

Lee, et al., "Analysis of Body Bias Effect with PD-SOI or Analog and RF Applications", Solid State Electron, vol. 46, 2002, pp. 1169-1176.

Dunga, "Analysis of Floating Body Effects in Thin Film SOI MOSFET's Using the GIDL Current Technique", Proceedings of the 8th Int'l Symposium on Physical and Failure Analysis of Integrated Circuits, 2001, pp. 254-257.

Gautier, et al., "Body Charge Related Transient Effects in Floating Body SOI NMOSFETs", IEDM Tech. Digest, 1995, pp. 623-626.

Koh, et al., "Body-Contracted SOI MOSFET Structure and its Application to DRAM", IEEE Transactions on Electron Devices, vol. 45, No. 5, May 1998, pp. 1063-1070.

(56) References Cited

OTHER PUBLICATIONS

Koh, et al., "Body-Contacted SOI MOSFET Structure with Fully Bulk CMOS Compatible Layout and Process", IEEE Electron Device Letters, vol. 18, No. 3, Mar. 1997, pp. 102-104.

Tseng, et al., "Characterization of Floating Body and Body-Grounded Thin Film Silicon-on-Insulator MOSFETs for Analog Circuit Applications", Ph.D. Thesis, UCLA, 1999, pgs. All.

Madihian, et al., "CMOS RF ICs for 900MHz-2.4GHz Band Wireless Communication Networks", IEEE Radio Frequency Integrated Circuits Symposium, 1999, pp. 13-16.

Orndorff, et al., "CMOS/SOS/LSI Switching Regulator Control Device", IEEE Int'l Solid-State Circuits Conference, ISSCC 78, Feb. 1978, pp. 234-235, 282.

Eschenbach, Communication from the EPO dated Feb. 4, 2009 for related appln. No. 06786943.8, 101 pgs.

Shingleton, Communication from the USPTO dated Apr. 28, 2009 for related U.S. Appl. No. 11/881,816, 3 pgs.

Sudhama, et al., "Compact Modeling and Circuit Impact of a Novel Frequency Dependence of Capacitance in RF MOSFETs", Nano Science and Technology Institute, Technical Proceedings of the 2001 Int'l Conference of Modeling and Simulation of Microsystems. 2001.

Casu, et al., "Comparative Analysis of PD-SOI Active Body-Biasing Circuits", IEEE Int'l SOI Conference, Oct. 2000, pp. 94-95.

Cho, et al., "Comparative Assessment of Adaptive Body-Bias SOI Pass-Transistor Logic", Fourth Int'l Symposium on Quality Electronic Design, Mar. 2003, pp. 55-60.

Chan, et al., "Comparative Study of Fully Depleted and Body-Grounded Non Fully Depleted SOI MOSFET's for High Performance Analog and Mixed Signal Circuits", IEEE Transactions on Electron Devices, vol. 42, No. 11, Nov. 1995, pp. 1975-1981.

Tseng, et al. "Comprehensive Study on AC Characteristics in SOI MOSFETs for Analog Applications", 1998 Symposium on VLSI Technology Digest of Technical Papers, Jun. 1998.

Pelella, et al., "Control of Off-State Current in Scaled PD/SOI CMOS Digital Circuits", Proceedings IEEE Int'l SOI Conference, Oct. 1998, pp. 147-148.

Assaderaghi, "DTMOS: Its Derivatives and Variations, and Their Potential Applications", The 12th Int'l Conference on Microelectronics, Nov. 2000, pp. 9-10.

Lindert, et al. "Dynamic Threshold Pass-Transistor Logic for Improved Delay at Lower Power Supply Voltages", IEEE Journal of Solid-State Circuits, vol. 34, No. 1, Jan. 1999, pp. 85-89.

Drake, et al., "Dynamic-Threshold Logic for Low Power VLSI Design", www.research.ibm.com/acas, 2001.

Assaderaghi, et al., "Dynamic Threshold-Voltage MOSFET (DTMOS) for Ultra-Low Voltage VLSI", IEEE Transactions on Electron, vol. 44, No. 3, Mar. 1997, pp. 414-422.

Wei, et al., "Effect of Floating-Body Charge on SOI MOSFET Design", IEEE Transaction on Electron Devices, vol. 45, No. 2, Feb. 1998.

Duyet, et al., "Effects of Body Reverse Pulse Bias on Geometric Component of Charge Pumping Current in FD SOI MOSFETs", Proceedings IEEE Int'l SOI Conference, Oct. 1998, pp. 79-80.

Lee, et al., "Effects of Gate Structure on the RF Performance in PD SOI MOSFETs", IEEE Microwave and Wireless Components Letters, vol. 15, No. 4, Apr. 2005.

Krishnan, "Efficacy of Body Ties Under Dynamic Switching Conditions in Partially Depleted SOI CMOS Technology", Proceedings IEEE Int'l SOI Conference, Oct. 1997, pp. 140-141.

Lu, et al., "Floating Body Effects in Partially Depleted SOI CMOS Circuits", ISPLED, Aug. 1996, pp. 1-6.

Ueda, et al., "Floating Body Effects on Propagation Delay in SOI/CMOS LSIs", IEEE SOI Conference, Oct. 1996, pp. 142-143.

Matsumoto, et al., "Fully Depleted 30-V-Class Thin Film SOI Power MOSFET", IEDM 95-979, 1995, pp. 38.6.1-38.6.4.

Lee, et al., "Harmonic Distortion Due to Narrow Width Effects in Deep Submicron SOI-CMOS Device for Analog-RF Applications", IEEE Int'l SOI Conference, Oct. 2002, pp. 83-85.

Assaderaghi, et al., "History Dependence of Non-Fully Depleted (NFD) Digital SOI Circuits", 1996 Symposium on VLSI Technology Digest of Technical Papers 13.1, 1996, pp. 122-123.

Damiano, et al., "Integrated Dynamic Body Contact for H Gate PD SOI MOSFETs for High Performance/Low Power", IEEE SOI Conference, Oct. 2004, pp. 115-116.

Tat, International Search Report and Written Opinion received from USRO dated Jul. 3, 2008 for related appln. No. PCT/US06/36240.

Rauly, et al., Investigation of Single and Double Gate SOI MOSFETs in Accumulation Mode for Enhanced Performances and Reduced Technological Drawbacks, Proceedings 30th European Solid-State Device Research Conference, Sep. 2000, pp. 540-543.

Morishita, et al., "Leakage Mechanism Due to Floating Body and Countermeasure on Dynamic Retention Mode of SOI-DRAM", 1995 Symposium on VLSI Technology Digest of Technical Papers, Apr. 1995, pp. 141-142.

Keys, "Low Distortion Mixers or RF Communications", Ph.D. Thesis, University of California-Berkeley, 1995.

Suehle, et al., "Low Electric Field Breakdown of Thin Si02 Films Under Static and Dynamic Stress", IEEE Transactions on Electron Devices, vol. 44, No. 5, May 1997.

Chen, et al., "Low Power, Multi-Gigabit DRAM Cell Design Issues Using SOI Technologies", http://bwrc.eecs.berkeley.edu/people/grad_students/chenff/reports, May 1999.

Pelella, et al., "Low-Voltage Transient Bipolar Effect Induced by Dynamic Floating-Body Charging in Scaled PD/SOI MOSFET's", IEEE Electron Device Letters, vol. 17, No. 5, May 1996.

Wei, "Measurement and Modeling of Transient Effects in Partially Depleted SOI MOSFETs", M.S. Thesis, MIT, Jul. 1996.

Wei, et al., "Measurement of Transient Effects in SOI DRAM/SRAM Access Transistors", IEEE Electron Device Letters, vol. 17, No. 5, May 1996.

Shoucair, "Modeling, Decoupling and Supression of MOSFET Distortion Components", IEEE Proceeding Circuit Devices Systems, vol. 146, No. 1, Feb. 1999.

Tat, Notice of Allowance received from USPTO dated Sep. 16, 2010 for related U.S. Appl. No. 11/520,912.

Shingleton, Office Action received from USPTO dated Oct. 7, 2008 for related U.S. Appl. No. 11/881,816.

Tat, Office Action received from USPTO dated Dec. 10, 2009 for related U.S. Appl. No. 11/520,912.

Shingleton, Office Action received from USPTO dated Jan. 19, 2010 for related U.S. Appl. No. 11/881,816.

Tat, Office Action received from USPTO dated Jul. 8, 2009 for related U.S. Appl. No. 11/520,912.

Tat, Office Action received from USPTO dated Sep. 15, 2008 for related U.S. Appl. No. 11/520,912.

Shahidi, et al., "Partially Depleted SOI Technology for Digital Logic", IEEE Int'l Solid-State Circuits Conference, 1999, pp. 426-427.

Stuber, et al., Photocopy of an amendment that was filed with the USPTO dated Mar. 16, 2009 for related U.S. Appl. No. 11/520,912.

Stuber, et al., Photocopy of an amendment that was filed with the USPTO dated Sep. 8, 2009 for related U.S. Appl. No. 11/520,912.

Photocopy of a translation of an Office Action dated Jul. 31, 2009 for related Chinese appln. No. 200680025128.7.

Hameau, et al., "Radio-Frequency Circuits in Integration Using CMOS SOI 0.25um Technology", 2002 RF IC Design Workshop Europe, Mar. 2002, Grenoble, France.

Dribinsky, Response file in USPTO date Aug. 28, 2009 to related U.S. Appl. No. 11/881,816.

Matloubian, "Smart Body Contact for SOI MOSFETs", 1989 IEEE SOS/SOI Technology Conference, Oct. 1999, pp. 128-129.

Chuang, et al., "SOI for Digital CMOS VLSI Design: Design Consideration and Advances", Proceedings of the IEEE, vol. 86, No. 4, Apr. 1998, pp. 689-720.

Chung, et al., "SOI MOSFET Structure with a Junction Type Body Contact for Suppression of Pass Gate Leakage", IEEE Transactions on Elelctron Devices, vol. 48, No. 7, Jul. 2001.

Rozeau, et al., "SOI Technologies Overview for Low-Power Low-Voltage Radio-Frequency Aplications", Analog Integrated Circuits and Signal Processing, 25, Kluwer Academic Publishers, Nov. 2000, pp. 93-114.

(56) References Cited

OTHER PUBLICATIONS

Kuge, et al., "SOI-DRAM Circuit Technologies for Low Power High Speed Multigiga Scale Memories", IEEE Journal of Solid-State Circuits, vol. 31, No. 4, Apr. 1996, pp. 586-591.
Kuang, et al., "SRAM Bitline Circuits on PD SOI: Advantages and Concerns", IEEE Journal of Solid-State Circuits, vol. 32, No. 6, Jul. 1997.
Maeda, et al., "Substrate-Bias Effect and Source-Drain Breakdown Characteristics in Body-Tied Short-Channel SOI MOSFET's", IEEE Transactions on Electron Devices, vol. 46, No. 1, Jan. 1999, pp. 151-158.
Morena, Supplementary European Search Report dated Feb. 17, 2010 relating to appln. No. 06814836.0.
Duyet, et al., "Suppression of Geometric Component of Charge Pumping Current in Thin Film Silicon on Insulator Metal-Oxide-Semiconductor Field-Effect Transistors", Japanese Journal of Applied Physics, vol. 37, Jul. 1998, pp. L855-L858.
Casu, et al., "Synthesis of Low-Leakage PD-SOI Circuits with Body Biasing", Int'l Symposium on Low Power Electronics and Design, Aug. 2001, pp. 287-290.
Edwards, et al., "The Effect of Body Contact Series Resistance on SOI CMOS Amplifier Stages", IEEE Transactions on Electron Devices, vol. 44, No. 12, Dec. 1997, pp. 2290-2294.
Wang, et al., "Threshold Voltage Instability at Low Temperatures in Partially Depleted Thin Film SOI MOSFET's", 1990 IEEE SOS/SOI Technology Conference, Oct. 1990, pp. 91-92.
Shimomura, et al., "TP 4.3: A 1V 46ns 16Mb SOI-DRAM with Body Control Technique", 1997 IEEE Int'l Solid-State Circuits Conference, Feb. 1997.
Sleight, et al., "Transient Measurements of SOI Body Contact Effectiveness", IEEE Electron Device Letters, vol. 19, No. 12, Dec. 1998.
Assaderaghi, et al, "Transient Pass-Transistor Leakage Current in SOI MOSFET's", IEEE Electron Device Letters, vol. 18, No. 6, Jun. 1997, pp. 241-243.
Brindle, et al., Translation of a response filed with the Chinese Patent Office dated Nov. 30, 2009 relating to appln. No. 200680025128.7.
Mashiko, et al., "Ultra-Low Power Operation of Partially-Depleted SOI/CMOS Integrated Circuits", IEICE Transactions on Electronic Voltage, No. 11, Nov. 2000, pp. 1697-1704.
Das, et al., "Ultra-Low-Leakage Power Strategies for Sub-1 V VLSI: Novel Circuit Styles and Design Methodologies for Partially Depleted Silicon-on-Insulator (PD-SOI) CMOS Technology", Proceedings of the 16th Int'l Conference on VLSI Design, 2003.
Pelloie, et al., "WP 25.2: SOI Technology Performance and Modeling", 1999 IEEE Int'l Solid-State Circuits Conference, Feb. 1999.
Goldman, et al., "0.15um SOI DRAM Technology Incorporating Sub-Volt Dynamic Threshold Devices for Embedded Mixed-Signal & RF Circuits", 2001 IEEE SOI Conference, Oct. 2001, pp. 97-98.
Hirota, et a., "0.5V 320MHz 8b Multiplexer/Demultiplexer Chips Based on a Gate Array with Regular-Structured DTMOS/SOI", ISSCC, Feb. 1998, pp. 12.2-1-12.2-11.
Fuse, et al., "0.5V SOI CMOS Pass-Gate Logic", ISSCC96, Session 5, Technology Directions: High-Speed, Low-Power, 1998 IEEE International Solid-State Circuits Conference.
Peregrine Semiconductor Corporation, Response filed in the EPO dated Oct. 12, 2010 for related appln. No. 06814836.0.
Douseki, et al., "A 05-V MTCMOS/SIMOX Logic Gate", IEEE Journal of Solid-State Circuits, vol. 32, No. 10, Oct. 1997.
Shimomura, et al., "A 1-V 46-ns 16-mb SOI-DRAM with Body Control Technique", IEEE Journal of Solid-State Circuits, vol. 32, No. 11, Nov. 1997, pp. 1712-1720.
Numata, et al., "A +2.4/0 V Controlled High Power GaAs SPDT Antenna Switch IC for GSM Application", IEEE Radio Frequency Integrated Circuits Symposium, 2002, pp. 141-144.
Huang, et al., "A 0.5-um CMOS T/R Switch for 900-MHz Wireless Applications", IEEE Journal of Solid-State Circuits, 2001, pp. 486-492.
Tinella, et al., "A 0.7dB Insertion Loss CMOS—SOI Antenna Switch with More than 50dB Isolation over the 2.5 to 5GHz Band", Proceeding of the 28th European Solid-State Circuits Conference, 2002, pp. 483-486.
Ohnakado, et al., "A 1.4dB Insertion Loss, 5GHz Transmit/Receive Switch Utilizing Novel Depletion-Layer Extended Transistors (DETs) in 0.18um CMOS Process", Symposium on VLSI Circuits Digest of Technical Papers, 2002, pp. 162-163.
Nakayama, et al., "A 1.9 GHz Single-Chip RF Front-End GaAs MMIC with Low-Distortion Cascade FET Mixer for Personal Handy-Phone System Terminals", IEEE, 1998, pp. 101-104.
McGrath, et al., "A 1.9-GHz GaAs Chip Set for the Personal Handyphone System", IEEE Transaction on Microwave Theory and Techniques, 1995, pp. 1733-1744.
Nakayama, et al., "A 1.9GHz Single-Chip RF Front End GaAs MMIC for Personal Communications", Microwave and Millimeter-Wave Monolithic Circuits Symposium, 1996, pp. 69-72.
Nakayama, et al., "A 1.9GHz Single-Chip RF Front End GaAs MMIC with Low-Distortion Cascode FET Mixer for Personal Handy-Phone System Terminals", Radio Frequency Integrated Circuits Symposium, 1998, pp. 205-208.
Gu, et al., "A 2.3V PHEMT Power SP3T Antenna Switch IC for GSM Handsets", IEEE GaAs Digest, 2003, pp. 48-51.
Darabi, et al., "A 2.4GHz CMOS Transceiver for Bluetooth", IEEE, 2001, pp. 89-92.
Huang, et al., "A 2.4-GHz Single-Pole Double Throw T/R Switch with 0.8-dB Insertion Loss Implemented in a CMOS Process", Silicon Microwave Integrated Circuits and Systems Research, 2001, pp. 1-4.
Huang, et al., "A 2.4-GHz Single-Pole Double Throw T/R Switch with 0.8-dB Insertion Loss Implemented in a CMOS Process (slides)", Silicon Microwave Integrated Circuits and Systems Research, 2001, pp. 1-16.
Yamamoto, et al., "A 2.4GHz Band 1.8V Operation Single Chip SI-CMOS T/R MMIC Front End with a Low Insertion Loss Switch", IEEE Journal of Solid-State Circuits, vol. 36, No. 8, Aug. 2001, pp. 1186-1197.
Kawakyu, et al., "A 2-V Operation Resonant Type T/R Switch with Low Distortion Characteristics for 1.9GHz PHS", IEICE Trans Electron, vol. E81-C, No. 6, Jun. 1998, pp. 862-867.
Huang, et al., "A 900-MHz T/R Switch with a 0.8-dB Insertion Loss Implemented in a 0.5-um CMOS Process", IEEE Custom Integrated Circuits Conference, 2000, pp. 341-344.
Workman, et al., "A Comparative Analysis of the Dynamic Behavior of BTG/SOI MOSFET's and Circuite with Distributed Body Resistance", IEEE Transactions and Electron Devices, vol. 45, No. 10, Oct. 1998, pp. 2138-2145.
Valeri, et al., "A Composite High Voltage Device Using Low Voltage SOI MOSFET's", IEEE, 1990, pp. 169-170.
Miyatsuji, et al., "A GaAs High Power RF Single Pole Double Throw Switch IC for Digital Mobile Communication System", IEEE International Solid-State Circuits Conference, 1994, pp. 34-35.
Miyatsuji, et al., "A GaAs High Power RF Single Pole Dual Throw Switch IC for Digital Mobile Communication System", IEEE Journal of Solid-State Circuits, 1995, pp. 979-983.
Puechberty, et al., "A GaAs Power Chip Set for 3V Cellular Communications", 1994.
Yamamoto, et al., "A GaAs RF Transceiver IC for 1.9GHz Digital Mobile Communication Systems", ISSCC96, 1996, pp. 340-341, 469.
Choumei, et al., "A High Efficiency, 2V Single Supply Voltage Operation RF Front End MMIC for 1.9GHz Personal Handy Phone Systems", IEEE, 1998, pp. 73-76.
Schindler, et al., "A High Power 2-18 GHz T/R Switch", IEEE Microwave and Millimeter-Wave Monolithic Circuits Symposium, 1990, pp. 119-122.
Gu, et al., "A High Power DPDT MMIC Switch for Broadband Wireless Applications", IEEE MTT-S Digest, 2003, pp, 173-176.
Tinella, et al., "A High Performance CMOS-SOI Antenna Switch for the 2.5-5-GHz Band", IEEE Journal of Solid-State Circuits, 2003, pp. 1279-1283.
Gu, et al., "A High Performance GaAs SP3T Switch for Digital Cellular Systems", IEEE MTT-S Digest, 2001, pp. 241-244.

(56) References Cited

OTHER PUBLICATIONS

Numata, et al., "A High Power Handling GSM Switch IC with New Adaptive Control Voltage Generator Circuit Scheme", IEEE Radio Frequency Integrated Circuits Symposium, 2003, pp. 233-236.
Madihian, et al., "A High Speed Resonance Type FET Transceiver Switch for Millimeter Wave Band Wireless Networks", 26th EuMC, 1996, pp. 941-944.
Tokumitsu, et al., "A Low Voltage High Power T/R Switch MMIC Using LC Resonators", IEEE Transactions on Microwave Theory and Techniques, 1995, pp. 997-1003.
Colinge, et al., "A Low Voltage Low Power Microwave SOI MOSFET", IEEE International SOI Conference, 1996, pp. 128-129.
Johnson, et al., "A Model for Leakage Control by MOS Transistor Stacking", ECE Technical Papers, 1997, pp. 1-28.
Matsumoto, et al., "A Novel High Frequency Quasi-SOI Power MOSFET for Multi-Gigahertz Application", IEEE, 1998, pp. 945-948.
Giugni, "A Novel Multi-Port Microwave/Millimeter-Wave Switching Circuit", Microwave Conference, 2000.
Caverly, "A Project Oriented Undergraduate CMOS Analog Microelectronic System Design Course", IEEE, 1997, pp. 87-88.
Harjani, et al., "A Prototype Framework for Knowledge Based Analog Circuit Synthesis", IEEE Design Automation Conference, 1987, pp. 42-49.
DeRossi, et al., "A Routing Switch Based on a Silicon-on-Insulator Mode Mixer", IEEE Photonics Technology Letters, 1999, pp. 194-196.
Kanda, et al., "A Si RF Switch MMIC for the Cellular Frequency Band Using SOI-CMOS Technology", The Institute of Electronics, Information and Communication Engineers, 2000, pp. 79-83.
Caverly, et al., "A Silicon CMOS Monolithic RF and Microwave Switching Element", 27th European Microwave Conference, 1997, pp. 1046-1051.
Valeri, et al., "A Silicon-on-Insulator Circuit for High Temperature, High-Voltage Applications", IEEE, 1991, pp. 60-61.
Yamamoto, et al., "A Single-Chip GaAs RF Transceiver for 1.9GHz Digital Mobile Communication Systems", IEEE Journal of Solid-State Circuits, 1996.
Yamamoto, et al., "A Single-Chip GaAs RF Transceiver for 1.9GHz Digital Mobile Communication Systems", IEEE, 1996, pp. 1964-1973.
Tsutsumi, et al., "A Single Chip PHS Front End MMIC with a True Single +3 Voltage Supply", IEEE Radio Frequency Integrated Circuits Symposium, 1998, pp. 105-108.
Wambacq, et al., "A Single Package Solution for Wireless Transceivers", IEEE, 1999, pp. 1-5.
Eggert, et al., A SOI-RF-CMOS Technology on High Resistivity SIMOX Substrates for Microwave Applications to 5 GHz, IEEE Transactions on Electron Devices, 1997, pp. 1981-1989.
Hu, et al., "A Unified Gate Oxide Reliability Model", IEEE 37th Annual International Reliability Physic Symposium, 1999, pp. 47-51.
Szedon, et al., "Advanced Silicon Technology for Microwave Circuits", Naval Research Laboratory, 1994, pp. 1-110.
Johnson, et al., "Advanced Thin Film Silicon-on-Sapphire Technology: Microwave Circuit Applications", IEEE Transactions on Electron Devices, 1998, pp. 1047-1054.
Burgener, et al., Amendment filed in the USPTO dated Dec. 2005 relating to U.S. Appl. No. 10/922,135.
Burgener, et al., Amendment filed in the USPTO dated May 2008 relating to U.S. Appl. No. 11/582,206.
Kai, An English translation of an Office Action received from the Japanese Patent Office dated Jul. 2010 relating to appln. No. 2007-518298.
Burgener, et al., Amendment filed in the USPTO dated Apr. 2010 relating to U.S. Appl. No. 11/501,125.
Heller, - et al "Cascode Voltage Switch Logic: A Different CMOS Logic Family", IEEE International Solid-State Circuits Conference, 1984, pp. 16-17.

Pylarinos, "Charge Pumps: An Overview", Proceedings of the IEEE International Symposium on Circuits and Systems, 2003, pp. 1-7.
Doyama, "Class E Power Amplifier for Wireless Transceivers", University of Toronto, 1999, pp. 1-9.
"CMOS Analog Switches", Harris, 1999, pp. 1-9.
"CMOS SOI RF Switch Family", Honeywell, 2002, pp. 1-4.
"CMOS SOI Technology", Honeywell, 2001, pp. 1-7.
Burgener, "CMOS SOS Switches Offer Useful Features, High Integration", Microwaves & RF, 2001, pp. 107-118.
Analog Devices, "CMOS, Low Voltage RF/Video, SPST Switch", Analog Devices, inc., 1999, pp. 1-10.
Eggert, et al., "CMOS/SIMOX-RF-Frontend for 1.7GHz", Solid State Circuits Conference, 1996.
Orndorff, et al., CMOS/SOS/LSI Switching Regulator Control Device, IEEE International, vol. XXI, Feb. 1978, pp. 234-235.
Burgener, et al., Comments on Examiners Statements of Reasons for Allowance filed in the USPTO dated Aug. 2004 relating to U.S. Appl. No. 10/267,531.
Aquilani, Communication and supplementary European Search Report dated Nov. 2009 relating to appln. No. 05763216.
Van Der Peet, Communications pursuant to Article 94(3) EPC received from the EPO dated Jun. 2008 relating to appln. No. 02800982.7-2220.
Aquilani, Communications pursuant to Article 94(3) EPC received from the EPO dated Mar. 2010 relating to appln. No. 05763216.8.
Weman, Communication under Rule 71(3) EPC and Annex Form 2004 received from the EPO dated Nov. 2009 relating to appln. No. 020800982.7.
Van Der Peet, Communications pursuant to Article 94(3) EPC dated Aug. 2009 relating to appln. No. 02800982.7-2220.
Yamamoto, et al., "Design and Experimental Results of a 2V-Operation Single-Chip GaAs T/R MMIC Front-End for 1.9GHz Personal Communications", IEEE, 1998, pp. 7-12.
Savla, "Design and Simulation of a Low Power Bluetooth Transceiver", The University of Wisconsin, 2001, pp. 1-90.
Henshaw, "Design of an RF Transceiver", IEEE Colloquium on Analog Signal Processing, 1998.
Baker, et al., "Designing Nanosecond High Voltage Pulse Generators Using Power MOSFET's", Electronic Letters, 1994, pp. 1634-1635.
Gu, et al., "Low Insertion Loss and High Linearity PHEMT SPDT and SP3T Switch Ics for WLAN 802.11a/b/g Application", 2004 IEEE Radio Frequency Integrated Circuits Symposium, 2004, pp. 505-508.
Koudymov, et al., "Low Loss High Power RF Switching Using Multifinger AlGaN/GaN MOSHFETs", University of South Carolina Scholar Commons, 2002, pp. 449-451.
Abidi, "Low Power Radio Frequency IC's for Portable Communications", IEEE, 1995, pp. 544-569.
Kuo, et al., "Low Voltage SOI CMOS VLSI Devices and Circuits", Wiley, 2001, pp. 57-60, 349-354.
Wei, et al., "Measuremenets of Transient Effects in SOI DRAM/SRAM Access Transistors", IEEE Electron Device Letters, vol. 17, No. 5, May 1996.
De La Houssaye, et al., "Microwave Performance of Optically Fabricated T-Gate Thin Film Silicon on Sapphire Based MOSFET's", IEEE Electron Device Letters, 1995, pp. 289-292.
Shifrin, et al., "Monolithic FET Structure for HighPower Control Component Applications", IEEE Transactions on Microwave Theory and Techniques, 1989, pp. 2134-2142.
Smuk, et al., "Monolithic GaAs Multi-Throw Switches with Integrated Low Power Decoder/Driver Logic", 1997, IEEE Radio Frequency Integrated Circuits.
McGrath, et al., "Multi Gate FET Power Switches", Applied Microwave, 1991, pp. 77-88.
Smuk, et al., "Multi-Throw Plastic MMIC Switches up to 6GHz with Integrated Positive Control Logic", IEEE, 1999, pp. 259-262.
Razavi, "Next Generation RF Circuits and Systems", IEEE, 1997, pp. 270-282.
Gould, et al., "NMOS SPDT Switch MMIC with >48dB Isolation and 30dBm IIP3 for Applications within GSM and UMTS Bands", Bell Labs, 2001, pp. 1-4.
Caverly, "Nonlinear Properties of Gallium Arsenide and Silicon FET-Based RF and Microwave Switches", IEEE, 1998, pp. 1-4.

(56) References Cited

OTHER PUBLICATIONS

Tieu, Notice of Allowance and Fee(s) Due from the USPTO dated May 2004 relating to U.S. Appl. No. 10/267,531.
Tieu, Notice of Allowance and Fee(s) Due from the USPTO dated Jul. 2008 relating to U.S. Appl. No. 11/582,206.
Tieu, Notice of Allowance and Fee(s) Due from the USPTO dated Jun. 2006 relating to U.S. Appl. No. 10/922,135.
Tran, Notice of Allowance and Fee(s) Due from the USPTO dated Jun. 2010 relating to U.S. Appl. No. 11/501,125.
Tieu, Notice of Allowance and Fee(s) Due from the USPTO dated Apr. 2010 relating to U.S. Appl. No. 11/347,014.
Tieu, Notice of Allowance and Fee(s) Due from the USPTO dated Dec. 2008 relating to U.S. Appl. No. 11/127,520.
Luu, Notice of Allowance and Fee(s) Due from the USPTO dated Jul. 2009 relating to U.S. Appl. No. 11/351,342.
Miyajima, Notice of Reasons for Refusal from the Japanese Patent Office dated Feb. 2006 relating to appln. No. 2003-535287.
McGrath, et al., "Novel High Performance SPDT Power Switches Using Multi-Gate FET's", IEEE, 1991, pp. 839-842.
Tieu, Office Action from the USPTO dated Nov. 2007 relating to U.S. Appl. No. 11/582,206.
Tieu, Office Action from the USPTO dated Jun. 2005 relating to U.S. Appl. No. 10/922,135.
Tieu, Notice of Allowance from the USPTO dated Jun. 2006 relating to U.S. Appl. No. 10/922,135.
Chow, Office Action from the USPTO dated Apr. 2010 relating to U.S. Appl. No. 11/347,671.
Tieu, Office Action from the USPTO dated Sep. 2009 relating to U.S. Appl. No. 11/347,014.
Luu, Office Action from the USPTO dated Oct. 2008 relating to U.S. Appl. No. 11/351,342.
Chow, Office Action from the USPTO dated Aug. 2010 relating to U.S. Appl. No. 11/347,671.
Suematsu, "On-Chip Matching SI-MMIC for Mobile Communication Terminal Application", IEEE, 1997, pp. 9-12.
Caverly, et al., "On-State Distortion in High Electron Mobility Transistor Microwave and RF Switch Control Circuits", IEEE Transactions on Microwave Theory and Techniques, 2000, pp. 98-103.
Kelly, Proposed Amendment After Final from the USPTO dated Jun. 2009 relating to U.S. Appl. No. 11/351,342.
"Radiation Hardened CMOS Dual DPST Analog Switch", Intersil, 1999, pp. 1-2.
Caverly, "Development of a CMOS Cell Library for RF Wireless and Telecommunications Applications", VLSI Symposium, 1998.
Caverly, "Distortion Properties of Gallium Arsenide and Silicon RF and Microwave Switches", IEEE, 1997, pp. 153-156.
Luu, Final Office Action received from the USPTO dated Apr. 2009 relating to U.S. Appl. No. 11/351,342.
Colinge, "Fully Depleted SOI CMOS for Analog Applications", IEEE Transactions on Electron Devices, 1998, pp. 1010-1016.
Flandre, et al., "Fully Depleted SOI CMOS Technology for Low Voltage Low Power Mixed Digital/Analog/Microwave Circuits", Analog Integrated Circuits and Signal Processing, 1999, pp. 213-228.
Yamao, "GaAs Broadband Monolithic Switches", 1986, pp. 63-71.
Gopinath, et al., "GaAs FET RF Switches", IEEE Transactions on Electron Devices, 1985, pp. 1272-1278.
Lee, et al., "Harmonic Distortion Due to Narrow Width Effects in Deep Submicron SOI-CMOS Device for Analog RF Applications", 2002 IEEE International SOI Conference, Oct. 2002.
HI-5042 thru HI-5051 Datasheet, Harris Corporation, 1999.
Eisenberg, et al., "High Isolation 1-20GHz MMIC Switches with On-Chip Drivers", IEEE Microwave and Millimeter-Wave Monolithic Circuits Symposium, 1989, pp. 41-45.
Shifrin et al., "High Power Control Components Using a New Monolithic FET Structure", IEEE Microwave and Millimeter-Wave Monolithic Circuits Symposium, 1988, pp. 51-56.
Kohama, et al., "High Power DPDT Antenna Switch MMIC for Digital Cellular Systems", GaAs IC Symposium, 1995, pp. 75-78.

Kohama, et al., "High Power DPDT Antenna Switch MMIC for Digital Cellular Systems", IEEE Journal of Solid-State Circuits, 1996, pp. 1406-1411.
Yun, et al., "High Power-GaAs MMIC Switches wtih Planar Semi-Insulated Gate FETs (SIGFETs)", International Symposium on Power Semiconductor Devices & ICs, 1990, pp. 55-58.
Caverly, "High Power Gallium Nitride Devices for Microwave and RF Control Applications", 1999, pp. 1-30.
Caverly, "High Power Gallium Nitride Devices for Microwave and RF Control Applications", 2000, pp. 1-33.
Masuda, et al., "High Power Heterojunction GaAs Switch IC with P-1dB of more than 38dBm for GSM Application", IEEE, 1998, pp. 229-232.
De Boer, et al., "Highly Integrated X-Band Multi-Function MMIC with Integrated LNA and Driver Amplifier", TNO Physics and Electronics Laboratory, 2002, pp. 1-4.
Kanda, et al., "High Performance 19GHz Band GaAs FET Switches Using LOXI (Layerd Oxide Isolation)—MESFETs", IEEE, 1997, pp. 62-65.
Uda, et al., "High-Performance GaAs Switch IC's Fabricated Using MESFET's with Two Kinds of Pinch-Off Voltages and a Symmetrical Pattern Configuration", IEEE Journal of Solid-State Circuits, vol. 29, No. 10, Oct., 1994, pp. 1262-1269.
Uda, et al., "High Performance GaAs Switch IC's Fabricated Using MESFETs with Two Kinds of Pinch Off Voltages", IEEE GaAs IC Symposium, 1993, pp. 247-250.
Armijos, "High Speed DMOS FET Analog Switches and Switch Arrays", Temic Semiconductors 1994, pp. 1-10.
Katzin, et al., "High Speed 100+ W RF Switches Using GaAs MMICs", IEEE Transactions on Microwave Theory and Techniques, 1992, pp. 1989-1996.
Honeywell, "Honeywell SPDT Absorptive RF Switch", Honeywell, 2002, pp. 1-6.
Honeywell, "Honeywell SPDT Reflective RF Switch", Honeywell Advance Information, 2001, pp. 1-3.
Hirano, et al., "Impact of Actively Body Bias Controlled (ABC) SOI SRAM by Using Direct Body Contact Technology for Low Voltage Application", IEEE, 2003, pp. 2.4.1-2.4.4.
Larson, "Integrated Circuit Technology Options for RFIC's—Present Status and Future Directions", IEEE Journal of Solid-State Circuits, 1998, pp. 387-399.
Burghartz, "Integrated RF and Microwave Components in BiCMOS Technology", IEEE Transactions on Electron Devices, 1996, pp. 1559-1570.
Kelly, "Integrated Ultra CMIS Designs in GSM Front End", Wireless Design Magazine, 2004, pp. 18-22.
Bonkowski, et al., "Integraton of Triple Band GSM Antenna Switch Module Using SOI CMOS", IEEE Radio Frequency Integrated Circuits Symposium, 2004, pp. 511-514.
Le, International Search Report from the USPTO dated Mar. 2003 relating to U.S. Appl. No. 10/267,531.
Marenk, et al., "Layout Optimization of Cascode RF SOI Transistors", IEEE International SOI Conference, 2001, pp. 105-106.
Suematsu, et al., "L-Band Internally Matched Si-MMIC Front End", IEEE, 1996, pp. 2375-2378.
Iyama, et al., "L-Band SPDT Switch Using Si-MOSFET", IEICE Trans. Electron, vol. E79-C, No. 5, May 1996, pp. 636-643.
Caverly, "Linear and Nonlinear Characteristics of the Silicon CMOS Monolithic 50-Omega Microwave and RF Control Element", IEEE Journal of Solid-State Circuits, 1999, pp. 124-126.
Adan, et al., "Linearity and Low Noise Performance of SOIMOSFETs for RF Applications", IEEE International SOI Conference, 2000, pp. 30-31.
Megahed, et al., "Low Cost UTSi Technology for RF Wireless Applications", IEEE MTT-S Digest, 1998.
Newman, "Radiation Hardened Power Electronics", Intersil Corporation, 1999, pp. 1-4.
Kelly, Response and Terminal Disclaimer filed in the USPTO dated Mar. 2010 relating to U.S. Appl. No. 11/347,014.
Burgener, et al., Response filed in the USPTO dated May 2006 relating to U.S. Appl. No. 10/922,135.
Kelly, Response to Office Action mailed to USPTO relating to U.S. Appl. No. 11/351,342 dated Jan. 30, 2009.

(56) References Cited

OTHER PUBLICATIONS

"RF & Microwave Device Overview 2003—Silicon and GaAs Semiconductors", NEC, 2003.
"RF Amplifier Design Using HFA3046, HFA3096, HFA3127, HFA3128 Transistor Arrays", Intersil Corporation, 1996, pp. 1-4.
"SA630 Single Pole Double Throw (SPDT) Switch", Philips Semiconductors, 1997.
Narendra, et al., "Scaling of Stack Effects and its Application for Leakage Reduction", ISLPED 2001, 2001, pp. 195-200.
Huang, "Schottky Clamped MOS Transistors for Wireless CMOS Radio Frequency Switch Application", University of Florida, 2001, pp. 1-167.
Botto, et al., "Series Connected Soft Switched IGBTs for High Power, High Voltage Drives Applications: Experimental Results", IEEE, 1997, pp. 3-7.
Baker, et al., "Series Operation of Power MOSFETs for High Speed Voltage Switching Applications", American Institute of Physics, 1993, pp. 1655-1656.
Lovelace, et al., "Silicon MOSFET Technology for RF ICs", IEEE, 1995, pp. 1238-1241.
Rodgers, et al., "Silicon UTSi CMOS RFIC for CDMA Wireless Communications System", IEEE MTT-S Digest, 1999, pp. 485-488.
"Silicon Wave SiW1502 Radio Modem IC", Silicon Wave, 2000, pp. 1-21.
Johnson, et al., "Silicon-On-Sapphire MOSFET Transmit/Receive Switch for L and S Band Transceiver Applications", Electronic Letters, 1997, pp. 1324-1326.
Reedy, et al., "Single Chip Wireless Systems Using SOI", IEEE International SOI Conference, 1999, pp. 8-11.
Stuber, et al., "SOI CMOS with High Performance Passive Components for Analog, RF and Mixed Signal Designs", IEEE International SOI Conference, 1998, pp. 99-100.
Chung, et al., "SOI MOSFET Structure with a Junction Type Body Contact for Suppression of Pass Gate Leakage", IEEE Transactions on Electron Devices, vol. 48, No. 7, Jul. 2001.
Rozeau, "SOI Technologies Overview for Low Power Low Voltage Radio Frequency Applications", Analog Integrated Circuits and Signal Processing, Nov. 2000, pp. 93-114.
Fukuda, et al., "SOI CMOS Device Technology", Special Edition on 21st Century Solutions, 2001, pp. 54-57.
Fukuda, et al., "SOI CMOS Device Technology", OKI Technical Review, 2001, pp. 54-57.
Kusunoki, et al., "SPDT Switch MMIC Using E/D Mode GaAs JFETs for Personal Communications", IEEE GaAs IC Symposium, 1992, pp. 135-138.
Caverly, et al., "Spice Modeling of Microwave and RF Control Diodes", IEEE, 2000, pp. 28-31.
Kuang, et al., "SRAM Bitline Circuits on PD SOI: Advantages and Concerns", IEEE Journal of Solid State Circuits, vol. 32, No. 6, Jun. 1997.
Baker, et al., "Stacking Power MOSFETs for Use in High Speed Instrumentation", American Institute of Physics, 1992, pp. 5799-5801.
Sanders, "Statistical Modeling of SOI Devices for the Low Power Electronics Program", AET, Inc., 1995, pp. 1-109.
Maeda, et al., "Substrate Bias Effect and Source Drain Breakdown Characteristics in Body Tied Short Channel SOI MOSFETs", IEEE Transactions on Electron Devices, vol. 46, No. 1, Jan. 1999, pp. 151-158.
Makioka, et al., "Super Self Aligned GaAs RF Switch IC with 0.25dB Extremely Low Insertion Loss for Mobile Communication Systems", IEEE Transactions on Electron Devices, vol. 48, No. 8, Aug. 2001, pp. 1510-1514.
Karandikar, et al., "Technology Mapping for SOI Domino Logic Incorporating Solutions for the Parasitic Bipolar Effect", ACM, 2001, pp. 1-14.
Huang, et al., "TFSOI Can It Meet the Challenge of Single Chip Portable Wireless Systems", IEEE International SOI Conference, 1997, pp. 1-3.

Devlin, "The Design of Integrated Switches and Phase Shifters", 1999.
Hess, et al., "Transformerless Capacitive Coupling of Gate Signals for Series Operation of Power MOS Devices", IEEE, 1999, pp. 673-675.
"uPG13xG Series L-Band SPDT Switch GaAs MMIC", NEC, 1996, pp. 1-30.
Reedy, et al., "UTSi CMOS: A Complete RF SOI Solution", Peregrine Semiconductor, 2001, pp. 1-6.
Hittite Microwave, "Wireless Symposium 2000 is Stage for New Product Introductions", Hittite Microwave, 2000, pp. 1-8.
Montoriol, et al., "3.6V and 4.8V GSM/DCS1800 Dual Band PA Application with DECT Capability Using Standard Motorola RFICs", 2000, pp. 1-20.
Wang, et al., "Efficiency Improvement in Charge Pump Circuits", IEEE Journal of Solid-State Circuits, vol. 32, No. 6, Jun. 1997, pp. 852-860.
Ajjkuttira, et al., "A Fully Integrated CMOS RFIC for Bluetooth Applications", IEEE International Solid-State Circuits Conference, 2001, pp. 1-3.
Apel, et al., "A GaAs MMIC Transceiver for 2.45 GHz Wireless Commercial Products", Microwave and Millimeter-Wave Monolithic Circuits Symposium, 1994, pp. 15-18.
Assaderaghi, et al., "Dynamic Threshold Voltage MOSFET (DTMOS) for Ultra Low Voltage VLSI", IEEE Transactions on Electron Devices, vol. 44, No. 3, Mar. 1997, pp. 414-422.
Bolam, et al., "Reliability Issues for Silicon-on-Insulator", IEEE, 2000, pp. 6.4.1-64.4.
Bolam, et al., "Reliability Issues for Silicon-on-Insulator", IBM Micro Electronics Division, IEEE 2000, pp. 6.4.1-6.4.4.
Caverly, et al., "CMOS RF Circuits for Integrated Wireless Systems", IEEE, 1998, pp. 1-4.
Chao, et al., "High-Voltage and High-Temperature Applications of DTMOS with Reverse Schottky Barrier on Substrate Contacts", vol. 25, No. 2, Feb. 2004, pp. 86-88.
Devlin, et al., "A 2.4 GHz Single Chip Transceiver", Microwave and Millimeter-Wave Monolithic Circuits Symposium, 1993, pp. 23-26.
Fiorenza, et al., "RF Power Performance of LDMOSFETs on SOI: An Experimental Comparison with Bulk Si MOSFETs", IEEE Radio Frequency Integrated Circuits Symposium, 2001, pp. 43-46.
Giffard, et al., "Dynamic Effects in SOI MOSFETs", IEEE SOS/SOI Technology Conference, Oct. 1991, pp. 160-161.
Hirano, et al., "Impact of Actively Body-Bias Controlled (ABC) SOI SRAM by Using Direct Body Contact Technology for Low-Voltage Applications", IEEE, 2003, pp. 2.4.1-2.4.4.
Imai, et al., "Novel High Isolation FET Switches", IEEE Transactions on Microwave Theory and Techniques, 1996, pp. 685-691.
Ishida, et al., "A Low Power GaAs Front End IC with Current Reuse Configuration Using 0.15um Gate GaAs MODFETs", IEEE, 1997, pp. 669-672.
Iwata, et al., "Gate Over Driving CMOS Architecture for 0.5V Single Power Supply Operated Devices", IEEE, 1997, pp. 290-291, 473.
Kumar, et al., "A Simple High Performance Complementary TFSOI BiCMOS Technology with Excellent Cross-Talk Isolation", 2000 IEEE International SOI Conference, 2000, pp. 142-143.
Kwok, "An X-Band SOS Resistive Gate Insulator Semiconductor (RIS) Switch", IEEE Transactions on Electron Device, 1980, pp. 442-448.
Lee, et al., "Effect of Body Structure on Analog Performance of SOI NMOSFETs", 1998 IEEE International SOI Conference, Oct. 1998, pp. 61-62.
Lee, "CMOS RF: (Still) No Longer an Oxymoron (Invited)", IEEE Radio Frequency Integrated Circuits Symposium, 1999, pp. 3-6.
Madihian, et al., "A 2-V, 1-10GHz BiCMOS Transceiver Chip for Multimode Wireless Communications Networks", IEEE, 1997, pp. 521-525.
McRory, et al., "Transformer Coupled Stacked FET Power Amplifier", IEEE Journal of Solid State Circuits, vol. 34, No. 2, Feb. 1999, pp. 157-161.
Nagayama, et al., "Low Insertion Los DP3T MMIC Switch for Dual Band Cellular Phones", IEEE Jounral of Solid State Circuits, 1999, pp. 1051-1055.

(56) References Cited

OTHER PUBLICATIONS

Nishijima, et al., "A High Performance Transceiver Hybrid IC for PHS Hand Set Operating with Single Positive Voltage Supply", Microwave Symposium Digest, 1997, pp. 1155-1158.
O, et al., "CMOS Components for 802.11b Wireless LAN Applications", IEEE Radio Frequency Integrated Circuits Symposium, 2002, pp. 103-106.
Peczalski, "RF/Analog/Digital SOI Technology GPS Receivers and Other Systems on a Chip", IEEE Aerospace Conference Proceedings, 2002, pp. 2013-2017.
Shifrin, et al., "A New Power Amplifier Topology with Series Biasing and Power Combining of Transistors", IEEE 1992 Microwave and Millimeter-Wave Monolithic Circuits Symposium, 1992, pp. 39-41.
Shimura, et al., "High Isolation V-Band SPDT Switch MMIC for High Power Use", IEEE MTT-S International Microwave Symposium Digest, 2001, pp. 245-248.
Uda, et al., "A High Performance and Miniturized Dual Use (antenna/local) GaAs SPDT Switch IC Operating at +3V/0V", Microwave Symposium Digest, 1996, pp. 141-144.
Uda, et al., "High Performance GaAs Switch IC's Fabricated Using MESFETs with Two Kinds of Pinch Off Voltages and a Symmetrical Pattern Configuration", IEEE Journal of Solid-State Circuits, 1994, pp. 1262-1269.
Lee, et al., "Analysis of Body Bias Effect with PD-SOI for Analog and RF Application", Solid State Electron, vol. 46, 2002, pp. 1169-1176.
Ippoushi, "SOI Structure Avoids Increases in Chip Area and Parasitic Capacitance Enables Operational Control of Transistor Threshold Voltage", Renesas Edge, vol. 2004.5, Jul. 2004, p. 15.
Park, "A Regulated, Charge Pump CMOS DC/DC Converter for Low Power Application", 1998, pp. 1-62.
Hittite Microwave, Floating Ground SPNT MMIC Switch Driver Techniques, 2001.
Caverly, et al., "Gallium Nitride-Based Microwave and RF Control Devices", 2001.
Sedra, et al., "Microelectronic Circuits", University of Toronto, Oxford University Press, Fourth Edition, 1982,1987,1991,1998, pp. 374-375.
Bahl, "Lumped Elements for RF and Microwave Circuits", Artech House, 2003, pp. 353-394.
"Positive Bias GaAs Multi-Throw Switches with Integrated TTL Decoders", Hittite Microwave, 2000.
Drozdovsky, et al., "Large Signal Modeling of Microwave Gallium Nitride Based HFETs", Asia Pacific Microwave Conference, 2001, pp. 248-251.
Ayasli, "Microwave Switching with GaAs FETs", Microwave Journal, 1982, pp. 719-723.
Eron, "Small and Large Signal Analysis of MESETs as Switches" Microwave Journal, 1992.
"A Voltage Regulator for GaAs FETs", Microwave Journal, 1995.
Slobodnik, et al., "Millimeter Wave GaAs Switch FET Modeling", Microwave Journal, 1989.
Caverly, "Distortion in GaAs MESFET Switch Circuits", 1994.
Chen, et al., "Dual-Gate GaAs FET: A Versatile Circuit Component for MMICs", Microwave Journal, Jun. 1989, pp. 125-135.
Bullock, "Transceiver and System Design for Digital Communication", Noble, 2000.
Crols, "CMOS Wireless Transceiver Design", Kluwer Academic, 1997.
Hickman, "Practical RF Handbook", Newnes, 1997.
Hagen, "Radio Frequency Electronics", Cambridge University Press, 1996.
Koh, et al., "Low-Voltage SOI CMOS VLSI Devices and Circuits", Wiley Interscience, XP001090589, New York, 2001, pp. 57-60, 349-354.
Leenaerts, "Circuits Design for RF Transceivers" Kluwer Academic, 2001.
Johnson, "Advanced High-Frequency Radio Communication", Artech House, 1997.
Larson, "RF and Microwave Circuit Design for Wireless Communications", Artech House, 1996.
Misra, "Radio Frequency and Microwave Communication Circuits", Wiley, 2001.
Pozar, "Microwave and RF Design of Wireless Systems", Wiley, 2001.
Maas, "The RF and Microwave Circuit Design Cookbook", Artech House, 1998.
Smith, "Modern Communication Systems", McGraw-Hill, 1998.
Van Der Pujie, "Telecommunication Circuit Design", Wiley, 2002.
Razavi, "RF Microelectronics", Prentice-Hall, 1998.
Van Der Pujie, "Telecommunication Circuit Design", Wiley, 1992.
Weisman, "The Essential Guide to RF and Wireless", Prentice-Hall, 2000.
Wetzel, "Silicon-on-Sapphire Technology for Microwave Power Application", University of California, San Diego, 2001.
Johnson, "Silicon-on-Sapphire Technology for Microwave Circuit Applications", Dissertation, UCSD, 1997, pp. 1-184.
Barker, Communications Electronics-Systems, Circuits, and Devices, 1987, Prentice-Hall.
Carr, "Secrets of RF Circuit Design", McGraw-Hill, 1997.
Couch, "Digital and Analog Communication Systems", 2001, Prentice-Hall.
Couch, "Modern Telecommunication System", Prentice-Hall, 1995.
Freeman, "Radio System Design for Telecommunications", Wiley, 1997.
Minoli, "Telecommunications Technology Handbook", Artech House, 2003.
Morreale, "The CRC Handbook of Modern Telecommunication", CRC Press, 2001.
Sayre, "Complete Wireless Design", McGraw-Hill, 2001.
Schaper, "Communications, Computations, Control, and Signal Processing", Kluwer Academic, 1997.
Shafi, "Wireless Communications in the 21st Century", Wiley, 2002.
Willert-Porada, "Advances in Microwave and Radio Frequency Processing", 8th International Conference on Microwave and High-Frequency Heating, Springer Publication, 2001.
Gibson, "The Communication Handbook", CRC Press, 1997.
Hanzo, "Adaptive Wireless Transceivers", Wiley, 2002.
Itoh, "RF Technologies for Low Power Wireless Communications", Wiley, 2001.
Lossee, "RF Systems, Components, and Circuits Handbook", Artech House, 1997.
Miller, "Modern Electronic Communications", Prentice-Hall, 1999.
"An Ultra-Thin Silicon Technology that Provides Integration Solutions on Standard CMOS", Peregrine Semiconductor, 1998.
Caverly, "Distortion in Microwave Control Devices", 1997.
Masuda, et al., "RF Current Evaluation of ICs by MP-10L", NEC Research & Development, vol. 40-41, 1999, pp. 253-258.
"Miniature Dual Control SP4T Switches for Low Cost Multiplexing", Hittite Microwave, 1995.
Uda, "Miniturization and High Isolation of a GaAs SPDT Switch IC Mounted in Plastic Package", 1996.
Marshall, et al., "SOI Design: Analog, Memory, and Digital Techniques", Kluwer Academic Publishers, 2002.
Bernstein, et al., "SOI Circuit Design Concepts", Springer Science + Business Media, 2000.
Brinkman, et al., Respondents' Notice of Prior Art, Investigation No. 337-TA-848, dated Aug. 31, 2012, 59 pgs.
Yamamoto, Kazuya, et al., "A 2.2-V Operation, 2.4-GHz Single-Chip GaAs MMIC Transceiver for Wireless Applications", IEEE Journal of Solid-State Circuits, vol. 34, No. 4, Apr. 1999.
Lauterbach, et al., "Charge Sharing Concept and New Clocking Scheme for Power Efficiency and Electromagnetic Emission Improvement of Boosted Charge Pumps", IEEE Journal of Solid-State Circuits, vol. 35, No. 5, May 2000, pp. 719-723.
Stuber, et al., Supplemental Amendment filed in the USPTO dated Nov. 8, 2012 for related U.S. Appl. No. 13/028,144, 17 pgs.
Hoffmann, Niels, Written Opinion of the International Preliminary Examining Authority received from the EPO dated Dec. 21, 2012, 7 pgs.
Tat, Binh, Office Action received from the USPTO dated Jan. 14, 2013 for related U.S. Appl. No. 13/028,144, 19 pgs.

(56) References Cited

OTHER PUBLICATIONS

Peregrine Semiconductor Corporation, Technical Comments to Written Opinion of the IPEA dated Jan. 21, 2013 for related appln. No. PCT/US2011/056942, 27 pgs.
Shingleton, Michael B., Office Action received from the USPTO dated Mar. 1, 2013 for related U.S. Appl. No. 11/881,816, 182 pgs.
Nishide, Ryuji, Translation of Japanese Office Action dated Jul. 17, 2012 for related appln. No. 2008-521544, 4 pgs.
Stuber. et al., Response filed in the USPTO dated Aug. 13, 2012 for related U.S. Appl. No. 13/028,144, 6 pgs.
Peregrine Semiconductor Corporation, Demand filed in the EPO filed Aug. 17, 2012 for related appln. No. PCT/US2011/056942, 41 pgs.
Corneglio, Bernard, Notification of Transmittal of the International Preliminary Report on Patentability received from the EPO dated Feb. 6, 2012 for related appln. No. PCT/US2011/056942, 27 pgs. (Per-016-Cip-PCT).
Stuber, et al., Response/Amendment filed in USPTO dated Jul. 15, 2013 for related U.S. Appl. No. 13/028,144, 20 pgs.
Brindle, et al., Preliminary Amendment filed in USPTO dated Jul. 19, 2013 for related U.S. Appl. No. 13/850,251, 21 pgs.
Stuber, et al., Comments on Examiners Statement of Reasons for Allowance filed in the USPTO dated Sep. 27, 2013 for related U.S. Appl. No. 13/028,144, 4 pgs.
Tieu, Binh Kien, Notice of Allowance received from the USPTO dated Sep. 30, 2013 for related U.S. Appl. No. 12/980,161, 8 pgs.
Shingleton, Michael B., Final Office Action received from the USPTO dated Oct. 23, 2013 for related U.S. Appl. No. 11/881,816, 25 pgs.
Unterberger, M., Summons to attend oral proceedings pursuant to Rule 115(1) EPC received from EPO dated Oct. 17, 2013 for related appln. No. 02800982.7, 15 pgs.
Stuber, et al., Amendment filed in the USPTO dated Dec. 20, 2013 for related U.S. Appl. No. 13/028,144, 25 pgs.
Brindle, et al., Amendment filed in the USPTO dated Dec. 26, 2013 for related U.S. Appl. No. 13/850,251, 22 pgs.
Dribinsky, et al. Response filed in USPTO dated Feb. 4, 2014 for U.S. Appl. No. 11/881,816, 20 pgs.
Shingleton, Michael, Advisory Action received from the USPTO dated Feb. 19, 2014 for related U.S. Appl. No. 11/881,816, 3 pgs.
Dribinsky, et al., Notice of Appeal, Pre-Appeal Brief Request for Review and Reasons Accompanying Pre-Appeal Brief Request for review filed in the USPTO dated Feb. 20, 2014 for related U.S. Appl. No. 11/881,816, 7 pgs.
Dang, Hung Q., Office Action received from the USPTO dated Feb. 26, 2014 for related U.S. Appl. No. 12/735,954, 34 pgs.
Morena, Enrico, Communication pursuant to Article 94(3) EPC received from the EPO dated Dec. 18, 2013 for related appln. No. 06814836.0, 5 pgs.
Peregrine Semiconductor Corporation, Response filed in the EPO Dated Jan. 9, 2014 for related appln. No. 02800982.7, 21 pgs.
European Patent Office, Brief Communication dated Jan. 16, 2014 regarding Oral Proceedings to be held Feb. 12, 2014, letter from opponent dated Jan. 10, 2014, for related appln. No. 02800982.7, 7 pgs.
Huber & Schussler, Report on Decision in EPO Opposition Division for related appln. No. 02800982.7-2220 dated Feb. 25, 2014, 13 pgs.

\* cited by examiner

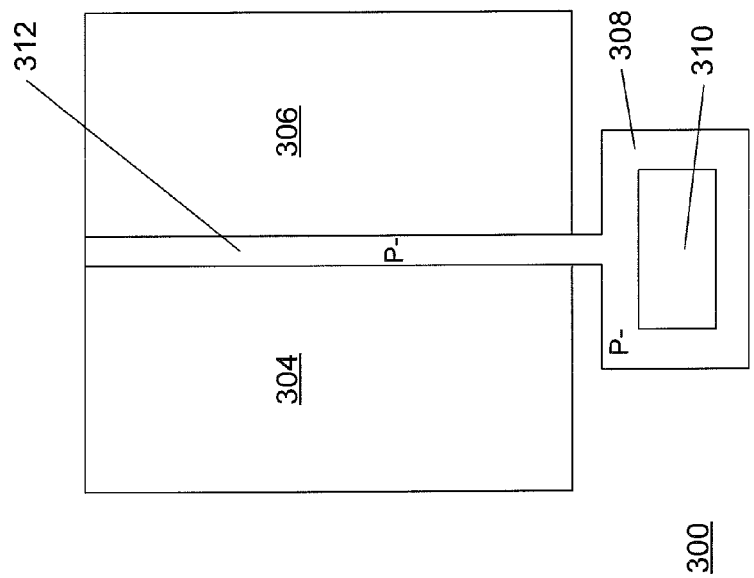
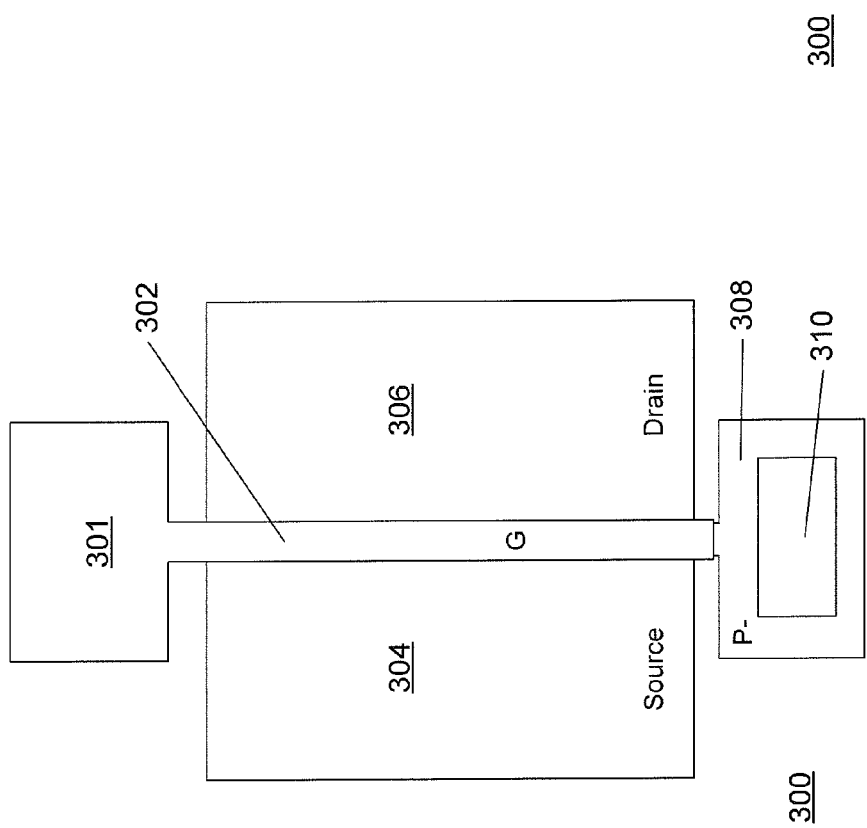
Figure 3B
Figure 3A

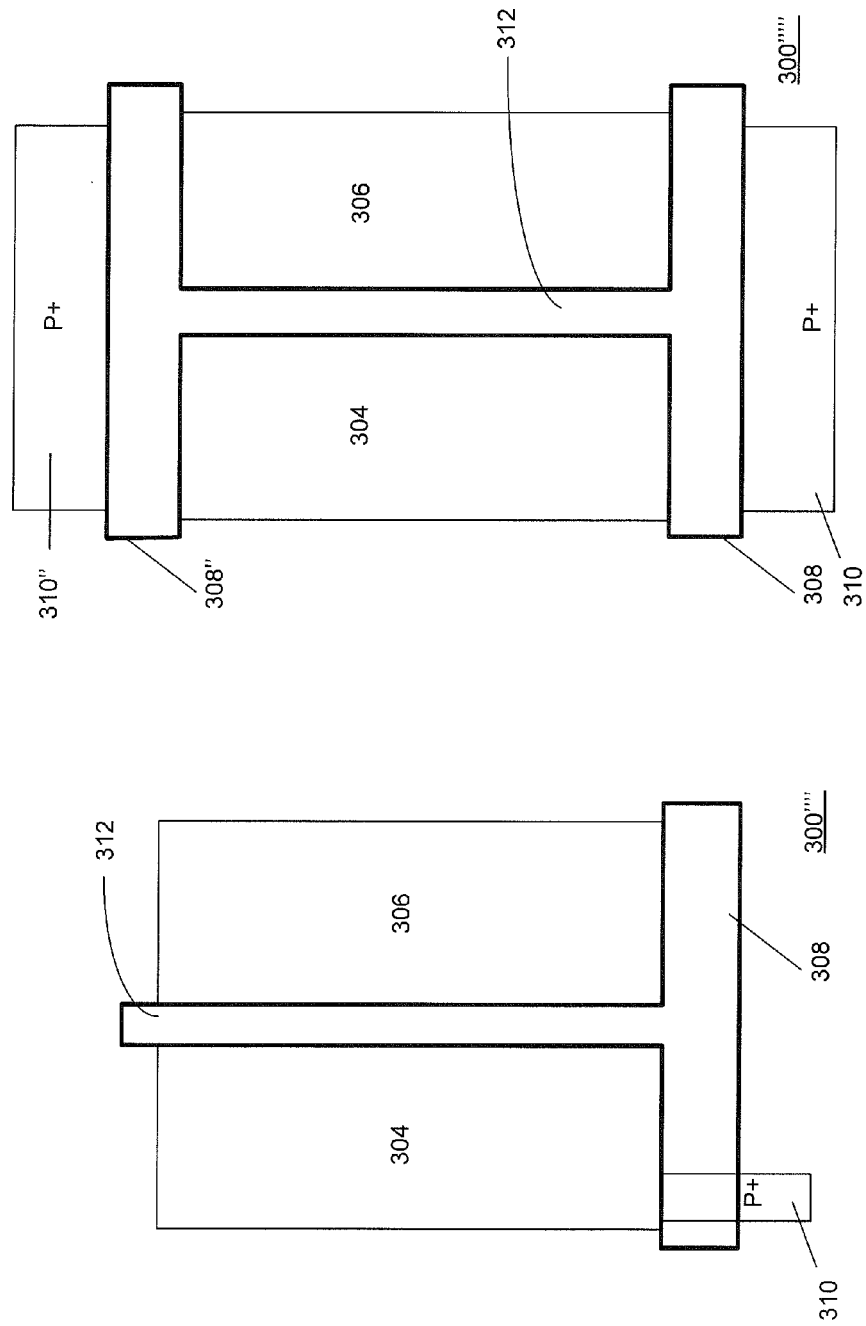

US 8,742,502 B2

METHOD AND APPARATUS FOR USE IN IMPROVING LINEARITY OF MOSFETS USING AN ACCUMULATED CHARGE SINK-HARMONIC WRINKLE REDUCTION

CROSS-REFERENCE TO RELATED APPLICATIONS CLAIM OF PRIORITY

This patent application claims the benefit of priority to U.S. provisional application No. 61/405,165, filed Oct. 20, 2010; this patent application is also a Continuation-in-Part (CIP) of U.S. patent application Ser. No. 13/053,211 filed Mar. 22, 2011, now U.S. Pat. No. 8,129,787 which is a divisional application of U.S. patent application Ser. No. 11/484,370 filed Jul. 10, 2006 (now U.S. Pat. No. 7,910,993, dated Mar. 22, 2011) which claims the benefit of priority to U.S. provisional application No. 60/698,523, filed Jul. 11, 2005. This patent application is also related to U.S. application Ser. No. 11/520,912 filed Sep. 14, 2006 (now U.S. Pat. No. 7,890,891, dated Feb. 15, 2011) which claims the benefit of priority to U.S. Provisional Application Nos. 60/718,260, filed Sep. 15, 2005. The contents of all of the applications and issued patents cited above, including appendices of those applications, are incorporated by reference herein in their entirety as if set forth in full.

BACKGROUND

1. Field

The present invention relates to metal-oxide-semiconductor (MOS) field effect transistors (FETs), and particularly to MOSFETs fabricated on Semiconductor-On-Insulator ("SOI") and Semiconductor-On-Sapphire ("SOS") substrates. In one embodiment, an SOI (or SOS) MOSFET is adapted to control accumulated charge and thereby improve linearity of circuit elements.

2. Description of Related Art

Although the disclosed method and apparatus for use in improving the linearity of MOSFETs are described herein as applicable for use in SOI MOSFETs, it will be appreciated by those skilled in the electronic device design arts that the present teachings are equally applicable for use in SOS MOSFETs. In general, the present teachings can be used in the implementation of MOSFETs using any convenient semiconductor-on-insulator technology, including silicon-on-insulator technology. For example, the inventive MOSFETs described herein can be implemented using compound semiconductors on insulating substrates. Such compound semiconductors include, but are not limited to, the following: Silicon Germanium (SiGe), Gallium Arsenide (GaAs), Indium Phosphide (InP), Gallium Nitride (GaN), Silicon Carbide (SiC), and II-VI compound semiconductors, including Zinc Selenide (ZnSe) and Zinc Sulfide (ZnS). The present teachings also may be used in implementing MOSFETs fabricated from thin-film polymers. Organic thin-film transistors (OTFTs) utilize a polymer, conjugated polymers, oligomers, or other molecules to form the insulting gate dielectric layer. The present inventive methods and apparatus may be used in implementing such OTFTs.

It will be appreciated by those skilled in the electronic design arts that the present disclosed method and apparatus apply to virtually any insulating gate technology, and to integrated circuits having a floating body. As those skilled in the art will appreciate, technologies are constantly being developed for achieving "floating body" implementations. For example, the inventors are aware of circuits implemented in bulk silicon wherein circuit implementations are used to "float" the body of the device. In addition, the disclosed method and apparatus can also be implemented using silicon-on-bonded wafer implementations. One such silicon-on-bonded wafer technique uses "direct silicon bonded" (DSB) substrates. Direct silicon bond (DSB) substrates are fabricated by bonding and electrically attaching a film of single-crystal silicon of differing crystal orientation onto a base substrate. The present disclosure therefore contemplates embodiments of the disclosed method and apparatus implemented in any of the developing floating body implementations. Therefore, references to and exemplary descriptions of SOI MOSFETs herein are not to be construed as limiting the applicability of the present teachings to SOI MOSFETs only. Rather, as described below in more detail, the disclosed method and apparatus find utility in MOSFETs implemented in a plurality of device technologies, including SOS and silicon-on-bonded wafer technologies.

As is well known, a MOSFET employs a gate-modulated conductive channel of n-type or p-type conductivity, and is accordingly referred to as an "NMOSFET" or "PMOSFET", respectively. FIG. 1 shows a cross-sectional view of an exemplary prior art SOI NMOSFET 100. As shown in FIG. 1, the prior art SOI NMOSFET 100 includes an insulating substrate 118 that may comprise a buried oxide layer, sapphire, or other insulating material. A source 112 and drain 116 of the NMOSFET 100 comprise N+ regions (i.e., regions that are heavily doped with an "n-type" dopant material) produced by ion implantation into a silicon layer positioned above the insulating substrate 118. (The source and drain of PMOSFETs comprise P+ regions (i.e., regions heavily doped with "p-type" dopant material)). The body 114 comprises a P− region (i.e., a region that is lightly doped with a "p-type" dopant), produced by ion implantation, or by dopants already present in the silicon layer when it is formed on the insulating substrate 118. As shown in FIG. 1, the NMOSFET 100 also includes a gate oxide 110 positioned over the body 114. The gate oxide 110 typically comprises a thin layer of an insulating dielectric material such as $SiO_2$. The gate oxide 110 electrically insulates the body 114 from a gate 108 positioned over the gate oxide 110. The gate 108 comprises a layer of metal or, more typically, polysilicon A source terminal 102 is operatively coupled to the source 112 so that a source bias voltage "Vs" may be applied to the source 112. A drain terminal 106 is operatively coupled to the drain 116 so that a drain bias voltage "Vd" may be applied to the drain 116. A gate terminal 104 is operatively coupled to the gate 108 so that a gate bias voltage "Vg" may be applied to the gate 108.

As is well known, when a voltage is applied between the gate and source terminals of a MOSFET, a generated electric field penetrates through the gate oxide to the transistor body. For an enhancement mode device, a positive gate bias creates a channel in the channel region of the MOSFET body through which current passes between the source and drain. For a depletion mode device, a channel is present for a zero gate bias. Varying the voltage applied to the gate modulates the conductivity of the channel and thereby controls the current flow between the source and drain.

For an enhancement mode MOSFET, for example, the gate bias creates a so-called "inversion channel" in a channel region of the body 114 under the gate oxide 110. The inversion channel comprises carriers having the same polarity (e.g., "P" polarity (i.e., hole carriers), or "N" polarity (i.e., electron carriers) carriers) as the polarity of the source and drain carriers, and it thereby provides a conduit (i.e., channel) through which current passes between the source and the drain. For example, as shown in the SOI NMOSFET 100 of FIG. 1, when a sufficiently positive voltage is applied between the gate 108 and the source 112 (i.e. a positive gate bias exceeding a threshold voltage $V_{th}$), an inversion channel is formed in the channel region of the body 114. As noted above, the polarity of carriers in the inversion channel is identical to the polarity of carriers in the source and drain. In this example, because the source and drain comprise "n-type" dopant material and therefore have N polarity carriers, the carriers in the channel comprise N polarity carriers. Similarly, because the source and drain comprise "p-type" dopant material in PMOSFETs, the carriers in the channel of turned on (i.e., conducting) PMOSFETs comprise P polarity carriers.

Depletion mode MOSFETs operate similarly to enhancement mode MOSFETs, however, depletion mode MOSFETs are doped so that a conducting channel exists even without a voltage being applied to the gate. When a voltage of appropriate polarity is applied to the gate the channel is depleted. This, in turn, reduces the current flow through the depletion mode device. In essence, the depletion mode device is analogous to a "normally closed" switch, while the enhancement mode device is analogous to a "normally open" switch. Both enhancement and depletion mode MOSFETs have a gate voltage threshold, $V_{th}$, at which the MOSFET changes from an off-state (non-conducting) to an on-state (conducting).

No matter what mode of operation an SOI MOSFET employs (i.e., whether enhancement or depletion mode), when the MOSFET is operated in an off-state (i.e., the gate voltage does not exceed $V_{th}$), and when a sufficient nonzero gate bias voltage is applied with respect to the source and drain, an "accumulated charge" may occur under the gate. The "accumulated charge", as defined in more detail below and used throughout the present application, is similar to the "accumulation charge" described in the prior art literature in reference to MOS capacitors. However, the prior art references describe "accumulation charge" as referring only to bias-induced charge existing under a MOS capacitor oxide, wherein the accumulation charge is of the same polarity as the majority carriers of the semiconductor material under the capacitor oxide. In contrast, and as described below in more detail, "accumulated charge" is used herein to refer to gate-bias induced carriers that may accumulate in the body of an off-state MOSFET, even if the majority carriers in the body do not have the same polarity as the accumulated charge. This situation may occur, for example, in an off-state depletion mode NMOSFET, wherein the accumulated charge may comprise holes (i.e., having P polarity) even though the body doping is N– rather than P–.

For example, as shown in FIG. 1, when the SOI NMOSFET 100 is biased to operate in an off-state, and when a sufficient nonzero voltage is applied to the gate 108, an accumulated charge 120 may accumulate in the body 114 underneath and proximate the gate oxide 110. The operating state of the SOI NMOSFET 100 shown in FIG. 1 is referred to herein as an "accumulated charge regime" of the MOSFET. The accumulated charge regime is defined in more detail below. The causes and effects of the accumulated charge in SOI MOSFETs are now described in more detail.

As is well known, electron-hole pair carriers may be generated in MOSFET bodies as a result of several mechanisms (e.g., thermal, optical, and band-to-band tunneling electron-hole pair generation processes). When electron-hole pair carriers are generated within an NMOSFET body, for example, and when the NMOSFET is biased in an off-state condition, electrons may be separated from their hole counterparts and pulled into both the source and drain. Over a period of time, assuming the NMOSFET continues to be biased in the off-state, the holes (resulting from the separated electron-hole pairs) may accumulate under the gate oxide (i.e., forming an "accumulated charge") underneath and proximate the gate oxide. A similar process (with the behavior of electrons and holes reversed) occurs in similarly biased PMOSFET devices. This phenomenon is now described with reference to the SOI NMOSFET 100 of FIG. 1.

When the SOI NMOSFET 100 is operated with gate, source and drain bias voltages that deplete the channel carriers in the body 114 (i.e., the NMOSFET 100 is in the off-state), holes may accumulate underneath and proximate the gate oxide 110. For example, if the source bias voltage Vs and the drain bias voltage Vd are both zero (e.g., connected to a ground contact, not shown), and the gate bias voltage Vg comprises a sufficiently negative voltage with respect to ground and with respect to $V_{th}$, holes present in the body 114 become attracted to the channel region proximate the gate oxide 110. Over a period of time, unless removed or otherwise controlled, the holes accumulate underneath the gate oxide 110 and result in the accumulated charge 120 shown in FIG. 1. The accumulated charge 120 is therefore shown as positive "+" hole carriers in FIG. 1. In the example given, Vg is negative with respect to Vs and Vd, so electric field regions 122 and 124 may also be present.

MOSFETs using body contacts are known in the art. For example, Burr in U.S. Pat. No. 6,249,027 describes a partially depleted SOI device having a single dedicated single body bias means. Burr shows depletion regions and respective body regions disposed beneath the depletion regions. In each of the body regions, a respective body contact is present and is in electrical communication with the corresponding body region. The body contacts are also connected to bias voltage generators. The body contact is connected to the body of the partially depleted SOI device so that the threshold voltage $V_{TH}$ can be adjusted for variations in process, temperature and circuit activity. Therefore, Burr discloses the use of body contacts to fine tune the threshold voltage, but does not disclose or address operation of a MOSFET in an accumulated charge regime where accumulated charge is present in the body regions of the MOSFET as described below.

Accumulated Charge Regime Defined

The accumulated charge is opposite in polarity to the polarity of carriers in the channel. Because, as described above, the polarity of carriers in the channel is identical to the polarity of carriers in the source and drain, the polarity of the accumulated charge 120 is also opposite to the polarity of carriers in the source and drain. For example, under the operating conditions described above, holes (having "P" polarity) accumulate in off-state NMOSFETs, and electrons (having "N" polarity) accumulate in off-state PMOSFETs. Therefore, a MOSFET device is defined herein as operating within the "accumulated charge regime" when the MOSFET is biased to operate in an off-state, and when carriers having opposite polarity to the channel carriers are present in the channel region. Stated in other terms, a MOSFET is defined as operating within the accumulated charge regime when the MOSFET is biased to operate in an off-state, and when carriers are present in the channel region having a polarity that is opposite the polarity of the source and drain carriers.

For example, and referring again to FIG. 1, the accumulated charge 120 comprises hole carriers having P or "+" polarity. In contrast, the carriers in the source, drain, and channel (i.e., when the FET is in the on-state) comprise electron carriers having N or "–" polarity. The SOI NMOSFET 100 is therefore shown in FIG. 1 as operating in the accumulated charge regime. It is biased to operate in an off-state, and an accumulated charge 120 is present in the channel region.

The accumulated charge 120 is opposite in polarity (P) to the polarity of the channel, source and drain carriers (N).

In another example, wherein the SOI NMOSFET 100 comprises a depletion mode device, $V_{th}$ is negative by definition. According to this example, the body 114 comprises an N-region (as contrasted with the P− region shown in FIG. 1). The source and drain comprise N+ regions similar to those shown in the enhancement mode MOSFET 100 of FIG. 1. For Vs and Vd both at zero volts, when a gate bias Vg is applied that is sufficiently negative relative to $V_{th}$ (for example, a Vg that is more negative than approximately −1 V relative to $V_{th}$), the depletion mode NMOSFET is biased into an off-state. If biased in the off-state for a sufficiently long period of time, holes may accumulate under the gate oxide and thereby comprise the accumulated charge 120 shown in FIG. 1.

In other examples, Vs and Vd may comprise nonzero bias voltages. In some embodiments, Vg must be sufficiently negative to both Vs and Vd (in order for Vg to be sufficiently negative to $V_{th}$, for example) in order to bias the NMOSFET in the off-state. Those skilled in the MOSFET device design arts shall recognize that a wide variety of bias voltages may be used to practice the present teachings. As described below in more detail, the present disclosed method and apparatus contemplates use in any SOI MOSFET device biased to operate in the accumulated charge regime.

SOI and SOS MOSFETs are often used in applications in which operation within the accumulated charge regime adversely affects MOSFET performance. As described below in more detail, unless the accumulated charge is removed or otherwise controlled, it detrimentally affects performance of SOI MOSFETs under certain operating conditions. One exemplary application, described below in more detail with reference to the circuits shown in FIGS. 2B and 5A, is the use of SOI MOSFETs in the implementation of radio frequency (RF) switching circuits. As described below with reference to FIGS. 2B and 5A in more detail, the inventors have discovered that unless the accumulated charge is removed or otherwise controlled, under some operating conditions, the accumulated charge adversely affects the linearity of the SOI MOSFET and thereby increases harmonic distortion and intermodulation distortion (IMD) caused by the MOSFET when used in the implementation of certain circuits. In addition, as described below in more detail, the inventors have discovered that removal or control of the accumulated charge improves the drain-to-source breakdown voltage (i.e., the "BVDSS") characteristics of the SOI MOSFETs.

Therefore, it is desirable to provide techniques for adapting and improving SOI (and SOS) MOSFETs, and circuits implemented with the improved SOI MOSFETs, in order to remove or otherwise control the accumulated charge, and thereby significantly improve SOI MOSFET performance. It is desirable to provide methods and apparatus for use in improving the linearity characteristics in SOI MOSFETs. The improved MOSFETs should have improved linearity, harmonic distortion, intermodulation distortion, and BVDSS characteristics as compared with prior art MOSFETs, and thereby improve the performance of circuits implemented with the improved MOSFETs. The present teachings provide such novel methods and apparatus.

SUMMARY

Apparatuses and methods are provided to control accumulated charge in SOI MOSFETs, thereby improving nonlinear responses and harmonic and intermodulaton distortion effects in the operation of the SOI MOSFETs.

In one embodiment, a circuit having at least one SOI MOSFET is configured to operate in an accumulated charge regime. An accumulated charge sink (ACS), operatively coupled to the body of the SOI MOSFET, receives accumulated charge generated in the body, thereby reducing the nonlinearity of the net source-drain capacitance of the SOI MOSFET.

In one embodiment, the ACS comprises a high impedance connection to the MOSFET body, with exemplary impedance greater than $10^6$ ohm.

In one embodiment, an accumulated charge control (ACC) floating body metal-oxide-semiconductor field effect transistor (MOSFET) comprises: a gate; a drain; a source; a body, where the body has a gate modulated conductive channel between the source and the drain; a gate oxide layer positioned between the gate and the body; and an accumulated charge sink (ACS) operatively coupled to the body, wherein the ACS comprises material selected to shift a capacitance versus voltage inflection inside the ACS away from a desired region of operation; where accumulated charge is present in the body of the floating body MOSFET when the MOSFET is biased to operate in an accumulated charge regime, and where the gate modulated conductive channel, source, and drain have carriers of identical polarity when the MOSFET is biased to operate in an on-state and wherein the MOSFET operates in the accumulated charge regime when the MOSFET is biased to operate in a off-state and when the accumulated charge has a polarity that is opposite to the polarity of the source, drain, and gate modulated conductive channel.

In one embodiment, an ACC MOSFET adapted to control charge accumulated in the body of the MOSFET when the MOSFET is biased to operate in an accumulated charge regime, comprises: a) a gate, drain, source, floating body, and a gate oxide layer positioned between the gate and the floating body, where the ACC MOSFET is biased to operate in the accumulated charge regime when the MOSFET is operated in a non-conducting or near non-conducting state and charge accumulates within the body in a region proximate and underneath the gate oxide layer; b) a first accumulated charge sink positioned proximate a first distal end of the floating body, where the first ACS is in electrical communication with the floating body, and wherein, when the MOSFET is operated in the accumulated charge regime, a first ACS bias voltage is applied to the first ACS to control the accumulated charge in the MOSFET body or to remove the accumulated charge from the MOSFET body via the first ACS; c) a second accumulated charge sink positioned proximate a second distal end of the floating body, wherein the second ACS is in electrical communication with the floating body and wherein, when the MOSFET is operated in the accumulated charge regime, a second ACS bias voltage is applied to the second ACS to control the accumulated charge in the MOSFET body or to remove the accumulated charge from the MOSFET body via the second ACS; d) a first electrical contact region positioned proximate to and in electrical communication with the first ACS, wherein the electrical contact region facilitates electrical coupling to the first ACS; and e) a second electrical contact region positioned proximate to and in electrical communication with the second ACS, wherein the electrical contact region facilitates electrical coupling to the second ACS.

In one embodiment, an ACC MOSFET adapted to control charge accumulated in the body of the MOSFET when the MOSFET is biased to operate in an accumulated charge regime, comprises: a) a gate, drain, source, floating body, and a gate oxide layer positioned between the gate and the floating body, where the ACC MOSFET is biased to operate in the accumulated charge regime when the MOSFET is operated in a non-conducting or near non-conducting state and charge accumulates within the body in a region proximate and underneath the gate oxide layer; b) a plurality of accumulated charge sinks positioned proximate portions of the floating body, wherein each accumulated charge sink of the plurality of accumulated charge sinks is electrically coupled to the floating body, and where, when the MOSFET is operated in the accumulated charge regime, ACS bias voltages are applied to each accumulated charge sink to control the accumulated charge in the MOSFET body or to remove the accumulated charge from the MOSFET body via the plurality of accumulated charge sinks; and c) a plurality of electrical contact regions positioned proximate to corresponding accumulated charge sinks, wherein each electrical contact region facilitates electrical coupling to the corresponding accumulated charge sink.

BRIEF DESCRIPTION OF THE DRAWINGS

FIGS. 3A and 3B are simplified schematic diagrams of a top view of an improved SOI NMOSFET adapted to control accumulated charge in accordance with the present teachings.

FIG. 3I is a plot of inversion channel charge as a function of applied gate voltage when a region of increased threshold voltage is present in an SOI MOSFET.

FIG. 3J is a simplified top view schematic of an improved SOI NMOSFET adapted to control accumulated charge and configured in a "T-gate" configuration.

FIG. 3K is a simplified top view schematic of an improved SOI NMOSFET adapted to control accumulated charge and configured in an "H-gate" configuration.

Like reference numbers and designations in the various drawings indicate like elements.

DETAILED DESCRIPTION

As noted above, those skilled in the electronic device design arts shall appreciate that the teachings herein apply equally to NMOSFETs and PMOSFETs. For simplicity, the embodiments and examples presented herein for illustrative purposes include only NMOSFETs, unless otherwise noted. By making well known changes to dopants, charge carriers, polarity of bias voltages, etc., persons skilled in the arts of electronic devices will easily understand how these embodiments and examples may be adapted for use with PMOSFETs.

Non-Linearity and Harmonic Distortion Effects of Accumulated Charge in an SOI NMOSFET As described above in the background, no matter what mode of operation the MOSFET employs (i.e., enhancement mode or depletion mode), under some circumstances, when a MOSFET is operated in an off-state with a nonzero gate bias voltage applied with respect to the source and drain, an accumulated charge may occur under the gate. According to the present teachings, as described above when the MOSFET is in an off-state, and when carriers are present in the channel region having a polarity that is opposite the polarity of the source and drain carriers, the MOSFET is defined herein as operating in the accumulated charge regime.

According to the present teachings, the inventors have observed that, when used in certain circuit implementations, MOSFETs operating in the accumulated charge regime exhibit undesirable non-linear characteristics that adversely impact circuit performance. For example, as described below in more detail with reference to FIG. 2A, the accumulated charge 120 (FIG. 1) adversely affects the linearity of off-state SOI MOSFETs, and more specifically, it adversely affects the linearity of contributing capacitances to the drain-to-source capacitance (Cds). For an SOI MOSFET operating in an off-state, Cds is referred to as $C_{off}$. The contributing capacitances to $C_{off}$ are described below in reference to FIG. 2A for bias conditions wherein the gate bias Vg is provided by a circuit having an impedance that is large compared to the impedances of the contributing capacitances. As described below with reference to FIGS. 2B and 5A, this, in turn, adversely affects harmonic distortion, intermodulation distortion, and other performance characteristics of circuits implemented with the SOI MOSFETs. These novel observations, not taught or suggested by the prior art, may be understood with reference to the electrical model shown in FIG. 2A.

Figure 1:
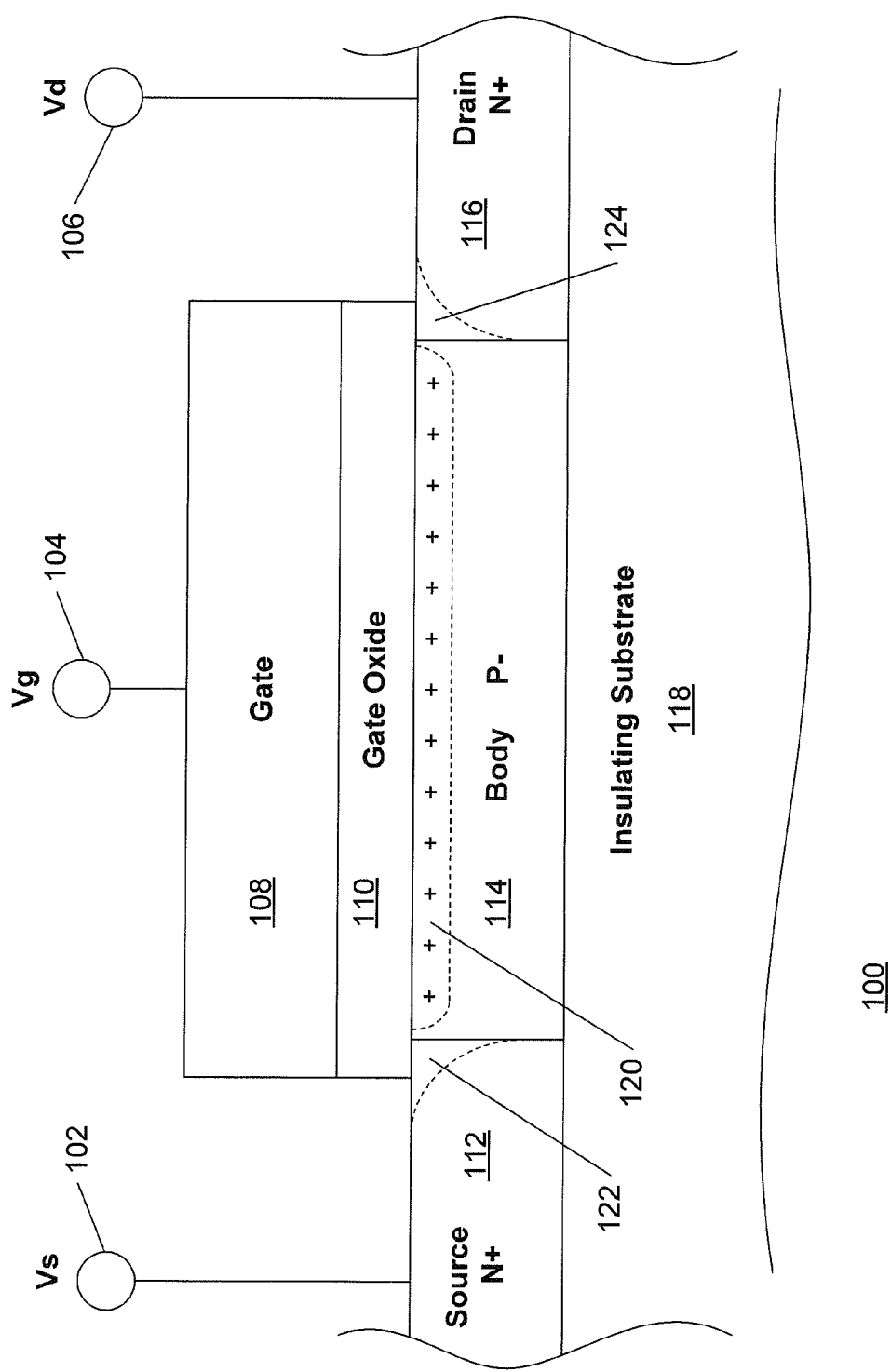
FIG. 1 is a cross-sectional view of an exemplary prior art SOI NMOSFET.
Figure 2A:
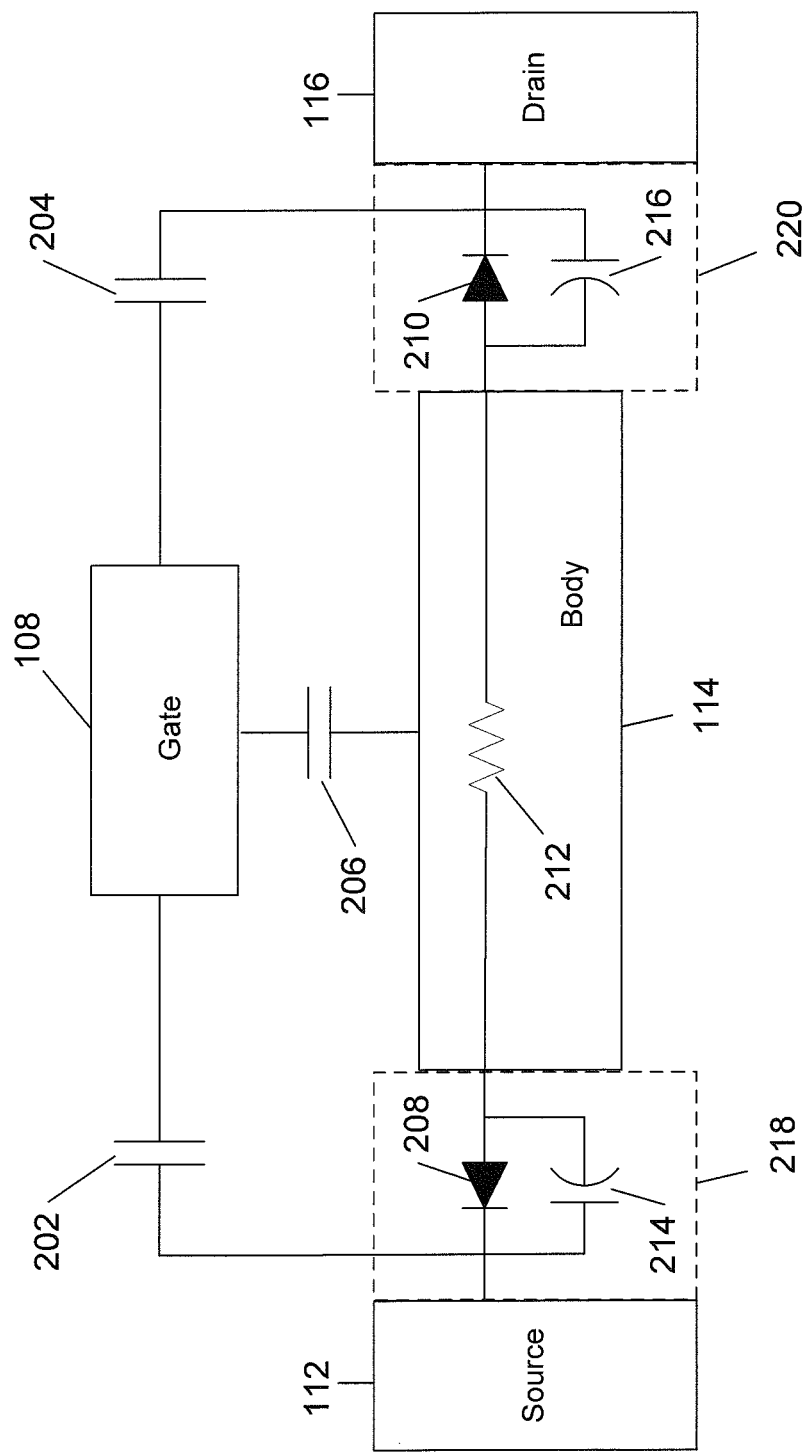
FIG. 2A is a simplified schematic of an electrical model showing the off-state impedance characteristics of the exemplary prior art SOI NMOSFET of FIG. 1.

FIG. 2A is a simplified schematic of an electrical model 200 showing the off-state impedance (or conversely, conductance) characteristics of the exemplary prior art SOI NMOSFET 100 of FIG. 1. More specifically, the model 200 shows the impedance characteristics from the source 112 to the drain 116 when the NMOSFET 100 is operated in the off-state. Because the drain-to-source off-state impedance characteristic of the NMOSFET 100 is primarily capacitive in nature, it is referred to herein as the drain-to-source off-state capacitance ($C_{off}$). For the exemplary description herein, the gate 108 is understood to be biased at a voltage Vg by a circuit (not shown) that has an impedance that is large compared to the impedances of the contributing capacitances described in reference to FIG. 2A. Persons skilled in the electronic arts will understand how this exemplary description may be modified for the case wherein the impedance of the circuit providing the Vg bias is not large compared to the impedances of the contributing capacitances.

As shown in FIG. 2A, the junction between the source 112 and the body 114 (i.e., a source-body junction 218) of the off-state NMOSFET 100 can be represented by a junction diode 208 and a junction capacitor 214, configured as shown. Similarly, the junction between the drain 116 and the body 114 (i.e., the drain-body junction 220) of the off-state NMOSFET 100 can be represented by a junction diode 210 and a junction capacitor 216, configured as shown. The body 114 is represented simply as an impedance 212 that is present between the source-body junction 218 and the drain-body junction 220.

A capacitor 206 represents the capacitance between the gate 108 and the body 114. A capacitor 202 represents the capacitance between the source 112 and the gate 108, and another capacitor 204 represents the capacitance between the drain 116 and the gate 108. A substrate capacitance due to the electrical coupling between the source 112 and the drain 116 (through the insulating substrate 118 shown in FIG. 1) is taken to be negligibly small in the exemplary description set forth below, and therefore is not shown in the electrical model 200 of FIG. 2A.

As described above, when the NMOSFET 100 is in the off-state, and when the accumulated charge 120 (FIG. 1) is not present in the body 114 (i.e., the NMOSFET 100 is not operating within the accumulated charge regime), the body 114 is depleted of charge carriers. In this case the body impedance 212 is analogous to the impedance of an insulator, and the electrical conductance through the body 114 is very small (i.e., the NMOSFET 100 is in the off-state). Consequently, the principal contributions to the drain-to-source off-state capacitance $C_{off}$ are provided by the capacitors 202 and 204. The capacitors 202 and 204 are only slightly voltage dependent, and therefore do not significantly contribute to a non-linear response that adversely affects harmonic generation and intermodulation distortion characteristics.

However, when the NMOSFET 100 operates within the accumulated charge regime, and the accumulated charge 120 is therefore present in the body 114, mobile holes comprising the accumulated charge produce p-type conductivity between the source-body junction 218 and the drain-body junction 220. In effect, the accumulated charge 120 produces an impedance between the source-body junction 218 and the drain-body junction 220 that is significantly less than the impedance between the junctions in the absence of the accumulated charge. If a Vds voltage is applied between the drain 116 and the source 112, the mobile holes redistribute according to the electrical potentials that result within the body 114. DC and low-frequency current flow through the SOI NMOSFET 100 is prevented by the diode properties of the source-body junction 218 and the drain-body junction 220, as represented by the junction diodes 208 and 210, respectively. That is, because the junction diodes 208 and 210 are anti-series (i.e., "back-to-back") in this case, no DC or low-frequency currents flow through the SOI NMOSFET 100. However, high-frequency currents may flow through the SOI NMOSFET 100 via the capacitances of the source-body junction 218 and the drain-body junction 220, as represented by the junction capacitors 214 and 216, respectively.

The junction capacitors 214 and 216 are voltage dependent because they are associated with junctions between n-type and p-type regions. This voltage dependence results from the voltage dependence of the width of the depletion region of the junction between the n-type and p-type regions. As a bias voltage is applied to the NMOSFET, the width of the depletion region of the junction between the n-type and p-type regions is varied. Because the capacitance of the junction depends on the width of the junction depletion region, the capacitance also varies as a function of the bias applied across the junction (i.e., the capacitance is also voltage dependent).

Further, the capacitors 202 and 204 may also have a voltage dependence caused by the presence of the accumulated charge 120. Although the complex reasons for this voltage dependence are not described in detail herein, persons skilled in the arts of electronic devices shall understand that electric field regions (e.g., electric field regions 122 and 124 described above with reference to FIG. 1) may be affected by the response of the accumulated charge and its response to an applied Vds, thereby causing a voltage dependence of capacitors 202 and 204. An additional nonlinear effect may occur due to a direct capacitance (not shown) between the source 112 and the drain 116. Although this direct capacitance would usually be expected to be negligible for most SOI MOSFETs, it may contribute for SOI MOSFETs having very short spacing between the source and drain. The contribution of this direct capacitance to $C_{off}$ is also voltage-dependent in the presence of an accumulated charge, for reasons that are analogous to the voltage dependencies of the capacitors 202 and 204 as described above.

The voltage dependencies of the junction capacitors 214 and 216, the gate-to-source and gate-to-drain capacitors 202, 204, respectively, and the direct capacitance (not shown), cause nonlinear behavior in off-state capacitance $C_{off}$ of the MOSFET when AC voltages are applied to the NMOSFET 100, thereby producing undesirable generation of harmonic distortions and intermodulation distortion (IMD). The relative contributions of these effects are complex, and depend on fabrication processes, biases, signal amplitudes, and other variables. However, those skilled in the electronic device design arts shall understand from the teachings herein that reducing, removing, or otherwise controlling the accumulated charge provides an overall improvement in the nonlinear behavior of $C_{off}$. In addition, because the body impedance 212 is significantly decreased in the presence of the accumulated charge 120, the magnitude of $C_{off}$ may be increased when the FET operates in the accumulated charge regime. Reducing, removing, or otherwise controlling the accumulated charge also mitigates this effect.

In addition, the accumulated charge does not accumulate in the body in an instant as soon as the FET transitions from an on-state (conducting state) to an off-state (non-conducting state). Rather, when the FET transitions from the on-state to the off-state, it begins to accumulate charge in the body of the MOSFET, and the amount of accumulated charge increases over time. The accumulation of the accumulated charge therefore has an associated time constant (i.e., it does not instantly reach a steady-state level of accumulated charge). The accumulated charge accumulates slowly in the FET body. The depleted FET has a $C_{off}$ associated with it which is increased with an increasing amount of accumulated charge. In terms of FET performance, as the $C_{off}$ increases with an increasing amount of accumulated charge in the FET body, drift occurs in the FET insertion loss (i.e., the FET becomes more "lossy"), isolation (the FET becomes less isolating) and insertion phase (delay in the FET is increased). Reducing, removing, or otherwise controlling the accumulated charge also mitigates these undesirable drift effects.

The inventors have observed that the nonlinear behavior of the MOSFET off-state capacitance $C_{off}$ adversely affects the performance of certain circuits implemented with the prior art SOI MOSFETs. For example, when an RF switch is implemented using the prior art SOI MOSFETS, such as the prior art SOI NMOSFET 100 of FIG. 1, the above-described nonlinear off-state characteristics of the prior art MOSFETs adversely affect the linearity of the switch. As described below in more detail, RF switch linearity is an important design parameter in many applications. Improved switch linearity leads to improved suppression of harmonic and intermodulation (IM) distortion of signals processed by the switch. These improved switch characteristics can be critically important in some applications such as use in cellular communication devices.

For example, the well known GSM cellular communication system standard imposes stringent linearity, harmonic and intermodulation suppression, and power consumption requirements on front-end components used to implement GSM cell phones. One exemplary GSM standard requires that all harmonics of a fundamental signal be suppressed to below −30 dBm at frequencies up to 12.75 GHz. If harmonics are not suppressed below these levels, reliable cell phone operation can be significantly adversely impacted (e.g., increased dropped calls or other communication problems may result due to harmonic and intermodulation distortion of the transmit and receive signals). Because the RF switching function is generally implemented in the cell phone front-end components, improvements in the RF switch linearity, harmonic and intermodulation suppression, and power consumption performance characteristics is highly desirable. A description of how the non-linear behavior of the off-state capacitance $C_{off}$ of the prior art MOSFETs adversely affects these RF switch characteristics is now described with reference to FIG. 2B.

Figure 2B:
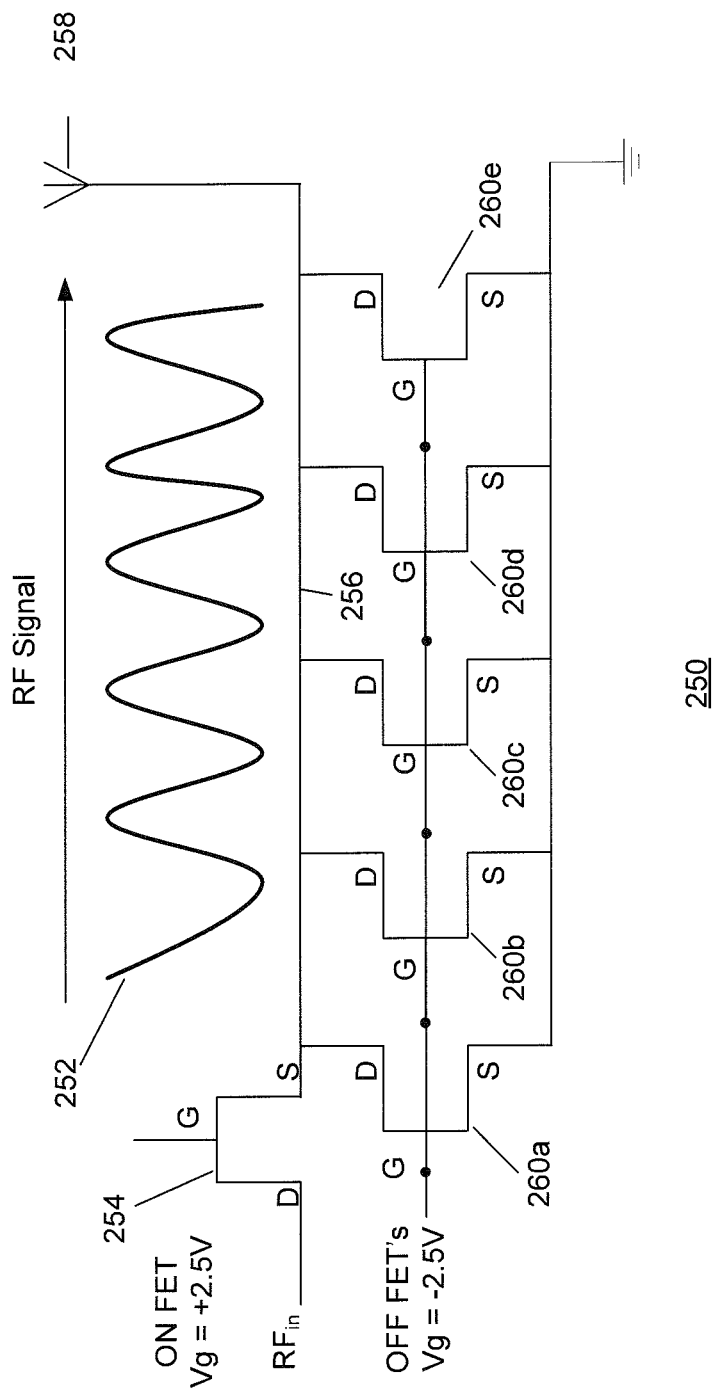
FIG. 2B is a schematic of an exemplary simplified RF switching circuit implemented using prior art SOI MOSFETs such as the prior art SOI NMOSFET of FIG. 1.

Harmonic Distortion Effects on RF Switch Circuits Implemented Using Prior Art SOI MOSFETs FIG. 2B illustrates an exemplary simplified RF switch circuit 250 implemented using prior art MOSFETs such as the prior art SOI NMOSFET 100 described above with reference to FIG. 1. A detailed description of the operation and implementation of RF switch circuits is provided in commonly assigned U.S. Pat. No. 6,804,502 which is hereby incorporated herein by reference in its entirety for its teachings on RF switch circuits. As shown in FIG. 2B, the prior art RF switch 250 includes a single "pass" or "switching" MOSFET 254 operatively coupled to five shunting MOSFETs 260a-260e.

The MOSFET 254 acts as a pass or switching transistor and is configured, when enabled, to selectively couple an RF input signal (applied to its drain, for example) to an RF antenna 258 via a transmission path 256. The shunting MOSFETs, 260a-

260e, when enabled, act to alternatively shunt the RF input signal to ground. As is well known, the switching MOSFET 254 is selectively controlled by a first switch control signal (not shown) coupled to its gate, and the shunting MOSFETs, 260a-260e are similarly controlled by a second switch control signal (not shown) coupled to their gates. The switching MOSFET 254 is thereby enabled when the shunting MOSFETs 260a-260e are disabled, and vice versa. As shown in the exemplary embodiment of the RF switch 250 of FIG. 2B, the switching MOSFET 254 is enabled by applying a gate bias voltage of +2.5V (via the first switch control signal). The shunting MOSFETs 260a-260e are disabled by applying a gate bias voltage of −2.5V (via the second switch control signal).

When the switch 250 is configured in this state, the RF signal 252 propagates through the switching MOSFET 254, through the transmission path 256, and to the antenna 258. As described above with reference to FIG. 2A, when the shunting MOSFETS 260a-260e comprise prior art SOI (or SOS) MOSFETs, such as the SOI NMOSFET 100 (FIG. 1), an accumulated charge can occur in the SOI MOSFET bodies (i.e., when the SOI MOSFETs operate in the accumulated charge regime as described above). The accumulated charge can produce nonlinear behavior in the off-state capacitance $C_{off}$ of the SOI MOSFETs when AC voltages are applied to the MOSFETs.

More specifically, when the accumulated charge is present in the channel regions of the off-state SOI MOSFETs 260a-260e it responds to variations in the RF signals applied to their respective drains. As the time varying RF signal propagates along the transmission path 256, the RF signal applies time varying source-to-drain bias voltages to the SOI MOSFETs 260a-260e. The time varying source-to-drain bias voltages creates movement of the accumulated charge within the channel regions of the SOI MOSFETs 260-260e. The movement of the accumulated charge within the channel regions of the SOI MOSFETs causes variations in the drain-to-source off-state capacitance of the SOI MOSFETs 260a-260e. More specifically, the movement of the accumulated charge within the channel regions causes a voltage dependence of the drain-to-source off-state capacitance as described above with reference to FIG. 2A. The voltage dependent variations in the off-state capacitance of the SOI MOSFETs 260a-260e is the dominant cause of harmonic distortion and IMD of the RF signal as it propagates through the RF switch 250.

As noted above, harmonic distortion and IMD of the RF signal is a major disadvantage of the prior art RF switch circuits implemented using the prior art SOI MOSFET devices. For many applications, harmonics and IMD of the RF signal must be suppressed to levels that heretofore have been difficult or impossible to achieve using prior art SOI MOSFET devices. In GSM devices, for example, at a maximum operating power of +35 dBm, prior art switches typically have only a 6 dB margin to the GSM third order harmonics suppression requirement of less than −30 dBm. Very low even order harmonic distortion is also desirable in GSM systems as the second order harmonic of the GSM transmit band also resides in the DCS receive band. Suppression of odd order (e.g., third order) harmonics of the RF signal, however, is desirable and improvements in that regard are needed.

In addition, as is well known, presence of an accumulated charge in the bodies of floating body (e.g., SOI) MOSFETs can also adversely affect the drain-to-source breakdown voltage (BVDSS) performance characteristics of the floating body MOSFETs. As is well known, floating-body FETs demonstrate drain-to-source breakdown voltage problems, also known as BVDSS, wherein the drain-to-source "punch-through" voltage is reduced by a parasitic bipolar action. The parasitic bipolar action is caused when holes are generated in the channel and the holes have nowhere to dissipate (i.e., because the body is floating, the holes have no means for escaping the body). As a consequence, the potential of the MOSFET body is increased, which effectively reduces the threshold voltage. In turn, this condition causes the MOSFET device to experience increased leakage, thereby generating more holes in the body, and thereby exacerbating the BVDSS problem (as a result of this positive feedback condition).

The present disclosed method and apparatus for improving linearity of SOI (and SOS) MOSFET devices overcomes the above-described disadvantages of the prior art. Once the accumulated charge is recognized as a major source of harmonic distortion, IMD and compression/saturation in off-state SOI MOSFET devices, and in circuits (such as RF circuits) implemented with these devices, it becomes clear that reduction, removal, and/or control of the accumulated charge improves the harmonic suppression characteristics of these devices. In addition, reduction, removal, and/or control of the accumulated charge also improve the BVDSS performance characteristics by preventing the parasitic bipolar action from occurring. Improvements in BVDSS lead to consequent improvements in device linearity. Several exemplary structures and techniques for controlling the accumulated charge in SOI MOSFETs are described in detail in the next section.

Method and Apparatus for Improving the Linearity of MOSFETs Using Accumulated Charge Sinks (ACS)—Overview As described below in more detail, the present disclosure describes methods and apparatuses for improving semiconductor device linearity (e.g., reducing adverse harmonic distortion and IMD effects) in SOI MOSFETs. In one exemplary embodiment, the method and apparatus improves the linearity and controls the harmonic distortion and IMD effects of the MOSFET devices by reducing the accumulated charge in the bodies of the MOSFET devices. In one embodiment, the present method and apparatus reduces or otherwise controls the accumulated charge in the MOSFET bodies using an accumulated charge sink (ACS) that is operatively coupled to the MOSFET body. In one embodiment, the present method and apparatus entirely removes all of the accumulated charge from the bodies of the MOSFET devices. In one described embodiment, the MOSFET is biased to operate in an accumulated charge regime, and the ACS is used to entirely remove, reduce, or otherwise control, the accumulated charge and thereby reduce harmonic distortions and IMD that would otherwise result. Linearity is also improved in some embodiments by removing or otherwise controlling the accumulated charge thereby improving the floating body MOSFET BVDSS characteristics.

As noted in the background section above, persons skilled in the electronic device design and manufacture arts shall appreciate that the teachings herein apply equally to MOSFETs fabricated on Semiconductor-On-Insulator ("SOI") and Semiconductor-On-Sapphire ("SOS") substrates. The present teachings can be used in the implementation of MOSFETs using any convenient semiconductor-on-insulator technology. For example, the inventive MOSFETs described herein can be implemented using compound semiconductors fabricated on insulating substrates, such as GaAs MOSFETs. As noted above, the present method and apparatus may also be applied to silicon-germanium (SiGe) SOI MOSFETs. For simplicity, the embodiments and examples presented herein for illustrative purposes include only NMOSFETs, unless otherwise noted. By making well known changes to dopants, charge carriers, polarity of bias voltages, etc., persons skilled in the electronic device design arts will easily understand how these embodiments and examples may be adapted for use with PMOSFETs.

As noted above, the present disclosure is particularly applicable to FETs and associated applications benefiting from a fully depleted channel when the FET is operated in the off-state, wherein an accumulated charge may result. The disclosed method and apparatus for use in improving the linearity of MOSFETs also finds applicability for use with partially depleted channels. As known to those skilled in the art, the doping and dimensions of the body vary widely. In an exemplary embodiment, the body comprises silicon having a thickness of approximately 100 angstroms to approximately 2,000 angstroms. In a further exemplary embodiment, dopant concentration within the FET bodies ranges from no more than that associated with intrinsic silicon to approximately $1 \times 10^{18}$ active dopant atoms per $cm^3$, resulting in fully-depleted transistor operation. In a further exemplary embodiment, dopant concentration within the FET bodies ranges from $1 \times 10^{18}$ to $1 \times 10^{19}$ active dopant atoms per $cm^3$ and/or the silicon comprising the body ranges from a thickness of 2000 angstroms to many micrometers, resulting in partially-depleted transistor operation. As will be appreciated by those skilled in the electronic design and manufacturing arts, the present disclosed method and apparatus for use in improving linearity of MOSFETs can be used in MOSFETs implemented in a wide variety of dopant concentrations and body dimensions. The present disclosed method and apparatus therefore is not limited for use in MOSFETs implemented using the exemplary dopant concentrations and body dimensions as set forth above.

According to one aspect of the present disclosure, accumulated charge within a FET body is reduced using control methodologies and associated circuitry. In one embodiment all of the accumulated charge is removed from the FET body. In other embodiments, the accumulated charge is reduced or otherwise controlled. In one embodiment, holes are removed from the FET body, whereas in another embodiment, electrons are removed from the FET body, as described below in more detail. By removing holes (or electrons) from the FET body using the novel and nonobvious teachings of the present disclosure, voltage induced variations in the parasitic capacitances of the off-state FETs are reduced or eliminated, thereby reducing or eliminating nonlinear behavior of the off-state FETs. In addition, as described above with reference to FIG. 2A, because the body impedance is greatly increased when the accumulated charge is reduced or controlled, there is a beneficial overall reduction in the magnitude of the FET off-state capacitances. Also, as described above, removing or otherwise controlling the accumulated charge in floating body MOSFETs improves the BVDSS characteristics of the FET and thereby improves the linearity of the floating body MOSFET.

Accumulated charge control not only facilitates a beneficial overall reduction in the FET off-state capacitance $C_{off}$ (as described above with reference to FIG. 2A and below with reference to FIG. 4H), it also facilitates a reduction in $C_{off}$ variations that can occur over time in the presence of a time varying $V_{ds}$ bias voltage. Thus, a reduction of undesirable harmonics generation and intermodulation distortion in RF switch circuits is obtained using SOI MOSFETs made in accordance with the present disclosure. Improved SOI MOSFET power handling, linearity, and performance are achieved by devices made in accordance with the present teachings. While the methods and apparatuses of the present disclosure are capable of fully removing accumulated charge from the FET bodies, those skilled in the electronic device design arts shall appreciate that any reduction of accumulated charge is beneficial.

Reductions in harmonics and intermodulation distortion are generally beneficial in any semiconductor system, either bulk semiconductor or semiconductor-on-insulator (SOI) systems. SOI systems include any semiconductor architecture employing semiconductor-containing regions positioned above an underlying insulating substrate. While any suitable insulating substrate can be used in a SOI system, exemplary insulating substrates include silicon dioxide (e.g., a buried oxide layer supported by a silicon substrate, such as that known as Separation by Implantation of Oxygen (SIMOX)), bonded wafer (thick oxide), glass, and sapphire. As noted above, in addition to the commonly used silicon-based systems, some embodiments of the present disclosure may be implemented using silicon-germanium (SiGe), wherein the SiGe is used equivalently in place of Si.

A wide variety of ACS implementations and structures can be used to practice the present disclosed method and apparatus. In accordance with one embodiment of the present method and apparatus, an ACS is used to remove or otherwise control accumulated charge (referenced as 120 in FIG. 1 described above) from the MOSFETs when the MOSFETs are configured to operate in the accumulated charge regime. By adapting the SOI (or SOS) MOSFETs in accordance with the present teachings, improved Accumulated Charge Control (ACC) MOSFETs are realized. The ACC MOSFETs are useful in improving performance of many circuits, including RF switching circuits. Various characteristics and possible configurations of the exemplary ACC MOSFETs are described in detail below with reference to FIGS. 3A-3K. This section also describes how the exemplary ACS implementations of the present disclosure differ from the body contacts of the prior art.

Figure 4A:
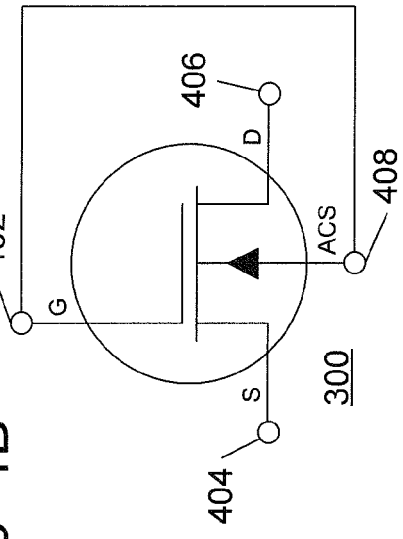
FIG. 4A is a simplified schematic of an improved SOI NMOSFET adapted to control accumulated charge embodied as a four terminal device.

The ACC MOSFET is shown schematically embodied as a four-terminal device in FIG. 4A. FIGS. 4B-4G show various exemplary simple circuit configurations that can be used in removing the accumulated charge from the ACC MOSFET when it operates in an accumulated charge regime. The operation of the simplified circuit configurations is described in more detail below with reference to FIGS. 4A-4G. The improvement in off-state capacitance $C_{off}$ of the ACC MOSFETs, as compared with the off-state capacitance of the prior art SOI MOSFETs, is described below with reference to FIG. 4H.

The operation of various exemplary RF switch circuits implemented using the ACC MOSFETs of the present disclosure is described below with reference to the circuit schematics of FIGS. 5B-5D. Further, an exemplary RF switch circuit using stacked ACC MOSFETs (for increased power handling) of the present disclosure is described below with reference to FIG. 6. An exemplary method of improving the linearity of an SOI MOSFET using an accumulated charge sink (ACS) is described with reference to FIG. 7. Finally, exemplary fabrication methods that may be used to manufacture the ACC MOSFET are described. The various exemplary ACS implementations and structures that can be used to practice the disclosed method and apparatus are now described with reference to FIGS. 3A-3K.

Controlling Accumulated Charge Using an Accumulated Charge Sink (ACS)

FIGS. 3A and 3B are simplified schematic diagrams of a top view of an Accumulated Charge Control (ACC) SOI NMOSFET 300 adapted to control accumulated charge 120 (FIG. 1) in accordance with the present disclosure. In the exemplary embodiment, a gate contact 301 is coupled to a first end of a gate 302. A gate oxide (not shown in FIG. 3A but shown in FIG. 1) and a body 312 (shown in FIG. 3B) are positioned under the gate 302. In the exemplary NMOSFET 300 shown, a source 304 and a drain 306 comprise N+ regions. In the exemplary embodiment, the ACC NMOSFET 300 includes an accumulated charge sink (ACS) 308 comprising a P− region. The ACS 308 is coupled to and is in electrical communication with the body 312 which also comprises a P− region. An electrical contact region 310 provides electrical connection to the ACS 308. In some embodiments, the electrical contact region 310 comprises a P+ region. As shown in FIG. 3A, the electrical contact region 310 is coupled to and is in electrical communication with the ACS 308.

Those skilled in the arts of electronic devices shall understand that the electrical contact region 310 may be used to facilitate electrical coupling to the ACS 308 because in some embodiments it may be difficult to make a direct contact to a lightly doped region. In addition, in some embodiments the ACS 308 and the electrical contact region 310 may be coextensive. In another embodiment, the electrical contact region 310 comprises an N+ region. In this embodiment, the electrical contact region 310 functions as a diode connection to the ACS 308, which prevents positive current flow into the ACS 308 (and also prevents positive current flow into the body 312) under particular bias conditions, as described below in more detail.

FIG. 3B is an alternative top view of the ACC SOI NMOSFET 300 of FIG. 3A, illustrating the ACC NMOSFET 300 without its gate contact 301, gate 302, and gate oxide being visible. This view allows the body 312 to be visible. FIG. 3B shows the coupling of the ACS 308 to one end of the body 312. In one embodiment, the body 312 and the ACS 308 comprise a combined P− region that may be produced by a single ion-implantation step. In another embodiment, the body 312 and ACS 308 comprise separate P− regions that are coupled together.

As is well known to those skilled in the electronic device design arts, in other embodiments, the ACC NMOSFET 300 of FIGS. 3A and 3B can be implemented as an ACC PMOSFET simply by reversing the dopant materials used to implement the various FET component regions (i.e., replace p-type dopant material with n-type dopant material, and vice versa). More specifically, in an ACC PMOSFET, the source and drain comprise P+ regions, and the body comprises an N− region. In this embodiment, the ACS 308 also comprises an N− region. In some embodiments of the ACC PMOSFET, the electrical contact region 310 may comprise an N+ region. In other embodiments of the ACC PMOSFETs, the region 310 comprises a P+ region, which functions as a diode connection to the ACS 308 and thereby prevents current flow into the ACS 308 under particular bias conditions.

Prior Art Body Contacts Distinguished from the Disclosed ACS

According to the present disclosure, the ACS 308 used to implement ACC SOI MOSFETs includes novel features in structure, function, operation and design that distinguish it from the so-called "body contacts" (also sometimes referred to as "body ties", usually when the "body contact" is directly connected to the source) that are well known in the prior art.

Exemplary references relating to body contacts used in prior art SOI MOSFETs include the following: (1) F. Hameau and O. Rozeau, Radio-Frequency Circuits Integration Using CMOS SOI 0.25 µm Technology," 2002 RF IC Design Workshop Europe, 19-22 Mar. 2002, Grenoble, France; (2) J. R. Cricci et al., "Silicon on Sapphire MOS Transistor," U.S. Pat. No. 4,053,916, Oct. 11, 1977; (3) O. Rozeau et al., "SOI Technologies Overview for Low-Power Low-Voltage Radio-Frequency Applications," Analog Integrated Circuits and Signal Processing, 25, pp. 93-114, Boston, Mass., Kluwer Academic Publishers, November 2000; (4) C. Tinella et al., "A High-Performance CMOS-SOI Antenna Switch for the 2.5-5-GHz Band," IEEE Journal of Solid-State Circuits, Vol. 38, No. 7, July, 2003; (5) H. Lee et al., "Analysis of body bias effect with PD-SOI for analog and RF applications," Solid State Electron., Vol. 46, pp. 1169-1176, 2002; (6) J.-H. Lee, et al., "Effect of Body Structure on Analog Performance of SOI NMOSFETs," Proceedings, 1998 IEEE International SOI Conference, 5-8 Oct. 1998, pp. 61-62; (7) C. F. Edwards, et al., The Effect of Body Contact Series Resistance on SOI CMOS Amplifier Stages," IEEE Transactions on Electron Devices, Vol. 44, No. 12, December 1997 pp. 2290-2294; (8) S. Maeda, et al., Substrate-bias Effect and Source-drain Breakdown Characteristics in Body-tied Short-channel SOI MOSFET's," IEEE Transactions on Electron Devices, Vol. 46, No. 1, January 1999 pp. 151-158; (9) F. Assaderaghi, et al., "Dynamic Threshold-voltage MOSFET (DTMOS) for Ultra-low Voltage VLSI," IEEE Transactions on Electron Devices, Vol. 44, No. 3, March 1997, pp. 414-422; (10) G. O. Workman and J. G. Fossum, "A Comparative Analysis of the Dynamic Behavior of BTG/SOI MOSFETs and Circuits with Distributed Body Resistance," IEEE Transactions on Electron Devices, Vol. 45, No. 10, October 1998 pp. 2138-2145; and (11) T.-S. Chao, et al., "High-voltage and High-temperature Applications of DTMOS with Reverse Schottky Barrier on Substrate Contacts," IEEE Electron Device Letters, Vol. 25, No. 2, February 2004, pp. 86-88.

As described herein, applications such as RF switch circuits, may use SOI MOSFETs operated with off-state bias voltages, for which accumulated charge may result. The SOI MOSFETs are defined herein as operating within the accumulated charge regime when the MOSFETs are biased in the off-state, and when carriers having opposite polarity to the channel carriers are present in the channel regions of the MOSFETs. In some embodiments, the SOI MOSFETs may operate within the accumulated charge regime when the MOSFETs are partially depleted yet still biased to operate in the off-state. Significant benefits in improving nonlinear effects on source-drain capacitance can be realized by removing or otherwise controlling the accumulated charge according to the present teachings. In contrast to the disclosed techniques, none of the cited prior art teach or suggest ACS methods and apparatuses that are uniquely useful for removing or controlling accumulated charge. Nor are they informed regarding problems caused by the accumulated charge such as nonlinear effects on the off-state source-drain capacitance $C_{off}$. Consequently, the prior art body contacts described in the references cited above differ greatly (in structure, function, operation and design) from the ACSs described with reference to FIGS. 3A-4D.

In one example, the ACS 308 operates effectively to remove or otherwise control the accumulated charge from the SOI NMOSFET 300 using a high impedance connection to and throughout the body 312. High impedance ACSs may be used because the accumulated charge 120 is primarily generated by phenomena (e.g., thermal generation) that take a relatively long period of time to produce significant accumulated charge. For example, a typical time period for producing non-negligible accumulated charge when the NMOSFET operates in the accumulated charge regime is approximately a few milliseconds or greater. Such relatively slow generation of accumulated charge corresponds to very low currents, typically less than 100 nA/mm of transistor width. Such low currents can be effectively conveyed even using very high impedance connections to the body. According to one example, the ACS 308 is implemented with a connection having a resistance of greater than $10^6$ ohms. Consequently, the ACS 308 is capable of effectively removing or otherwise controlling the accumulated charge 120 even when implemented with a relatively high impedance connection, relative to the low impedance prior art body contacts.

In stark contrast, the prior art teachings of body contacts described in the references cited above require low impedance (high efficiency) access to the body regions of SOI MOSFETs for proper operation (see, e.g., references (3), (6), and (7) above). A principal reason for this requirement is that the prior art body contacts are primarily directed to reducing the adverse effects on SOI MOSFET functions caused by much faster and more effective electron-hole pair generation processes than occur when the FET is operated in the accumulated charge regime. For example, in some prior art MOSFETs not operated in the accumulated charge regime, electron-hole pair carriers are generated as a result of impact ionization. Impact ionization produces electron-hole pairs at a much faster rate than occurs when the FET is operated in the accumulated charge regime.

The relative rates for electron-hole pair generation by impact ionization versus the pair generation processes causing accumulated charge can be estimated from the roll-off frequencies for the two phenomena. For example, reference (3) cited above indicates roll-off frequencies for impact ionization effects in the range of $10^5$ Hz. In contrast, a roll-off frequency for the accumulated charge effects has been observed to be in the range of $10^3$ Hz or less, as indicated by recovery times for odd harmonics. These observations indicate that the ACS 308 can effectively control accumulated charge using an impedance that is at least 100 times larger than required of prior art body contacts used in controlling impact ionization charge, for example. Further, because impact ionization primarily occurs when the SOI MOSFET operates in an on-state, the effects of impact ionization can be amplified by on-state transistor operation. Low impedance body contacts to and throughout a body region is even more critical in these environments in order to control the effects of impact ionization under the on-state conditions.

In stark contrast, the ACS 308 of the present teachings removes or otherwise controls the accumulated charge only when the ACC SOI MOSFET operates in the accumulated charge regime. By definition, the FET is in the off-state in this regime, so there is no requirement to remove impact ionization as amplified by an on-state FET. Therefore, a high impedance ACS 308 is perfectly adequate for removing the accumulated charge under these operating conditions. The prior art requirements for low impedance body connections results in numerous problems of implementation that are overcome by the present teachings, as described below in more detail.

In addition, the ACS 308 may be implemented with much lower source-to-drain parasitic capacitance as compared to the body contacts of the prior art. The above-described low impedance connection to the SOI MOSFET body required of the prior art body contacts necessitates proximity of the contacts to the entire body. This may require a plurality body contact "fingers" that contact the body at different locations along the body. The low impedance connection to the body also necessitates proximity of the prior art body contacts to the source and drain. Because of parasitic capacitances produced by such body contacts, the cited prior art references teach away from the use of such structures for many high frequency applications such as RF. In stark contrast, the ACS 308 of the present disclosure may be positioned a selected distance away from the source 304 and the drain 306, and the ACS 308 may also be coupled to the body 312 at a first distal end of the body 312 (shown in FIGS. 3A and 3B). Arranged in this manner, the ACS 308 makes minimal contact (as compared to the prior art body contacts that may contact the body at many locations along the body) with the body 312. This configuration of the ACS 308 with the MOSFET eliminates or greatly reduces the parasitic capacitances caused by a more proximate positioning of the ACS 308 relative to the source, drain, and body. Further, the ACS 308 may be implemented in SOI MOSFETs operated with a depleted channel. In general, the cited prior art references teach away from the use of body contacts for this environment (see, e.g., reference (3), cited above).

Further, because impact ionization hole currents are much larger (in the range of 5,000 nA per mm body width) than for accumulated charge generation (less than approximately 100 nA per mm body width), the prior art does not teach how to effectively implement very large body widths (i.e., much greater than approximately 10 µm). In contrast, the ACS 308 of the present disclosed device may be implemented in SOI MOSFETs having relatively large body widths. This provides improvements in on-state conductance and transconductance, insertion loss and fabrication costs, particularly for RF switch devices. According to the prior art teachings cited above, larger body widths adversely affect the efficient operation of body contacts because their impedances are necessarily thereby increased. Although the cited prior art suggests that a plurality of fingers may be used to contact the body at different locations, the plurality of fingers adversely affects parasitic source-to-drain capacitances, as described above.

For these reasons, and for the reasons described below in more detail, the present disclosure provides novel MOSFET devices, circuits and methods that overcome the limitations according to the prior art teachings as cited above.

Figure 3D:
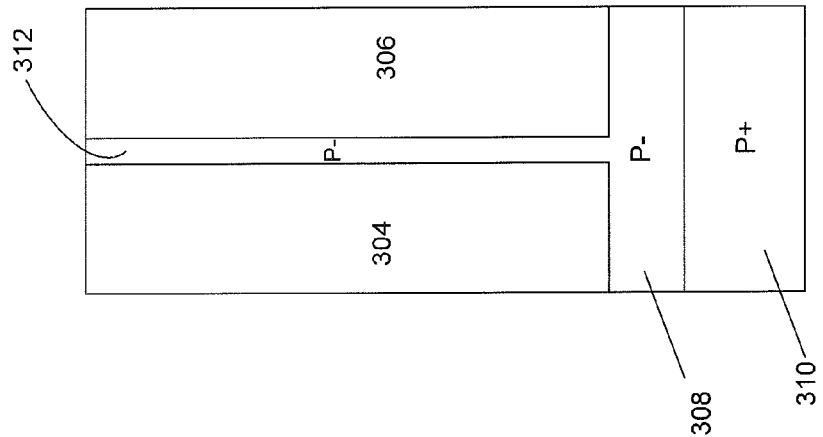
FIG. 3D is a simplified top view schematic of an improved SOI NMOSFET adapted to control accumulated charge having an accumulated charge sink (ACS) electrically coupled to a P+ region.
Figure 3C:
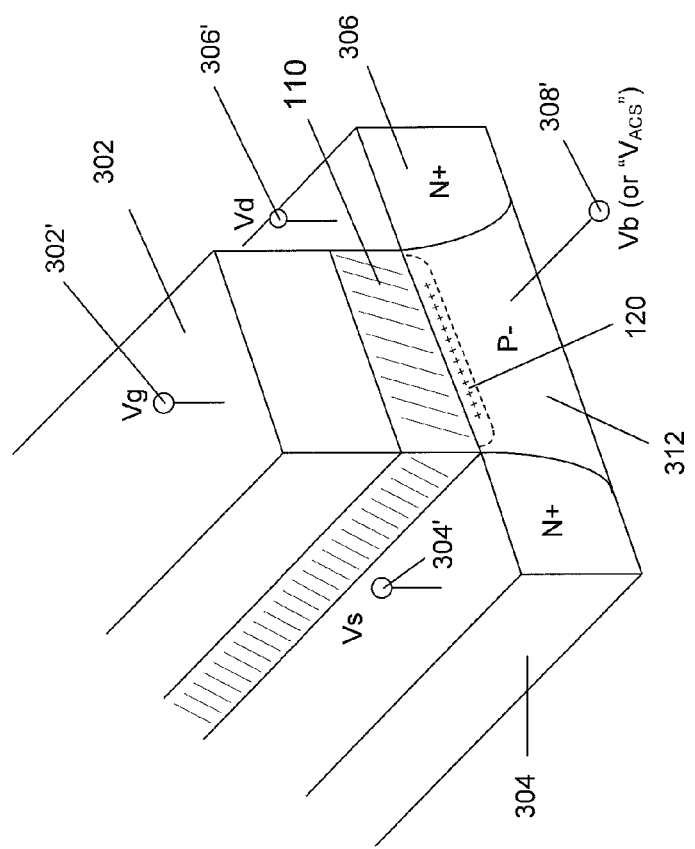
FIG. 3C is a cross-sectional perspective schematic of an improved SOI NMOSFET adapted to control accumulated charge showing gate, source, drain and accumulated charge sink (ACS) terminals.

FIG. 3C is a cross-sectional perspective schematic of an ACC SOI NMOSFET 300' adapted to control accumulated charge in accordance with the disclosed method and apparatus. In the example shown in FIG. 3C, the ACC NMOSFET 300' includes four terminals that provide electrical connection to the various FET component regions. In one embodiment, the terminals provide means for connecting external integrated circuit (IC) elements (such as metal leads, not shown) to the various FET component regions. Three of the terminals shown in FIG. 3C are typically available in prior art FET devices. For example, as shown in FIG. 3C, the ACC NMOSFET 300' includes a gate terminal 302' that provides electrical connection to the gate 302. Similarly, the ACC NMOSFET 300' includes source and drain terminals 304', 306' that provide electrical connection to the source 304 and drain 306, respectively. As is well known in the electronic design arts, the terminals are coupled to their respective FET component regions (i.e., gate, drain and source) via so-called "ohmic" (i.e., low resistance) contact regions. The manufacturing and structural details associated with the coupling of the various FET terminals to the FET component regions are well known in the art, and therefore are not described in more detail here.

As described above with reference to FIGS. 3A and 3B, the ACC NMOSFET 300' is adapted to control accumulated charge when the NMOSFET operates in the accumulated charge regime. To this end, in the exemplary embodiment shown in FIG. 3C, the ACC NMOSFET 300' includes a fourth terminal that provides electrical connection to the body 312, and thereby facilitates reduction (or other control) of the accumulated charge when the FET 300' operates in the accumulated charge regime. More specifically, and referring again to FIG. 3C, the ACC NMOSFET includes a "body" terminal, or Accumulated Charge Sink (ACS) terminal 308'. The ACS terminal 308' provides an electrical connection to the ACS 308 (not shown in FIG. 3C, but shown in FIGS. 3A and 3B) and to the body 312. Although the ACS terminal 308' is shown in FIG. 3C as being physically coupled to the body 312, those skilled in the electronic design arts shall understand that this depiction is for illustrative purposes only. The direct coupling of the ACS terminal 308' to the body 312 shown in FIG. 3C illustrates the electrical connectivity (i.e., not the physical coupling) of the terminal 308' with the body 312. Similarly, the other terminals (i.e., terminals 302', 304' and 306') are also shown in FIG. 3C as being physically coupled to their respective FET component regions. These depictions are also for illustrative purposes only.

In most embodiments, as described above with reference to FIGS. 3A-3B, and described further below with reference to FIGS. 3D-3K, the ACS terminal 308' provides the electrical connection to the body 312 via coupling to the ACS 308 via the electrical contact region 310. However, the present disclosure also contemplates embodiments where the coupling of the ACS terminal 308' is made directly to the body 312 (i.e., no intermediate regions exist between the ACS terminal 308' and the body 312).

In accordance with the disclosed method and apparatus, when the ACC NMOSFET 300' is biased to operate in the accumulated charge regime (i.e., when the ACC NMOSFET 300' is in the off-state, and there is an accumulated charge 120 of P polarity (i.e., holes) present in the channel region of the body 312), the accumulated charge is removed or otherwise controlled via the ACS terminal 308'. When accumulated charge 120 is present in the body 312, the charge 312 can be removed or otherwise controlled by applying a bias voltage ($V_b$ (for "body") or $V_{ACS}$ (ACS bias voltage)) to the ACS terminal 308'. In general, the ACS bias voltage $V_{ACS}$ applied to the ACS terminal 308' may be selected to be equal to or more negative than the lesser of the source bias voltage Vs and drain bias voltage Vd. More specifically, in some embodiments, the ACS terminal 308' can be coupled to various accumulated charge sinking mechanisms that remove (or "sink") the accumulated charge when the FET operates in the accumulated charge regime. Several exemplary accumulated charge sinking mechanisms and circuit configurations are described below with reference to FIGS. 4A-5D.

Similar to the prior art NMOSFET 100 described above with reference to FIG. 1, the ACC SOI NMOSFET 300' of FIG. 3C can be biased to operate in the accumulated charge regime by applying specific bias voltages to the various terminals 302', 304', and 306'. In one exemplary embodiment, the source and drain bias voltages (Vs and Vd, respectively) are zero (i.e., the terminals 304' and 306' are connected to ground). In this example, if the gate bias voltage (Vg) applied to the gate terminal 302' is sufficiently negative with respect to the source and drain bias voltages, and with respect to $V_{th}$ (for example, if $V_{th}$ is approximately zero, and if Vg is more negative than approximately −1 V), the ACC NMOSFET 300' operates in the off-state. If the ACC NMOSFET 300' continues to be biased in the off-state, the accumulated charge (holes) will accumulate in the body 312. Advantageously, the accumulated charge can be removed from the body 312 via the ACS terminal 308'. In some embodiments, as described below in more detail with reference to FIG. 4B, the ACS terminal 308' is coupled to the gate terminal 302' (thereby ensuring that the same bias voltages are applied to both the gate (Vg) and the body (shown in FIG. 3C as "Vb" or "$V_{ACS}$").

However, those skilled in the electronics design arts shall appreciate that a myriad of bias voltages can be applied to the four device terminals while still employing the techniques of the present disclosed method and apparatus. As long as the ACC SOI NMOSFET 300' is biased to operate in the accumulated charge regime, the accumulated charge can be removed or otherwise controlled by applying a bias voltage $V_{ACS}$ to the ACS terminal 308', and thereby remove the accumulated charge from the body 312.

For example, in one embodiment wherein the ACC NMOSFET 300' comprises a depletion mode device, $V_{th}$ is negative by definition. In this embodiment if both the Vs and Vd bias voltages comprise zero volts (i.e., both terminals tied to circuit ground node), and a gate bias Vg applied to the gate terminal 302' is sufficiently negative to $V_{th}$ (for example, Vg is more negative than approximately −1 V relative to $V_{th}$), holes may accumulate under the gate oxide 110 thereby becoming the accumulated charge 120. In this example, in order to remove the accumulated holes (i.e., the accumulated charge 120) from the FET body 312, the voltage $V_{ACS}$ applied to the ACS 308 may be selected to be equal to or more negative than the lesser of Vs and Vd.

In other examples, the source and drain bias voltages, Vs and Vd, respectively, may comprise voltage other than zero volts. According to these embodiments, the gate bias voltage Vg must be sufficiently negative to both Vs and Vd (in order for Vg to be sufficiently negative to $V_{th}$, for example) in order to bias the NMOSFET in the off-state. As described above, if the NMOSFET is biased in the off-state for a sufficiently long time period (approximately 1-2 ms, for example) an accumulated charge will accumulate under the gate oxide. In these embodiments, as noted above, in order to remove the accumulated charge 120 from the body 312, the ACS bias voltage $V_{ACS}$ applied to the ACS terminal 308' may be selected to be equal to or more negative than the lesser of Vs and Vd.

It should be noted that, in contrast to the examples described above, the prior art body contacts are implemented largely for purposes of mitigating the adverse effects caused by impact ionization. Consequently, the prior art body contacts are typically tied to the source of the MOSFET. In order to effectively control, reduce, or entirely remove the accumulated charge in an NMOSFET, $V_{ACS}$ should, in the exemplary embodiments, be equal to or more negative than the lesser of Vs and Vd. Those skilled in the electronic device design arts shall appreciate that different Vs, Vd, Vg and $V_{ACS}$ bias voltages may be used when the ACC MOSFET comprises a PMOSFET device. Because the prior art body contacts are typically tied to the source, this implementation cannot be effected using the prior art body contact approach.

FIG. 3D is a simplified schematic diagram of a top view of an ACC SOI NMOSFET 300" adapted to control accumulated charge 120 (FIG. 1) in accordance with the present disclosure. FIG. 3D shows the ACC NMOSFET 300" without its gate contact 301, gate 302, and gate oxide being visible. The ACC NMOSFET 300" of FIG. 3D is very similar in design to the ACC NMOSFET 300 described above with reference to FIGS. 3A and 3B. For example, similar to the ACC NMOSFET 300, the ACC NMOSFET 300" includes a source 304 and drain 306 comprising N+ regions. The ACC NMOSFET 300" also includes an accumulated charge sink (ACS) 308 comprising a P− region. As shown in FIG. 3D, the P-region that comprises the ACS 308 abuts (i.e., is directly adjacent) the body 312, which also comprises a P− region. Similar to the ACC NMOSFET 300, the ACC NMOSFET 300" includes an electrical contact region 310 that provides electrical connection to the ACS 308. As noted above, in some embodiments, the electrical contact region 310 comprises a P+ region. In another embodiment, the electrical contact region 310 may comprise an N+ region (which thereby prevents positive current flow into the body 312 as noted above).

As shown in FIG. 3D, the electrical contact region 310 is formed in the ACC NMOSFET 300" directly adjacent the ACS 308. The ACC SOI NMOSFET 300" functions to control accumulated charge similarly to the operation of the ACC NMOSFETs described above with reference to FIGS. 3A-3C.

Figure 3E:
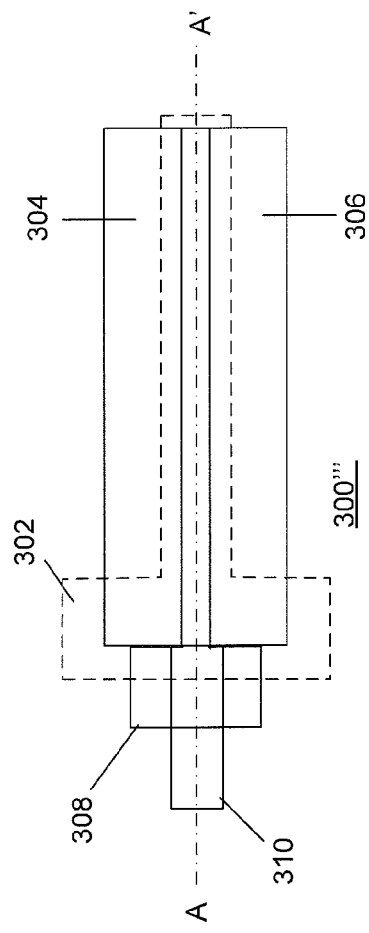
FIG. 3E is a simplified top view schematic of an improved SOI NMOSFET adapted to control accumulated charge and showing a cross-sectional view line A-A' taken along approximately a center of the SOI NMOSFET.

FIG. 3E is a simplified schematic diagram of a top view of an ACC SOI NMOSFET 300''' adapted to control accumulated charge in accordance with the present disclosure. The ACC NMOSFET 300''' is very similar in design and function to the ACC NMOSFETs described above with reference to FIGS. 3A-3D. FIG. 3E shows a dashed cross-sectional view line A-A' taken along the approximate center of the NMOSFET 300'''. This cross-sectional view is used herein to describe structural and performance characteristics of some exemplary prior art MOSFETS and some embodiments of the ACC NMOSFET that may occur as a result of the fabrication processes. Details of this cross-sectional view A-A' are now described with reference to FIG. 3F.

View line A-A' slices through the following component regions of the ACC NMOSFET 300''': the P+ electrical contact region 310, the ACS 308 (shown in FIG. 3E, but not shown in FIG. 3F), a P+ overlap region 310', a gate oxide 110, and a poly-silicon gate 302. In some embodiments, during the fabrication process, when the region 310 is doped with p-type dopant material, proximate the P– body region, some additional P+ doping may be implanted (i.e., the p-type dopant material may overlap) into the P+ overlap region 310' of the poly-silicon gate 302. In some embodiments, such overlapping is performed intentionally to ensure that all of the gate oxide 110 is completely covered by the P+ region (i.e., to ensure that no gap exists on the edge of the oxide 110 between the gate 302 and the P+ region 310). This, in turn, aids in providing a minimum impedance connection between the P+ region 310 and the body 312.

Figure 3F:
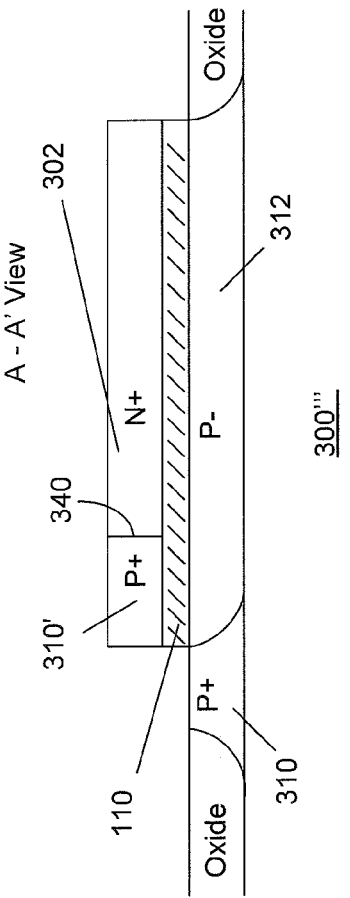
FIG. 3F is a cross-sectional view of the improved SOI NMOSET of FIG. 3E taken along the A-A' view line of FIG. 3E.

Although the present teachings encompass such embodiments described above, those skilled in the electronic device design and manufacturing arts shall recognize that such low-resistance connections are not required. Therefore, disadvantages associated with the embodiment shown in FIG. 3H, as described below in more detail, can be overcome by using other embodiments described herein (for example, the embodiments 300 and 300'''' described below with reference to FIGS. 3G and 3J, respectively), in which gaps are intentionally implemented between the P+ region 310 and the body 312. In one exemplary embodiment, the P+ overlap region 310' overlaps the oxide 110 by approximately 0.2-0.7 microns. Those skilled in the MOSFET design and manufacturing arts shall appreciate that other overlap region dimensions can be used in practicing the present disclosed method and apparatus. In some embodiments, as shown in FIG. 3F, for example, the remaining area over the gate oxide 110 and over the P– body is doped with n-type dopant material (i.e., it comprises an N+ region).

Referring again to FIG. 3F, owing to the presence of the P+ overlap region 310' over the gate oxide 110, over the body 312, and proximate an edge 340 of the poly-silicon gate 302, an increased threshold voltage region is created in the NMOSFET 300'''. More specifically, due to the P+ doping (in the P+ overlap region 310') proximate the edge 340 of the gate 302 over the channel region of the body 312, a region of increased threshold voltage is formed in that region of the MOSFET 300'''. The effects of the region of increased threshold voltage are now described in more detail with reference to FIGS. 3H and 3I.

FIG. 3I shows a plot 380 of inversion channel charge versus applied gate voltage for an ACC NMOSFET. The plot 380 shown in FIG. 3I illustrates one effect of the above-described increased threshold voltage that can occur in prior art MOSFETs, and in some embodiments of the present ACC NMOSFETs due to certain manufacturing processes. As described in more detail below, the increased threshold voltage region, shown in FIG. 3H and described in more detail below, also occurs in prior art MOSFET designs due to the proximity of body ties to the FET body. As described below in more detail with reference to FIG. 3J, for example, the present disclosed method and apparatus can be used to reduce or eliminate the region of increased threshold voltage found in some prior art SOI MOSFET designs.

Figure 3G:
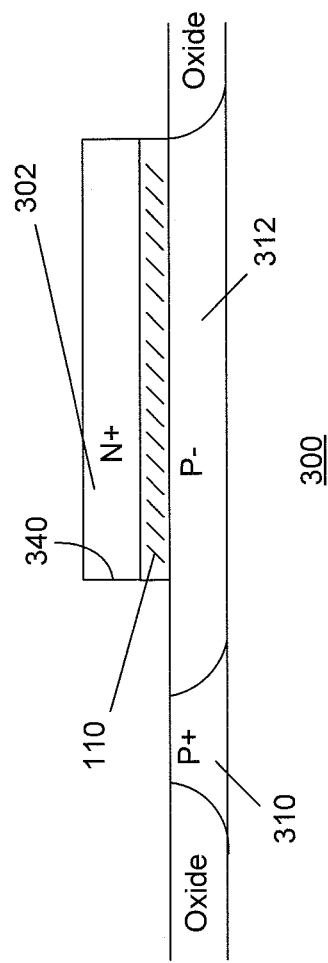
FIG. 3G is a cross-sectional view of the improved SOI NMOSET of FIGS. 3A-3B.
Figure 3H:
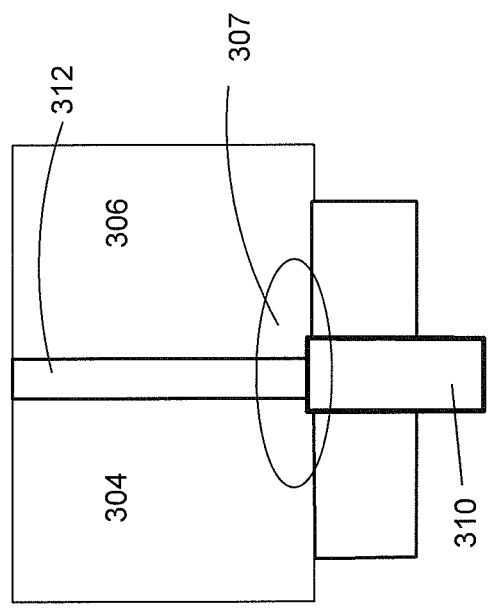
FIG. 3H is a simplified top view schematic of an SOI NMOSFET illustrating a region of increased threshold voltage that can occur in prior art MOSFETs and in some embodiments of the improved SOI MOSFET due to manufacturing processes.
Figure 31:
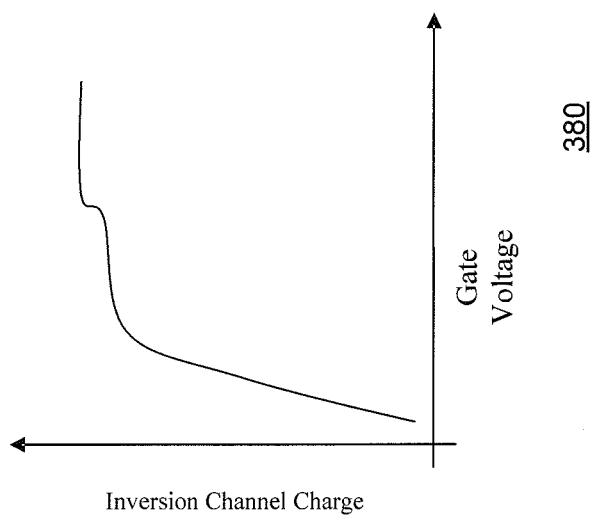

FIG. 3H shows one embodiment of an ACC NMOSFET without its gate contact, gate, and gate oxide being visible. The MOSFET region of increased threshold voltage described above with reference to FIGS. 3E and 3F is shown in FIG. 3H as occurring in the region encompassed by the ellipse 307. As will be well understood by those skilled in the electronic design and manufacturing arts, for the reasons set forth above with reference to FIGS. 3E and 3F, due to the increased threshold voltage, the region 307 of the ACC MOSFET shown in FIG. 3H effectively "turns on" after the rest of the ACC MOSFET channel region.

The increased threshold voltage can be reduced by reducing the size of the region 307. Eliminating the region 307 altogether eliminates the threshold voltage increase. Because the threshold voltage increase can increase harmonic and intermodulation distortion of the "on" state MOSFET, eliminating this effect improves MOSFET performance. The increased threshold voltage also has the detrimental effect of increasing the MOSFET on-resistance (i.e., the resistance presented by the MOSFET when it is in the on-state (conducting state), which detrimentally impacts the MOSFET insertion loss.

In one exemplary embodiment, as shown, for example in the embodiments of the ACC NMOSFET 300 described above with reference to FIGS. 3A and 3B, and as described below in more detail with reference to the cross-sectional view of the ACC MOSFET 300 of FIG. 3G, the detrimental effects associated with threshold voltage increase are mitigated or overcome by positioning the P+ region 310 a selected distance away from an edge of the poly-silicon gate 302. This approach is shown both in the top view of the ACC MOSFET 300 of FIG. 3A, and in the cross-sectional view of the ACC MOSFET 300 shown in FIG. 3G. As shown in the cross-sectional view of the ACC MOSFET 300 of FIG. 3G, the P+ region 310 does not extend all the way to the edge 340 of the poly-silicon gate 302. This is in stark contrast to the embodiment 300''' shown in FIG. 3F, where the P+ region 310' extends all the way to the gate edge 340. By positioning the P+ region 310 a distance away from the gate edge 340 as shown in the embodiment 300 of FIG. 3G, no P+ region is positioned proximate the poly-silicon gate 302 (i.e., there is no P+ region present in the poly-silicon gate 302).

This configuration of the P+ region 310 eliminates or greatly reduces the problems associated with threshold voltage increase as described above. As described above with reference to FIGS. 3A and 3B, and with reference to the comparisons to the prior art body contact references, the relatively high impedance of the ACS 308 P– region (shown in FIG. 3A) between the P+ region 310 and the gate 302 does not adversely affect the performance of the ACC NMOSFET 300. As described above, the accumulated charge can be effectively removed even using a relatively high impedance ACS connection.

In another exemplary embodiment, as described below with reference to FIG. 3J, the threshold voltage increase is removed by positioning the P+ region 310 (and the ACS 308)

a distance away from the body 312. Because the electrical connectivity between the ACS 308 and the body 312 has relatively high impedance when the small region of P+ 310 is positioned a distance away from the body 312, this approach is never taught or suggested by the body contact prior art references (which require low impedance contacts as described above). This improved embodiment is described next with reference to FIG. 3J.

FIG. 3J is a simplified top view schematic of another embodiment of an ACC SOI NMOSFET 300'''' adapted to control accumulated charge and configured in a "T-gate" configuration. FIG. 3J shows the ACC NMOSFET 300'''' without its gate contact 301, gate 302, and gate oxide being visible. The gate (not shown in FIG. 3J) and the body 312 are configured as "supporting" members of the "T-gate" configured ACC MOSFET 300'''' (i.e., they comprise the "bottom" portion of the "T-shaped" FET). These "supporting" members "support" the "supported" member of the T-gate configured MOSFET 300'''', which comprises the ACS 308 as shown in FIG. 3J (i.e., the ACS 308 comprises the "top" portion of the "T-shaped" FET). As shown in FIG. 3J, the ACC NMOSFET 300'''' includes a small P+ region 310 conjoined to an ACS 308. As shown in FIG. 3J, the P+ region 310 (and thus the ACS external electrical connection) is disposed a selected distance away from the body 312. The total impedance of the electrical connection from the body 312, through the ACS 308, and to the P+ region 310 is increased by positioning the P+ region 310 a selected distance away from the body 312. However, as described above, the present ACC NMOSFET 300'''' works perfectly well to remove accumulated charge even using relatively high impedance ACS connections. For the reasons described above with reference to FIGS. 3A and 3B, due to the nature of the accumulated charge when the NMOSFET 300'''' operates in the accumulated charge regime, the ACC NMOSFET 300'' does not require low impedance ACS electrical connections in order to remove accumulated charge from the body 312. Rather, an ACS connection of relatively large impedance may be used in practicing the present teachings, with corresponding improvements in NMOSFET performance as described above (e.g., reductions in parasitic capacitance as compared with prior art low impedance body contacts). However, in other embodiments, if desired, a low impedance ACS connection may be used to practice the disclosed method and apparatus for use in improving linearity characteristics of SOI MOSFETs.

Moreover, as described above with reference to FIG. 3H, the embodiment of FIG. 3J improves device performance owing to the fact that the small P+ region 310 is positioned a distance away from the body 312. Because the small P+ region 310 is positioned a distance away from the body 312, the threshold voltage increase is reduced or entirely eliminated, together with the consequent adverse performance effects described above.

FIG. 3K is a simplified top view schematic of another embodiment of an ACC SOI NMOSFET 300'''' adapted to control accumulated charge and configured in an "H-gate" configuration. FIG. 3K shows the ACC NMOSFET 300'''' without its gate contact 301, gate 302, and gate oxide being visible. With the exception of some structural differences described herein, the ACC NMOSFET 300'''' is very similar in design and function to the ACC NMOSFETs described above with reference to FIGS. 3A-3D and 3J. As shown in FIG. 3K, the ACC NMOSFET 300'''' includes two ACSs, 308 and 308'', disposed at opposite ends of the H-gate ACC NMOSFET 300''''. P+ regions 310 and 310'' are formed to abut their respective ACSs, 308 and 308'', and provide electrical contact thereto. In accordance with the disclosed method and apparatus, as described above, when the ACC NMOSFET 300'''' is biased to operate in the accumulated charge regime, the accumulated charge is removed or otherwise controlled via the two ACSs 308 and 308''.

It shall be understood by those skilled in the electronic device design arts that although the illustrated embodiment shows the ACSs 308 and 308'' extending approximately the entire width of the ACC NMOSFET 300'''', the ACSs 308 and 308'' may also comprise much narrower (or wider) regions, and still function perfectly well to remove or otherwise control the accumulated charge. Also, in some embodiments, it is not necessary that the impedance of the ACS 308 matches the impedance of the ACS 308''. It will further be understood by the skilled person that the ACSs 308 and 308'' may comprise different sizes and configurations (i.e., rectangular, square, or any other convenient shape), and may also be positioned at various distances away from the body 312 (i.e., not necessarily the same distance away from the body 312). As described above with reference to FIG. 3J, when the ACS 308 is positioned a selected distance away from the body 312, the problems associated with threshold voltage increase are reduced or eliminated.

Four-Terminal ACC MOSFET Devices—Simple Circuit Configurations

The SOI NMOSFET 300 of FIGS. 3A and 3B may be implemented as a four terminal device, as illustrated schematically in FIG. 4A. As shown in the improved ACC SOI NMOSFET 300 of FIG. 4A, a gate terminal 402 is electrically coupled to the gate contact 301 (e.g., FIG. 3A) and is analogous to the gate terminal 30T shown in FIG. 3C. The gate contact 301 is electrically coupled to the gate 302 (e.g., FIGS. 3A and 3C). Similarly, a source terminal 404 is electrically coupled to the source 304 (e.g., FIGS. 3A-3C) and is analogous to the source terminal 304' of FIG. 3C. Similarly, a drain terminal 406 is electrically coupled to the drain 306 (e.g., FIGS. 3A-3C) and is analogous to the drain terminal 306' of FIG. 3C. Finally, the ACC NMOSFET 300 includes an ACS terminal 408 that is electrically coupled to the ACS 308 (e.g., see FIGS. 3A-3B, and FIGS. 3D, 3J-3K) via the region 310. Those skilled in the electronic design and manufacturing arts shall understand that the region 310 may be used in some embodiments to facilitate electrical coupling to the ACS 308 because, in some embodiments, it may be difficult to make a direct contact to a lightly doped region (i.e., the ACS 308). The ACS terminal 408 is analogous to the ACS terminal 308' shown in FIG. 3C.

Figure 4B:
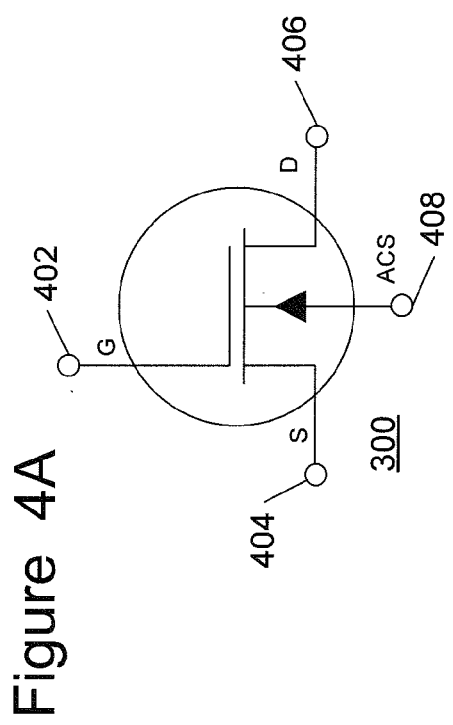
FIG. 4B is a simplified schematic of an improved SOI NMOSFET adapted to control accumulated charge, embodied as a four terminal device, wherein an accumulated charge sink (ACS) terminal is coupled to a gate terminal.

The ACC SOI NMOSFET 300 of FIG. 4A may be operated using various techniques and implemented in various circuits in order to control accumulated charge present in the FET when it is operating in an accumulated charge regime. For example, in one exemplary embodiment as shown in FIG. 4B, the gate and ACS terminals, 402 and 408, respectively, are electrically coupled together. In one embodiment of the simplified circuit shown in FIG. 4B, the source and drain bias voltages applied to the terminals 404 and 406, respectively, may be zero. If the gate bias voltage (Vg) applied to the gate terminal 402 is sufficiently negative with respect to the source and drain bias voltages applied to the terminals 404 and 406, and with respect to the threshold voltage $V_{th}$, (for example, if $V_{th}$ is approximately zero, and if Vg is more negative than approximately −1 V) the ACC NMOSFET 300 operates in the accumulated charge regime. As described above with reference to FIG. 3C, for example, when the MOSFET operates in this regime, accumulated charge (holes) may accumulate in the body of the NMOSFET 300.

Advantageously, the accumulated charge can be removed via the ACS terminal 408 by connecting the ACS terminal 408 to the gate terminal 402 as shown. This configuration ensures that when the FET 300 is in the off-state, it is held in the correct bias region to effectively remove or otherwise control the accumulated charge. As shown in FIG. 4B, connecting the ACS terminal 408 to the gate ensures that the same bias voltages are applied to both the gate (Vg) and the body (shown in FIG. 3C as "Vb" or "$V_{ACS}$"). Because the bias voltage $V_{ACS}$ is the same as the gate voltage Vg in this embodiment, the accumulated charge is no longer trapped below the gate oxide (by attraction to the gate bias Vg) because it is conveyed to the gate terminal 402 via the ACS terminal 408. The accumulated charge is thereby removed from the body via the ACS terminal 408.

In other exemplary embodiments, as described above with reference to FIG. 3C, for example, Vs and Vd may comprise nonzero bias voltages. According to these examples, Vg must be sufficiently negative to both Vs and Vd in order for Vg to be sufficiently negative to $V_{th}$ to turn the NMOSFET 300 off (i.e., operate the NMOSFET 300 in the off-state). When so biased, as described above, the NMOSFET 300 may enter the accumulated charge regime and thereby have accumulated charge present in the body. For this example, the voltage $V_{ACS}$ may also be selected to be equal to Vg by connecting the ACS terminal 408 to the gate terminal 402, thereby conveying the accumulated charge from the body of the ACC NMOSFET, as described above.

In another exemplary embodiment, as described above, the ACC NMOSFET 300 comprises a depletion mode device. In this embodiment, the threshold voltage, $V_{th}$, is, by definition, less than zero. For Vs and Vd both at zero volts, when a gate bias Vg sufficiently negative to $V_{th}$ is applied to the gate terminal 402 (for example, Vg more negative than approximately −1 V relative to $V_{th}$), holes may accumulate under the gate oxide and thereby comprise an accumulated charge. For this example, the voltage $V_{ACS}$ may also be selected to be equal to Vg by connecting the ACS terminal 408 to the gate terminal 402, thereby conveying the accumulated charge from the ACC NMOSFET as described above.

In some embodiments of the improved ACC SOI NMOSFET 300, such as that described above with reference to FIG. 4B, when the FET is biased on, diodes formed at the edge of the device (such as described above with reference to the interface between the ACS 308 and the drain 304 (and the source 306) as shown in FIG. 3D) may become forward biased thereby allowing current to flow into the source and drain regions. In addition to wasting power, this may introduce nonlinearity into the NMOSFET. The nonlinearity results because the current that flows as a result of the forward biased interface diodes comprises nonlinear current. As Vgs and Vgd are reduced in that region of the device, the on resistance Ron at the edge of the device is increased. As is well known, and for the reasons set forth above, if the interface diodes formed at the edge of the device become forward biased, the device on-state characteristics are consequently dramatically adversely affected. Those skilled in the electronic device design arts shall understand that the configuration shown in FIG. 4B limits application of a gate bias voltage Vgs to approximately 0.7 Volts. The simplified circuit shown in FIG. 4C can be used to overcome these problems.

Figure 4C:
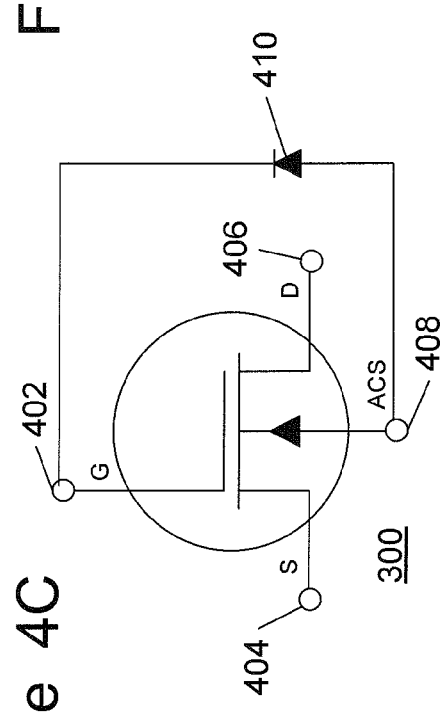
FIG. 4C is a simplified schematic of an improved SOI NMOSFET adapted to control accumulated charge, embodied as a four terminal device, wherein an accumulated charge sink (ACS) terminal is coupled to a gate terminal via a diode.

Another exemplary simplified circuit using the improved ACC SOI NMOSFET 300 is shown in FIG. 4C. As shown in FIG. 4C, in this embodiment, the ACS terminal 408 may be electrically coupled to a diode 410, and the diode 410 may, in turn, be coupled to the gate terminal 402. This embodiment may be used to prevent a positive current flow into the MOSFET body 312 caused by a positive Vg-to-Vs (or, equivalently, Vgs, where Vgs=Vg−Vs) bias voltage, as may occur, for example, when the SOI NMOSFET 300 is biased into an on-state condition.

As with the device shown in FIG. 4B, when biased off, the ACS terminal voltage $V_{ACS}$ comprises the gate voltage plus a voltage drop across the diode 410. At very low ACS terminal current levels, the voltage drop across the diode 410 typically also is very low (e.g., <<500 mV, for example, for a typical threshold diode). The voltage drop across the diode 410 can be reduced to approximately zero by using other diodes, such as a 0Vf diode, for example. In one embodiment, reducing the voltage drop across the diode is achieved by increasing the diode 410 width. Additionally, maintaining the ACS-to-source or ACS-to-drain voltage (whichever bias voltage of the two bias voltages is lower) increasingly negative, also improves the linearity of the ACC MOSFET device 300.

When the SOI NMOSFET 300 is biased in an on condition, the diode 410 is reverse-biased, thereby preventing the flow of positive current into the source and drain regions. The reverse-biased configuration reduces power consumption and improves linearity of the device. The circuit shown in FIG. 4C therefore works well to remove accumulated charge from the ACC MOSFET body when the FET is in the off-state and is operated in the accumulated charge regime. It also permits almost any positive voltage to be applied to the gate voltage Vg. This, in turn, allows the ACC MOSFET to effectively remove accumulated charge when the device operates in the off-state, yet assume the characteristics of a floating body device when the device operates in the on-state.

With the exception of the diode 410 used to prevent the flow of positive current into the ACS terminal 408, exemplary operation of the simplified circuit shown in FIG. 4C is the same as the operation of the circuit described above with reference to FIG. 4B.

Figure 4D:
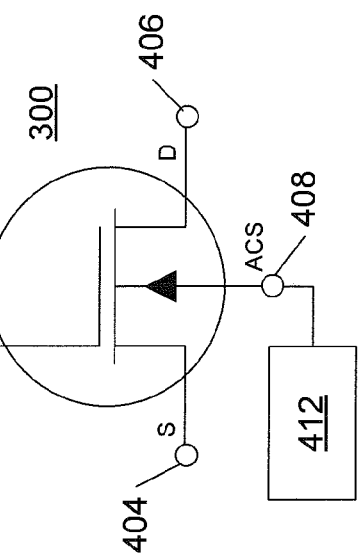
FIG. 4D is a simplified schematic of an improved SOI NMOSFET adapted to control accumulated charge, embodied as a four terminal device, wherein an accumulated charge sink (ACS) terminal is coupled to a control circuit.

In yet another embodiment, the ACS terminal 408 may be coupled to a control circuit 412 as illustrated in the simplified circuit of FIG. 4D. The control circuit 412 may provide a selectable ACS bias voltage $V_{ACS}$ that selectively controls the accumulated charge (i.e., the accumulated charge 120 described above with reference to FIG. 1). As shown in FIG. 4D, rather than having a local circuit provide the ACS bias voltage $V_{ACS}$ (e.g., as derived from the gate voltage Vg), in some embodiments the ACS bias voltage $V_{ACS}$ is produced by a separate source that is independent of the ACC MOSFET device 300. In the case of a switch (as described below in more detail with reference to FIG. 4E), the ACS bias voltage $V_{ACS}$ should be driven from a source having a high output impedance. For example, such a high output impedance source can be obtained using a large series resistor in order to ensure that the RF voltage is divided across the MOSFET and that the ACS bias voltage $V_{ACS}$ has Vds/2 "riding" on it, similarly to the gate voltage. This approach is described in more detail below with reference to FIG. 4E.

It may be desirable to provide a negative ACS bias voltage $V_{ACS}$ to the ACS terminal 408 when the SOI NMOSFET 300 is biased into an accumulated charge regime. In this exemplary embodiment, the control circuit 412 may prevent positive current flow into the ACS terminal 408 by selectively maintaining an ACS bias voltage $V_{ACS}$ that is consistently negative with respect to both the source and drain bias voltages. In particular, the control circuit 412 may be used to apply an ACS bias voltage that is equal to or more negative than the lesser of Vs and Vd. By application of such an ACS bias voltage, the accumulated charge is thereby removed or otherwise controlled.

In the exemplary embodiment of the simplified circuit shown in FIG. 4D, the source and drain bias voltages applied to the terminals 404 and 406, respectively, may be zero. If the gate bias voltage (Vg) applied to the gate terminal 402 is sufficiently negative with respect to the source and drain bias voltages applied to the terminals 404 and 406, and with respect to $V_{th}$, (for example, if $V_{th}$ is approximately zero, and if Vg is more negative than approximately −1 V) the ACC NMOSFET 300 operates in the accumulated charge regime, and the accumulated charge (holes) may accumulate in the body of the ACC NMOSFET 300. Advantageously, the accumulated charge can be removed via the ACS terminal 408 by connecting the ACS terminal 408 to the control circuit 412 as shown. In order to ensure that the accumulated charge is conveyed from the body of the ACC NMOSFET 300, the ACS bias voltage $V_{ACS}$ that is applied to the ACS terminal 408 should be equal to or more negative than the gate voltage and more negative than the lesser of Vs and Vd. Because the accumulated charge 120 is conveyed to the bias voltage $V_{ACS}$ applied to the ACS terminal 408 by the control circuit 412, the accumulated charge does not remain trapped under the gate oxide due to attraction to the gate bias voltage Vg.

In other embodiments, Vs and Vd may comprise bias voltages that are other than zero. According to these examples, Vg must be sufficiently negative to both Vs and Vd in order for Vg to be sufficiently negative to $V_{th}$, in order to bias the NMOSFET 300 in the off-state. This allows the accumulation of accumulated charge under the gate oxide. For this example, the ACS bias voltage $V_{ACS}$ may be selected to be equal to or more negative than the lesser of Vs and Vd by connecting the ACS terminal 408 to the control circuit 412 to provide selected ACS bias voltages, thereby conveying the accumulated charge from the ACC NMOSFET 300.

In other embodiments, if the ACC NMOSFET 300 of FIG. 4D comprises a depletion mode device, $V_{th}$ is, by definition, less than zero. For Vs and Vd both at zero volts, when a gate bias Vg sufficiently negative to $V_{th}$ is applied (for example, Vg more negative than approximately −1 V relative to $V_{th}$), holes may accumulate under the gate oxide. For this example, the ACS bias voltage $V_{ACS}$ that is applied to the ACS terminal 408 may also be selected to be equal to or more negative than the lesser of Vs and Vd by connecting the ACS terminal 408 to the control circuit 412 and thereby provide the desired ACS bias voltages $V_{ACS}$ that are necessary to remove the accumulated charge from the ACC NMOSFET 300.

Figure 4E:
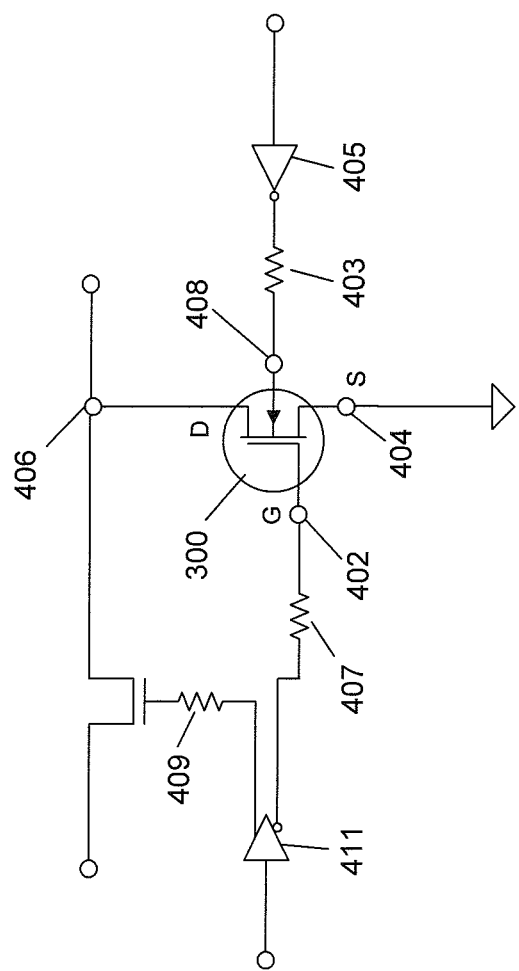
FIG. 4E is a simplified schematic of an exemplary RF switch circuit implemented using the four terminal ACC NMOSFET of FIG. 4D, wherein the ACS terminal is driven by an external bias source.

As described above, in one embodiment, instead of having the control circuit 412 provide a bias to the ACS terminal 408 as shown in FIG. 4D, the ACS terminal 408 can be driven by a separate bias source circuit, as shown, for example, in the embodiment of FIG. 4E. In one exemplary circuit implementation, as exemplified in the circuit of FIG. 4E, in an RF switch circuit, the separate $V_{ACS}$ source has a high output impedance element 403 which ensures that the RF voltage is divided across the ACC NMOSFET 300, and which further ensures that the voltage applied to the ACS terminal 408 has Vds/2 applied thereon, similar to the voltage Vgs that is applied to the gate terminal 402. In one exemplary embodiment, an inverter 405 is configured in series with the high output impedance element 403 and supplied by GND and $-V_{DD}$. In one exemplary embodiment, $-V_{DD}$ is readily derived from a convenient positive voltage supply. It could, however, comprise an even more negative voltage for improved linearity (i.e., it can be independent of the gate voltage).

In another embodiment, the circuit shown in FIG. 4C can be modified to include a clamping circuit configured in series with an ACS terminal 408. Such an exemplary embodiment is shown in FIG. 4F. Under certain operating conditions, current that flows out of the ACC NMOSFET 300, conveying the accumulated charge from the body of the ACC NMOSFET 300, via the ACS terminal 408 is sufficiently high such that it causes problems in the biasing circuitry (i.e., under some conditions the ACS current is so high that the biasing circuitry cannot adequately sink the current flowing out of the body of the ACC NMOSFET 300). As shown in the circuit of FIG. 4F, one exemplary embodiment solves this problem by interrupting the flow of ACS current out of the body of the ACC NMOSFET 300, and thereby returning the ACC NMOSFET 300 to a floating body condition.

In one exemplary circuit, as shown in FIG. 4F, a depletion-mode FET 421 is configured in series between the ACS terminal 408 and a diode 410. In this exemplary circuit, the depletion-mode FET 421 includes a gate terminal that is electrically connected to the FET's source terminal. In this configuration, the depletion-mode FET 421 functions to clip or limit the current that flows from the ACS terminal 408 when the ACC MOSFET operates in the accumulated charge regime. More specifically, the depletion-mode FET 421 enters saturation upon reaching a predefined threshold. The current leaving the body of the ACC MOSFET is thereby limited by the saturation current of the FET 421. In some embodiments, the predefined saturation threshold may optionally be adjusted to change the point at which clamping occurs, such as by selecting a higher threshold voltage, which results in a lower maximum current and earlier clamping.

In some embodiments, such as for example in an RF switch circuit, the gate terminal 402 and the ACS terminal 408 follow Vds at half the rate (Vds/2) of Vds. At high Vds excursions, Vgs may approach the threshold voltage Vth, resulting in increased Ids leakage current. In some cases, such a leakage current exits the ACS terminal 408 and can overwhelm associated circuitry (e.g., a negative voltage generator). Hence, the circuit shown in FIG. 4F solves or otherwise mitigates these problems. More specifically, by coupling the FET 421 in series between the ACS terminal 408 and the diode 410, the current that exits the ACS terminal 408 is limited to the saturation current of the FET 421.

In yet another exemplary embodiment, the simplified circuit shown in FIG. 4C can be modified to include an AC shorting capacitor placed in parallel with the diode 410. The simplified circuit of FIG. 4G can be used to compensate for certain undesirable nonlinearities present in a full circuit application. In some embodiments, due to parasitics present in the MOSFET layout, nonlinearity characteristics existing in the diode 410 of FIG. 4C may introduce undesirable nonlinearities in a full circuit implementation. As the diode is in place to provide DC bias conditions and is not intended to have any AC signals across it, it may be desirable in some embodiments to take steps to mitigate the effects of any AC signal present across the diode 410.

Figure 4G:
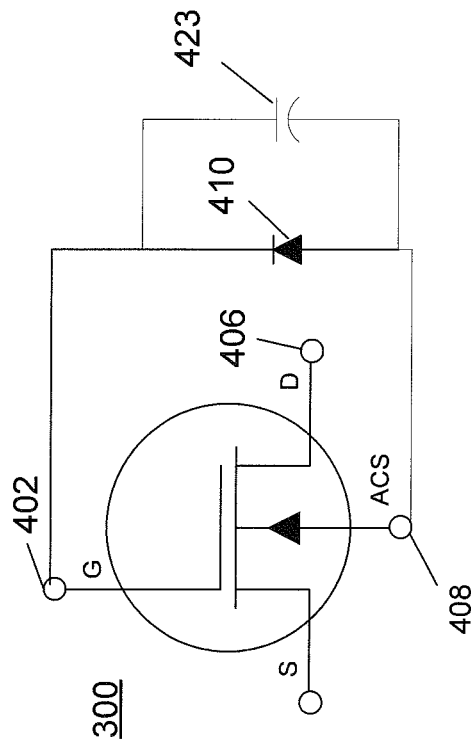
FIG. 4G is a simplified schematic of an improved SOI NMOSFET adapted to control accumulated charge, embodied as a four terminal device, wherein an accumulated charge sink (ACS) terminal is coupled to a gate terminal via a diode in parallel with a capacitor.
Figure 4F:
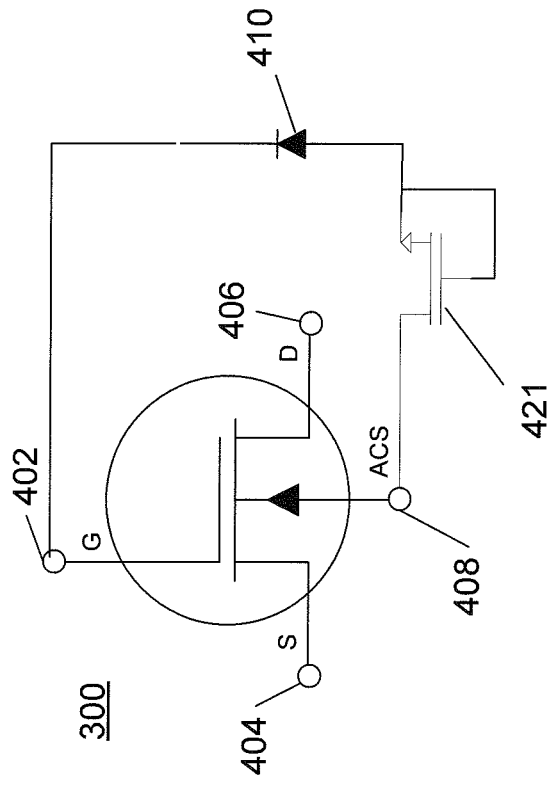
FIG. 4F is a simplified schematic of an improved SOI NMOSFET adapted to control accumulated charge, embodied as a four terminal device, wherein an accumulated charge sink (ACS) terminal is coupled to a clamping circuit.

As shown in the simplified circuit of FIG. 4G, the circuit of FIG. 4C has been modified to include an AC shorting capacitor 423 wherein the AC shorting capacitor 423 is configured in parallel across the diode 410. The AC shorting capacitor 423 is placed in parallel with the diode 410 to ensure that nonlinearities of the diode 410 are not excited by an AC signal. In some exemplary circuits, such as in an RF switch, the AC shorting capacitor 423 does not impact the higher level full circuit, as the gate terminal 402 and the ACS terminal 408 typically have the same AC signal applied (i.e., AC equipotential).

In some circuit embodiments, body nodes of a multi-finger FET implementation may be connected to one another (using, for example, metal or silicon), overlapping the source fingers. On another side of the FET implementation, gate nodes may be are connected to one another (using, for example, metal or silicon) overlapping the drain fingers. As a result of this FET implementation, additional capacitance may result between the source and body (S-B), and further additional capacitance may result between the drain and gate (D-G). These additional capacitances may degrade the symmetry of the intrinsic device. Under AC excitation, this results in the gate terminal following the drain terminal more closely, and the body terminal following the source terminal more closely, which effectively creates an AC signal across the diode 410, which can excite nonlinearities of the diode 410 as described above. Using the exemplary embodiment shown in FIG. 4G, parasitic nonlinear excitation due to the overlapping fingers is mitigated.

Figure 4H:
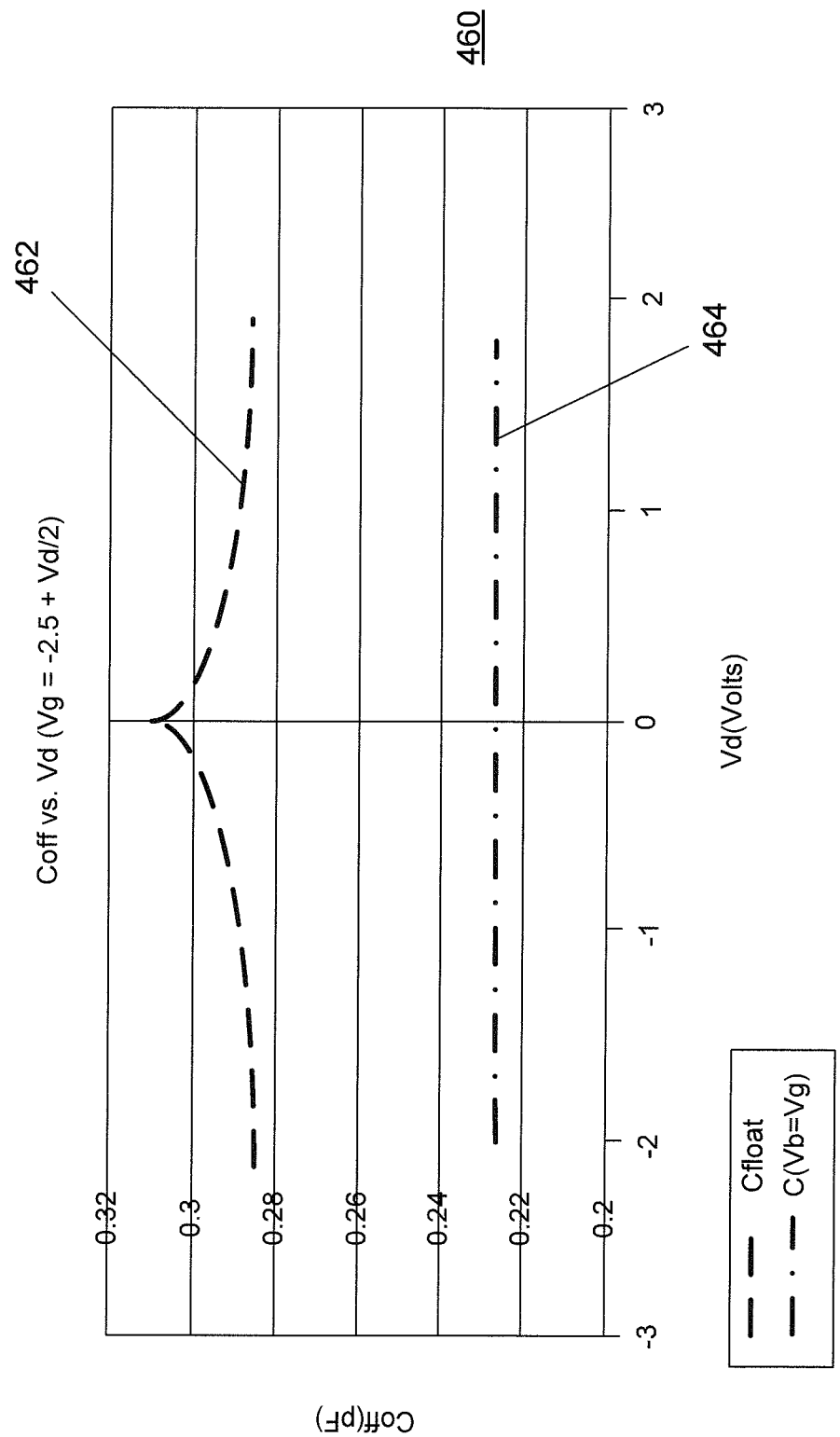
FIG. 4H shows plots of the off-state capacitance ($C_{off}$) versus applied drain-to-source voltages for SOI MOSFETs operated in the accumulated charge regime, wherein a first plot shows the off-state capacitance $C_{off}$ of a prior art SOI MOSFET, and wherein a second plot shows the off-state capacitance $C_{off}$ of the improved ACC SOI MOSFET made in accordance with the present teachings.

Improved $C_{off}$ Performance Characteristics of ACC MOSFETs made in Accordance with the Present Disclosed Method and Apparatus FIG. 4H is a plot 460 of the off-state capacitance ($C_{off}$) versus an applied drain-to-source voltage of an SOI MOSFET when an AC signal is applied to the MOSFET (the plot 460 is relevant to an exemplary 1 mm wide MOSFET, though similar plots result using wider and narrower devices). In one embodiment, a gate voltage equals −2.5 Volts+Vd/2, and Vs equals 0. A first plot 462 shows the off-state capacitance $C_{off}$ of a typical prior art NMOSFET operating within the accumulated charge regime and thereby having an accumulated charge as described above with reference to FIG. 1. As shown in FIG. 4H, the off-state capacitance $C_{off}$ shown in plot 462 of the prior art FET is voltage-dependent (i.e., it is nonlinear) and peaks when Vd=0 Volts. A second plot 464 illustrates the off-state capacitance $C_{off}$ of an improved ACC SOI MOSFET made in accordance with the present teachings, wherein the accumulated charge is conveyed from the ACC MOSFET, thereby reducing, controlling and/or eliminating the accumulated charge from the ACC MOSFET body. As shown in FIG. 4H, the off-state capacitance $C_{off}$ shown in plot 464 of the ACC SOI MOSFET is not voltage-dependent (i.e., it is linear).

As described above with reference to FIG. 2A, by controlling, reducing or eliminating the accumulated charge, the impedance 212 of the NMOSFET body 312 (FIG. 3C, and shown as the MOSFET body 114 in the electrical model of FIG. 2A) is increased to a very large value. This increase in the impedance 212 of the MOSFET body reduces the contribution to $C_{off}$ caused by the impedance of the junctions 218 and 220 (FIG. 2A), thereby reducing the overall magnitude of $C_{off}$ and the nonlinear effects associated with the impedances of the junctions 218 and 220. Plot 464 illustrates how the present teachings advantageously reduce both the nonlinearity and overall magnitude of the off-state capacitance $C_{off}$ of the MOSFET. The reduced nonlinearity and magnitude of the off-state capacitance $C_{off}$ improves the performance of circuits using MOSFETs operating in an accumulated charge regime, such as RF switching circuits. Exemplary RF switching circuits implemented with the ACC MOSFETs described above with reference to FIGS. 4A-4G are now described with reference to FIGS. 5A-5D.

Figure 5A:
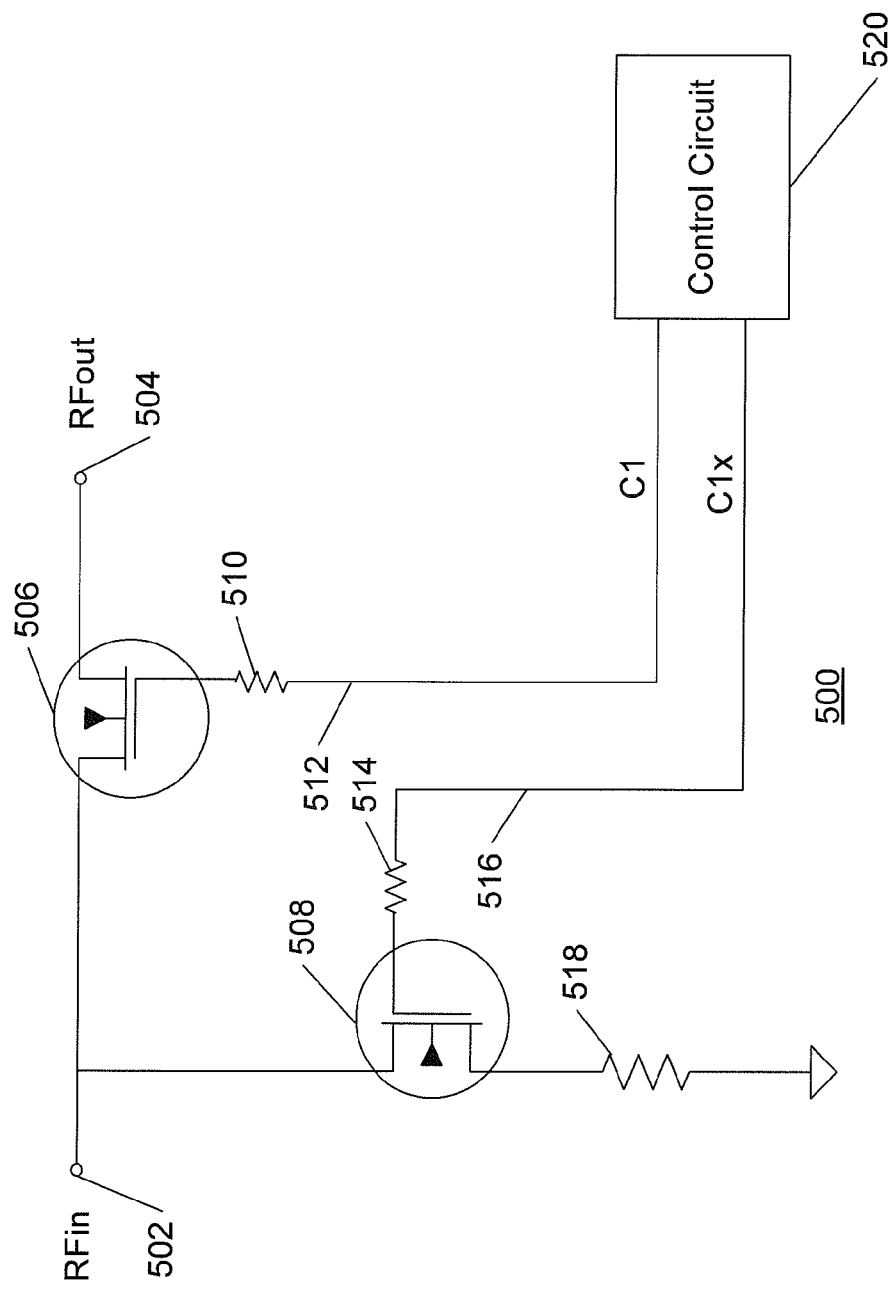
FIG. 5A is a schematic of an exemplary prior art single pole, single throw (SPST) radio frequency (RF) switch circuit.

Exemplary Improved Performance RF Switch Implementations Using ACC SOI MOSFETs in Accordance with the Present Teachings FIG. 5A shows a schematic diagram of a single pole, single throw (SPST) RF switch circuit 500 in accordance with prior art. The RF switch circuit 500 is one example of a general class of well-known RF switch circuits. Similar RF switch circuits are described in the following co-pending and commonly assigned U.S. applications and patent: Provisional Application No. 60/651,736, filed Feb. 9, 2005, entitled "UNPOWERED SWITCH AND BLEEDER CIRCUIT;" application Ser. No. 10/922,135, filed Aug. 18, 2004, pending, which is a continuation application of application Ser. No. 10/267,531, filed Oct. 8, 2002, which issued Oct. 12, 2004 as U.S. Pat. No. 6,804,502, entitled "SWITCH CIRCUIT AND METHOD OF SWITCHING RADIO FREQUENCY SIGNALS". Application Ser. No. 10/267,531, filed Oct. 8, 2002, which issued Oct. 12, 2004 as U.S. Pat. No. 6,804,502 claims the benefit of U.S. Provisional Application No. 60/328,353, filed Oct. 10, 2001. All of the above-cited applications and issued patent set forth above are hereby incorporated by reference herein as if set forth in full for their teachings on RF switch circuits including SOI MOSFET switch circuits.

Referring again to FIG. 5A, a switching SOI NMOSFET 506 is adapted to receive an RF input signal "RFin" at an input terminal 502. The switching SOI MOSFET 506 is electrically coupled to selectively couple the RFin input signal to an output terminal 504 (i.e., thereby convey an RF output signal Rfout at the output terminal 504). In the exemplary embodiment, the switching SOI NMOSFET 506 is controlled by a first control signal C1 that is conveyed by a control line 512 through a gate resistor 510 (optionally included for suppression of parasitic RF coupling). The control line 512 is electrically coupled to a control circuit 520, which generates the first control signal C1.

Referring again to FIG. 5A, a shunting SOI NMOSFET 508 is adapted to receive the RF input signal RFin at its drain terminal, and to selectively shunt the input signal RFin to ground via an optional load resistor 518. The shunting SOI NMOSFET 508 is controlled by a second control signal C1x which is conveyed by a control line 516 through a gate resistor 514 (optionally included for suppression of parasitic RF coupling and for purposes of voltage division). The control line 516 is electrically coupled to the control circuit 520, which generates the second control signal C1x.

The terms "switching" and "shunting", as pertains to the transistors shown in FIG. 5A and also described below with reference to the RF switch circuits of FIGS. 5B-5D, 6, 8, and 9, are used interchangeably herein with the terms "switch" and "shunt", respectively. For example, the switching transistor 506 (and all of its analogous switching transistors described below in FIGS. 5B-5D, 6, 8, and 9) is also referred to herein as the "switch" transistor. Similarly, the shunting transistor 508 (and all of its analogous shunting transistors described below in FIGS. 5B-5D, 6, 8, and 9) is also referred to herein as the "shunt" transistor. The terms "switch" and "switching" (and similarly the terms "shunt" and "shunting"), when used to describe the RF switch circuit transistors, are used interchangeably herein. Further, as described below in more detail with reference to FIG. 6, those skilled in the RF switching design and fabrication arts shall recognize that although the switch and shunt transistors are shown in FIGS. 5A-5D and FIG. 9 as comprising a single MOSFET, it shall be understood that they may comprise transistor groupings comprising one or more MOSFET transistors.

It will also be appreciated by those skilled in RF switch circuits that all of the exemplary switch circuits may be used "bi-directionally," wherein the previously described input ports function as output ports, and vice versa. That is, although an exemplary RF switch may be described herein as having one or more input ports (or nodes) and one or more output ports (or nodes), this description is for convenience only, and it will be understood that output ports may, in some applications, be used to input signals, and input ports may, in some applications, be used to output signals. The RF switch circuits described with reference to FIGS. 2B, 4E, 5A-5D, 6, 8 and 9 are described herein as having "input" and "output"

ports (or "nodes") that input and output RF signals, respectively. For example, as described below in more detail with reference to FIG. 9, RF input node 905 and RF input node 907 are described below as inputting RF signals RF1 and RF2 respectively. RFC common port 903 is described below as providing an RF common output signal. Those skilled in the RF switch circuit design arts shall recognize that the RF switch is bidirectional, and that the previously described input ports function perfectly well as output ports, and vice versa. In the example of the RF switch of FIG. 9, the RFC common port can be used to input an RF signal which is selectively output by the RF nodes 905 and 907.

Referring again to FIG. 5A, the first and second control signals, C1 and C1x, respectively, are generated so that the switching SOI NMOSFET 506 operates in an on-state when the shunting SOI NMOSFET 508 operates in an off-state, and vice versa. These control signals provide the gate bias voltages Vg to the gate terminals of the NMOSFETs 506 and 508. When either of the NMOSFETs 506 or 508 is biased to select the transistor off-state, the respective Vg must comprise a sufficiently large negative voltage so that the respective NMOSFET does not enter, or approach, an on-state due to the time varying applied voltages of the RF input signal RFin. The maximum power of the RF input signal RFin is thereby limited by the maximum magnitude of the gate bias voltage Vg (or, more generally, the gate-to-source operating voltage, Vgs) that the SOI NMOSFETs 506 and 508 can reliably sustain. For RF switching circuits such as those exemplified herein, the magnitude of Vgs(max)=|Vg|+|Vds(max)/2|, where Vds=Vd−Vs, and Vds(max) comprises the maximum Vds due to the high-power input signal voltage levels associated with the RF input signal RFin.

Exemplary bias voltages for the switching and shunting SOI NMOSFETs 506 and 508, respectively, may include the following: with $V_{th}$ approximately zero volts, Vg, for the on-state, of +2.5 V, and Vg, for the off-state, of −2.5 V. For these bias voltages, the SOI NMOSFETs may eventually operate in an accumulated charge regime when placed into their off-states. In particular, and as described above with reference to FIG. 2B, when the switching NMOSFET 506 is in the on-state, and the shunting NMOSFET 508 is biased in the off-state, the output signal RFout may become distorted by the nonlinear behavior of the off capacitance $C_{off}$ of the shunting NMOSFET 508 caused by the accumulated charge. Advantageously, the improved ACC MOSFETs made in accordance with the present teachings can be used to improve circuit performance, especially as it is adversely affected by the accumulated charge.

Figure 5B:
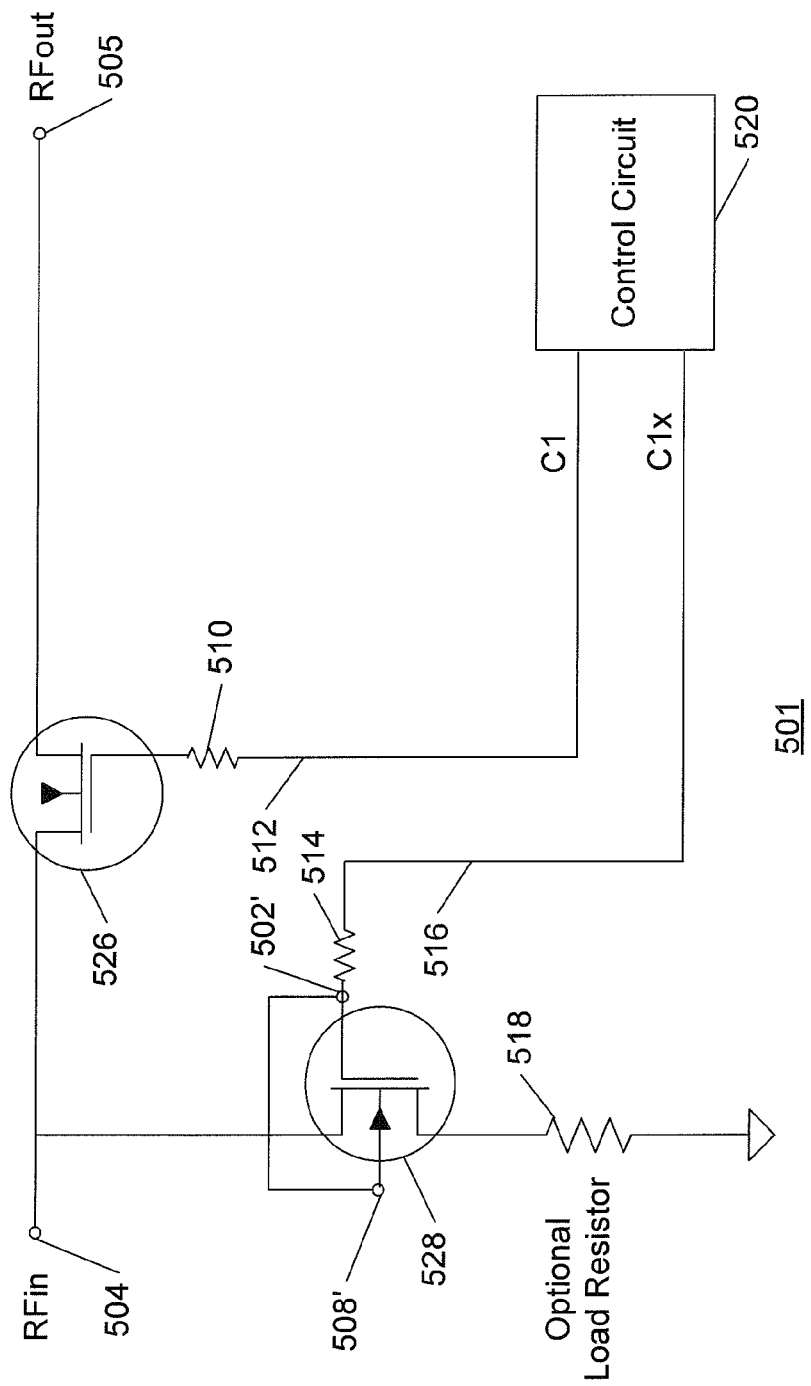
FIG. 5B is a schematic of an RF switch circuit adapted for improved performance using accumulated charge control, wherein the gate of a shunting SOI NMOSFET is coupled to an accumulated charge sink (ACS) terminal.

FIG. 5B is a schematic of an improved RF circuit 501 adapted for higher performance using the present accumulated charge reduction and control techniques. The switch circuit 501 differs from the prior art circuit 500 (FIG. 5A) in that the shunting NMOSFET 508 is replaced by a shunting ACC NMOSFET 528 made in accordance with the present teachings. The shunting ACC NMOSFET 528 is analogous to the ACC NMOSFET described above with reference to FIGS. 4A and 4B. Similarly, the gate, source, drain and ACC terminals of the shunting ACC NMOSFET 528 are analogous to the respective terminals of the ACC NMOSFET 300. With the exception of the improved switch performance afforded by the improved shunting ACC NMOSFET 528, the operation of the RF switch circuit 501 is very similar to the operation of the RF switch circuit 500 described above with reference to FIG. 5A.

Exemplary bias voltages for the switching NMOSFET 526 and the shunting ACC NMOSFET 528 may include: with $V_{th}$ approximately zero, Vg, for the on-state, of +2.5 V, and Vg, for the off-state, of −2.5 V. For these bias voltages, the SOI NMOSFETs may operate in an accumulated charge regime when placed into the off-state. However, when the switching NMOSFET 526 is in the on-state and the shunting ACC NMOSFET 528 is in the off-state, the output signal RFout at the output terminal 505 will not be distorted by nonlinear behavior of the off-state capacitance $C_{off}$ of the improved shunting ACC NMOSFET 528 due to the accumulated charge. When the shunting ACC NMOSFET 528 operates in the accumulated charge regime, the accumulated charge is removed via the ACS terminal 508'. More specifically, because the gate terminal 502' of the shunting ACC NMOSFET 528 is connected to the ACS terminal 508', the accumulated charge is removed or otherwise controlled as described above in reference to the simplified circuit of FIG. 4B. The control of the accumulated charge improves performance of the switch 501 by improving the linearity of the off transistor, shunting ACC NMOSFET 528, and thereby reducing the harmonic and intermodulation distortion of the RF output signal Rfout generated at the output terminal 505.

Figure 5C:
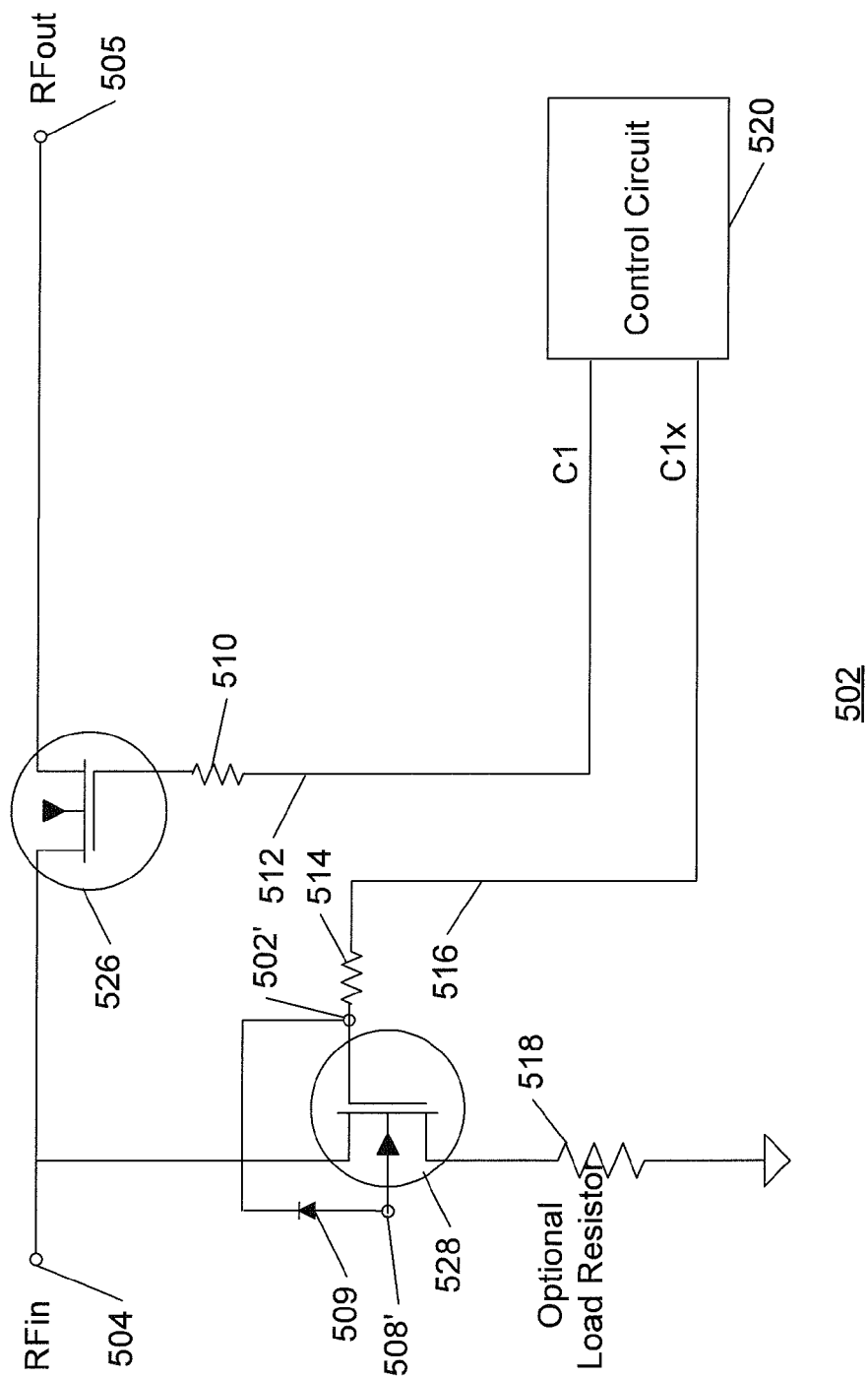
FIG. 5C is a schematic of an RF switch circuit adapted for improved performance using accumulated charge control, wherein the gate of a shunting SOI NMOSFET is coupled to an accumulated charge sink (ACS) terminal via a diode.

FIG. 5C is a schematic of another embodiment of an improved RF switch circuit 502 adapted for higher performance using the accumulated charge control techniques of the present disclosure. The switch circuit 502 differs from the prior art circuit 500 (FIG. 5A) in that the NMOSFET 508 is replaced by an ACC NMOSFET 528 made in accordance with the present teachings. The ACC NMOSFET 528 is analogous to the ACC NMOSFET 300 described above with reference to FIGS. 4A and 4C. Similarly, the gate, source, drain and ACC terminals of the ACC NMOSFET 528 are analogous to the respective terminals of the ACC NMOSFETs 300 described above with reference to FIGS. 4A and 4C. With the exception of the improved switch performance afforded by the improved ACC NMOSFET 528, the operation of the switch circuit 502 is very similar to the operations of the switch circuits 500 and 501 described above with reference to FIGS. 5A and 5B, respectively.

Exemplary bias voltages for the NMOSFET 526 and the ACC NMOSFET 528 may include the following: with $V_{th}$ approximately zero volts, Vg, for the on-state, of +2.5 V, and Vg, for the off-state, of −2.5 V. For these bias voltages, the SOI NMOSFETs 526, 528 may operate in an accumulated charge regime when placed into an off-state. However, when the NMOSFET 526 is in the on-state and the ACC NMOSFET 528 is in the off-state, the output signal RFout will not be distorted by nonlinear behavior of the off-state capacitance $C_{off}$ of the ACC NMOSFET 528 due to the accumulated charge. Because the gate terminal 502' of the ACC NMOSFET 528 is connected to the ACS terminal 508' via a diode 509, the accumulated charge is entirely removed, reduced or otherwise controlled, as described above with reference to FIG. 4C. Similar to the improved switch 501 described above with reference to FIG. 5B, control of the accumulated charge improves performance of the switch 502 by improving the linearity of the off transistor, 528, and thereby reducing the harmonic and intermodulation distortion of the RF output signal Rfout output of the RF output terminal 505. Connection of the diode 509 as shown may be desired in some embodiments for suppression of positive current flow into the ACC NMOSFET 528 when it is biased into an on-state, as described above with reference to FIG. 4C.

Figure 5D:
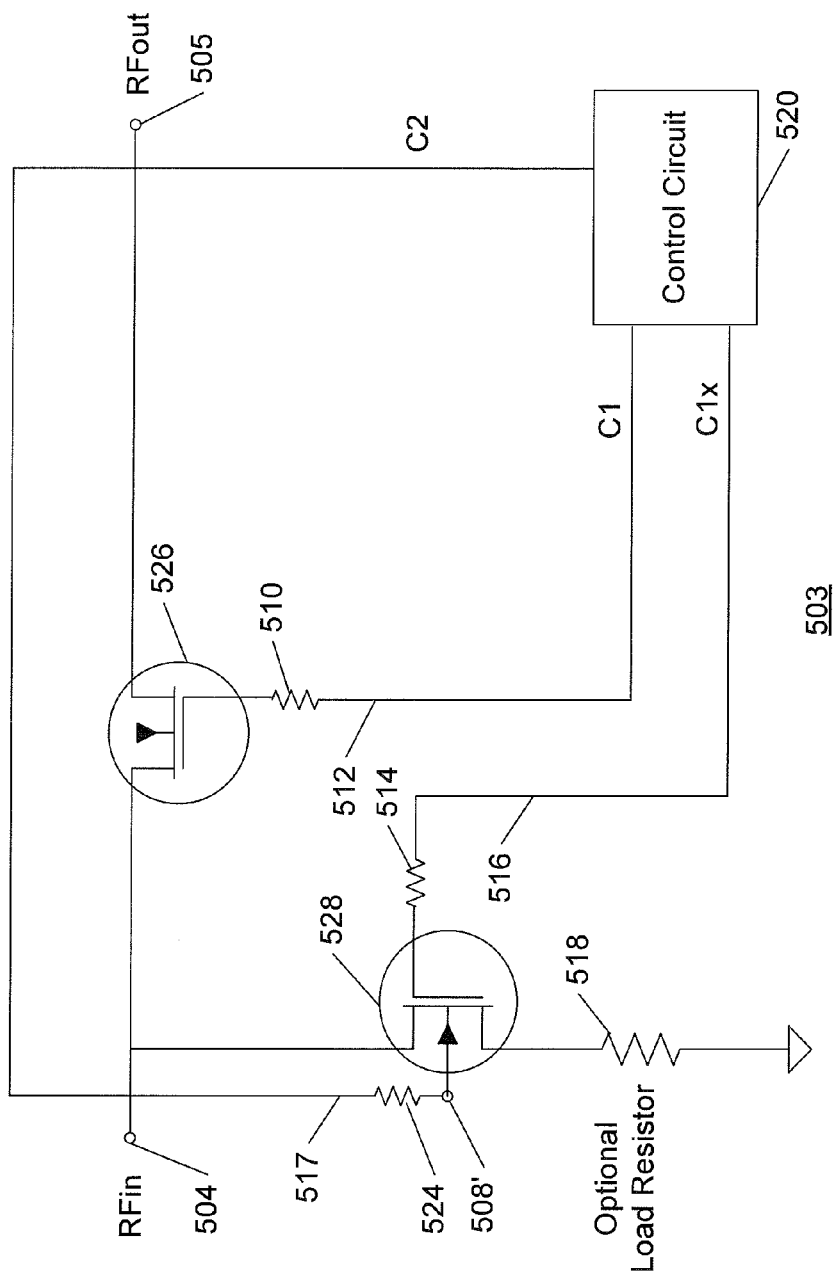
FIG. 5D is a schematic of an RF switch circuit adapted for improved performance using accumulated charge control, wherein the accumulated charge sink (ACS) terminal is coupled to a control circuit.

FIG. 5D is a schematic of another embodiment of an improved RF switch circuit 503 adapted for higher performance using the present accumulated charge control techniques. The switch circuit 503 differs from the prior art circuit 500 (FIG. 5A) in that the NMOSFET 508 of FIG. 5A is replaced by an ACC NMOSFET 528 made in accordance with the present teachings. The ACC NMOSFET 528 is analogous to the ACC NMOSFET described above with reference to FIGS. 4A and 4D. With the exception of the improved switch performance afforded by the improved ACC NMOSFET 528, the operation of the switch circuit 503 is very similar to the operations of the switch circuits 500, 501 and 502 described above with reference to FIGS. 5A-5C, respectively.

Exemplary bias voltages for the NMOSFET 526 and the ACC NMOSFET 528 may include the following: with $V_{th}$ approximately zero volts, Vg, for the on-state, of +2.5 V, and Vg, for the off-state, of −2.5 V. For these bias voltages, the SOI NMOSFETs 526, 528 may operate in an accumulated charge regime when placed into the off-state. However, when the NMOSFET 526 is in the on-state and the ACC NMOSFET 528 is in the off-state, the output signal RFout produced at the output terminal 505 will not be distorted by the nonlinear behavior of the off-state capacitance $C_{off}$ of the ACC NMOSFET 528 due to the accumulated charge. When the NMOSFET 528 operates in the accumulated charge regime, the accumulated charge is removed via the ACS terminal 508'. More specifically, because the ACS terminal 508' of the ACC NMOSFET 528 is electrically coupled to the control circuit 520 via the control line 517 (i.e., controlled by the control signal "C2" as shown), the accumulated charge can be eliminated, reduced or otherwise controlled by applying selected bias voltages to the ACS terminal 508' as described above with reference to FIG. 4D. Those skilled in the arts of electronic circuit design shall understand that a wide variety of bias voltage signals can be applied to the ACS terminal for the purpose of reducing or otherwise controlling the accumulated charge. The specific bias voltages may be adapted for use in a particular application. The control of the accumulated charge improves performance of the switch 503 by improving the linearity of the off-state transistor, 528, and thereby reducing the harmonic and intermodulation distortion of the RF output signal Rfout generated at the output terminal 505.

In the circuits described above with respect to FIGS. 5B-5D, the switching SOI MOSFETs 526 are shown and described as implemented using SOI MOSFETs of the prior art (i.e., they do not comprise ACC MOSFETs and therefore do not have an ACS terminal). Those skilled in the electronic device design arts shall understand and appreciate that in other embodiments of the disclosed method and apparatus, the prior art switching SOI MOSFETs 526 may be replaced, as desired or required, by ACC SOI MOSFETs made in accordance with the present disclosure. For example, in some embodiments of RF switches implemented using the ACC MOSFET of the present teachings, the RF switch comprises a single-pole double-throw RF switch. In this embodiment, the switching SOI MOSFETs (e.g., analogous to the switching SOI MOSFETs 526 described above with reference to FIGS. 5B-5D) may comprise ACC SOI MOSFETs. Such an implementation prevents nonlinear behavior of the off-state switching SOI MOSFETs (which is turned off when it is not selected as an input "pole") from detrimentally affecting the output of the RF signal as switched through the selected "pole". Implementation of the RF switches using switching ACC MOSFETs reduces the magnitude, drift, and voltage dependency of the off capacitance $C_{off}$ of the switching transistors. Consequently, and as described above in more detail, the switch performance characteristics, such as its isolation, insertion loss and drift characteristics, are also improved. This implementation is described in more detail below with reference to the RF switch circuit shown in FIG. 9. Many other examples will be apparent to those skilled in the arts of electronic circuits.

For example, as set forth above, although the exemplary RF switches have been described as being implemented using ACC SOI NMOSFET devices, they can also be implemented using ACC SOI PMOSFET devices. Further, although single-pole single-throw, and single-pole double-throw RF switches have been described above as examples of RF switches implemented in accordance with the present teachings, the present application encompasses any variation of single-pole multi-throw, multi-pole single-throw, and multi-pole multi-throw RF switch configurations. Those skilled in the RF switch design and fabrication arts shall recognize and appreciate that the present teachings can be used in implementing any convenient RF switch configuration design.

Exemplary RF Switch Implementation Using Stacked Transistors

In the exemplary embodiments of RF switch circuits described above, the switch circuits are implemented using a single SOI NMOSFET (e.g., the single SOI NMOSFET 506 of FIG. 5A, and the single SOI NMOSFET 526 of FIGS. 5B-5D) that selectively couples or blocks (i.e., electrically opens the circuit connection) the RF input signal to the RF output. Similarly, in the exemplary embodiments described above with reference to FIGS. 5A-5D, a single SOI NMOSFET (e.g., the single SOI NMOSFET 508 of FIG. 5A, and ACC SOI NMOSFET 528 of FIGS. 5B-5D) is used to shunt (FET in the on-state) or block (FET in the off-state) the RF input signal to ground. Commonly assigned U.S. Pat. No. 6,804,502, entitled "SWITCH CIRCUIT AND METHOD OF SWITCHING RADIO FREQUENCY SIGNALS", issued Oct. 12, 2004, describes RF switch circuits using SOI NMOSFETs implemented with stacked transistor groupings that selectively couple and block RF signals.

Figure 6:
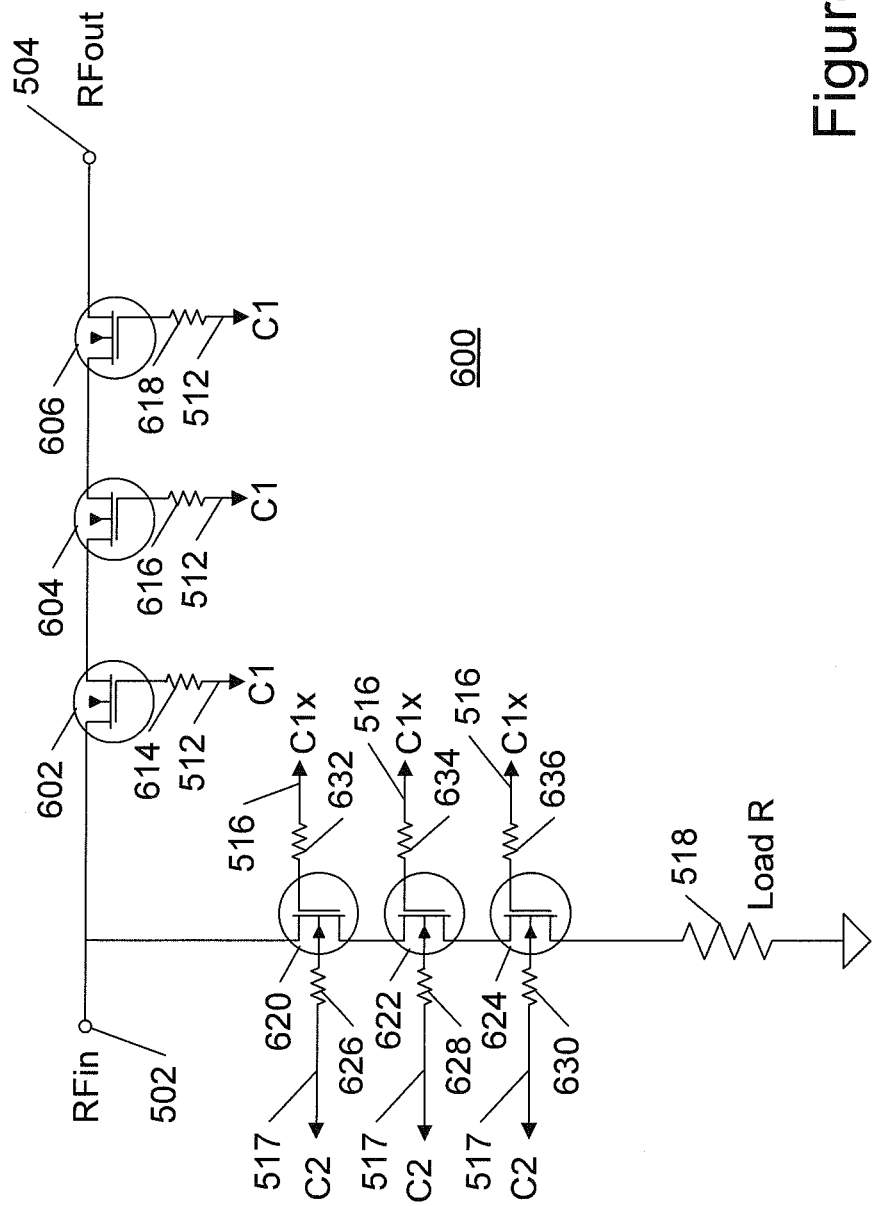
FIG. 6 is a schematic of an RF switch circuit including stacked MOSFETs, adapted for improved performance using accumulated charge control, wherein the accumulated charge sink (ACS) terminals of the shunting stacked MOSFETs are coupled to a control signal.

One example of how stacked NMOSFETs may be implemented in accordance with the teachings of the present disclosure is illustrated in FIG. 6. An RF switch circuit 600 is analogous to the RF switch circuit 503 of FIG. 5D, wherein the single SOI NMOSFET 526 is replaced by a stack of SOI NMOSFETs 602, 604 and 606. Similarly, the single ACC SOI NMOSFET 528 is replaced by a stack of ACC SOI NMOSFETs 620, 622 and 624. The control signal C2 is provided to the ACS terminals of the ACC SOI NMOSFETs 620, 622 and 624 via optional resistors 626, 628, and 630, respectively. The resistors 626, 628, and 630 may optionally be included in order to suppress parasitic RF signals between the stacked ACC SOI NMOSFETs 620, 622, and 624, respectively. The RF switch circuit 600 operates analogously to the operation of the RF switch circuit 503 described above with reference to FIG. 5D.

Three stacked ACC SOI NMOSFETs are shown in each ACC NMOSFET stack in the exemplary stacked RF switch circuit 600 of FIG. 6. A plurality of three ACC NMOSFETs is shown for illustrative purposes only, however, those skilled in the integrated circuit design arts will understand that an arbitrary plurality may be employed according to particular circuit requirements such as power handling performance, switching speed, etc. A smaller or larger plurality of stacked ACC NMOSFETs may be included in a stack to achieve a desired operating performance.

Other stacked RF switch circuits, adapted for accumulated charge control, analogous to the circuits described above with reference to FIGS. 5B-5D, may also be employed. Implementations of such circuits shall be obvious from the teachings above to those skilled in the electronic device design arts, and therefore are not described further herein. Moreover, is shall be obvious to those skilled in the electronic device design arts that, although a symmetrically stacked (i.e., having an equal number of shunting and switching transistors) RF switch is shown in the stacked RF switch of FIG. 6, the present inventive ACC method and apparatus is not so limited. The present teachings can be applied in implementing both symmetrically and asymmetrically stacked (having an unequal number of shunting and switching transistors) RF switches. The designer will readily understand how to use the ACC MOSFETs of the present disclosure in implementing asymmetrical, as well as symmetrical, RF switch circuits.

Exemplary Method of Operation

Figure 7:
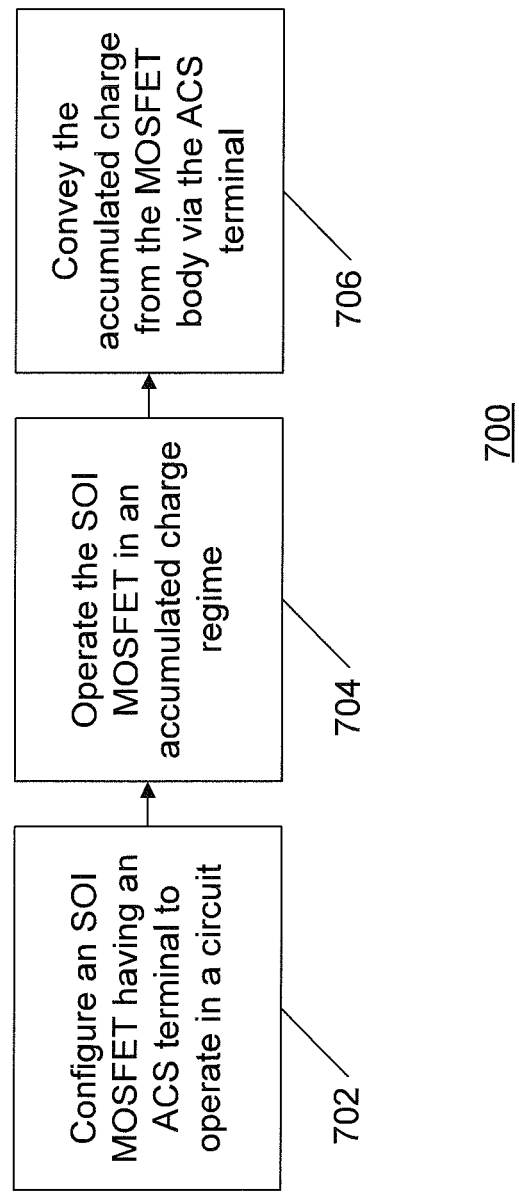
FIG. 7 shows a flowchart of an exemplary method of improving the linearity of an SOI MOSFET device using an accumulated charge sink in accordance with the present disclosure.

FIG. 7 illustrates an exemplary method 700 of improving the linearity of an SOI MOSFET having an accumulated charge sink (ACS) in accordance with the present disclosure. The method 700 begins at a STEP 702, whereat an ACC SOI MOSFET having an ACS terminal is configured to operate in a circuit. The ACS terminal may be operatively coupled to the gate of the SOI MOSFET (as described above with reference to FIGS. 4B, 4C, 5B and 5C), or to a control circuit (as described above with reference to FIGS. 4D and 5D). In other embodiments, the ACS terminal may be operatively coupled to any convenient accumulated charge sinking mechanism, circuit, or device as is convenient to the circuit or system designer. The method then proceeds to a step 704.

At the STEP 704, the ACC SOI MOSFET is controlled, at least part of the time, so that it operates in an accumulated charge regime. In most embodiments, as described above, the ACC MOSFET is operated in the accumulated charge regime by applying bias voltages that place the FET in an off-state condition. In one exemplary embodiment, the ACC SOI MOSFET comprises' an ACC SOI NMOSFET that is configured as part of a shunting circuit of an RF switch. According to this exemplary embodiment, the SOI NMOSFET may be operated in an accumulated charge regime after the shunting circuit is placed into an off-state by applying a negative bias voltage to the gate terminal of the ACC NMOSFET.

The method then proceeds to a STEP 706, whereat the accumulated charge that has accumulated in the channel region of the ACC MOSFET is removed or otherwise controlled via the ACS terminal. In this embodiment, the accumulated charge is conveyed to another circuit terminal and is thereby reduced or otherwise controlled. One such exemplary circuit terminal that can be used to convey the accumulated charge from the MOSFET body comprises a gate terminal of the ACC MOSFET (see, e.g., the description above with reference to FIGS. 4B, 4C, 5B and 5C). Another exemplary circuit terminal that can be used to remove or otherwise control the accumulated charge comprises the terminal of a control circuit (see, e.g., FIGS. 4D and 5D). As described in more detail above, removing or otherwise controlling the accumulated charge in the ACC MOSFET body improves the linearity of the off-state ACC MOSFET, which reduces the harmonic distortion and IMD of signals affected by the ACC MOSFET, and which, in turn, improves circuit and system performance. In RF switch circuits, improvements (in both linearity and magnitude) are made to the off capacitance of shunting ACC MOSFET devices, which, in turn, improves the performance of the RF switch circuits. In addition to other switch performance characteristics, the harmonic and intermodulation distortions of the RF switch are reduced using the ACC method and apparatus of the present teachings.

Figure 8:
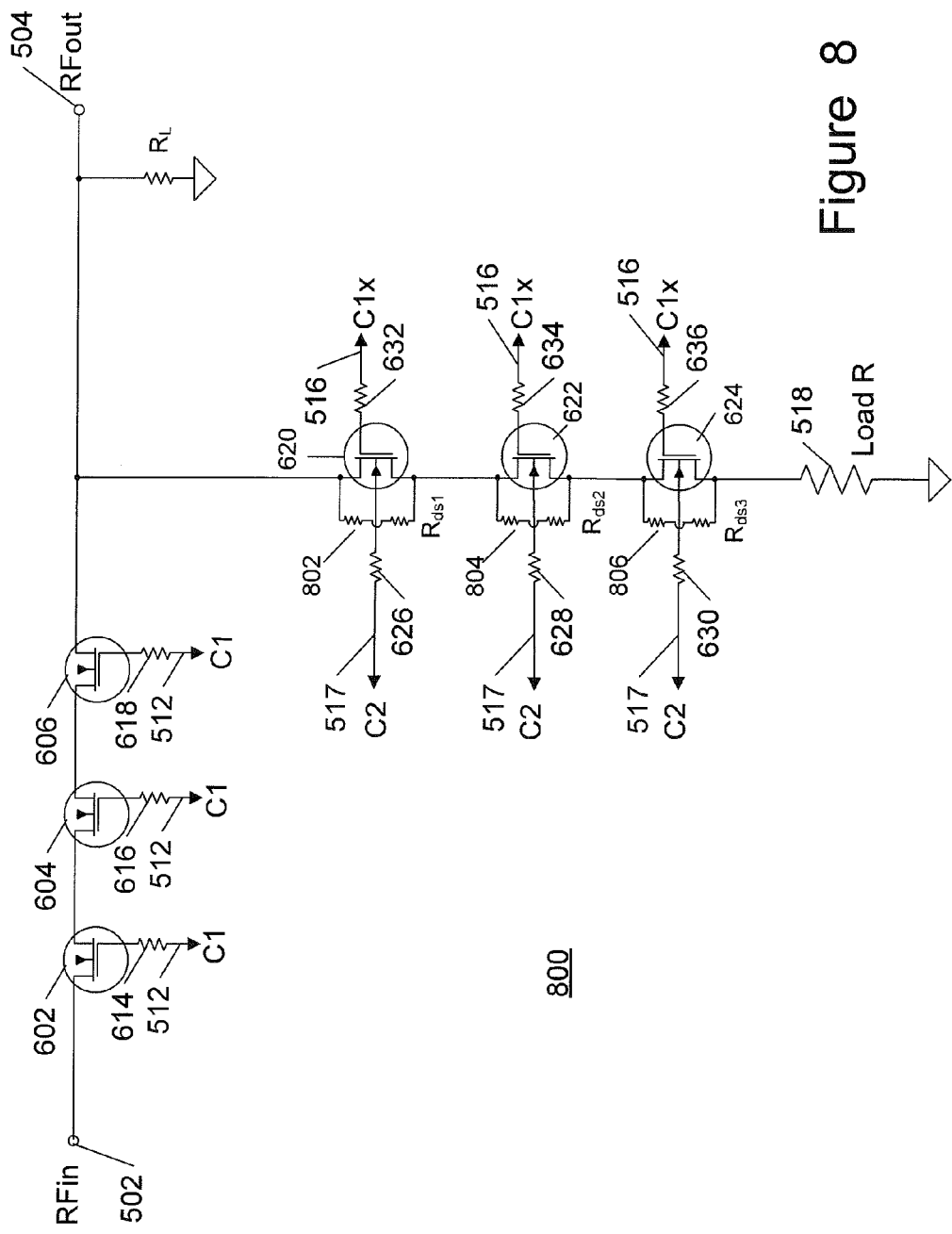
FIG. 8 shows a simplified circuit schematic of an exemplary embodiment of an RF switch circuit made in accordance with the present disclosure, wherein the RF switch circuit includes drain-to-source resistors between the drain and source of the ACC MOSFETs.
Figure 9:
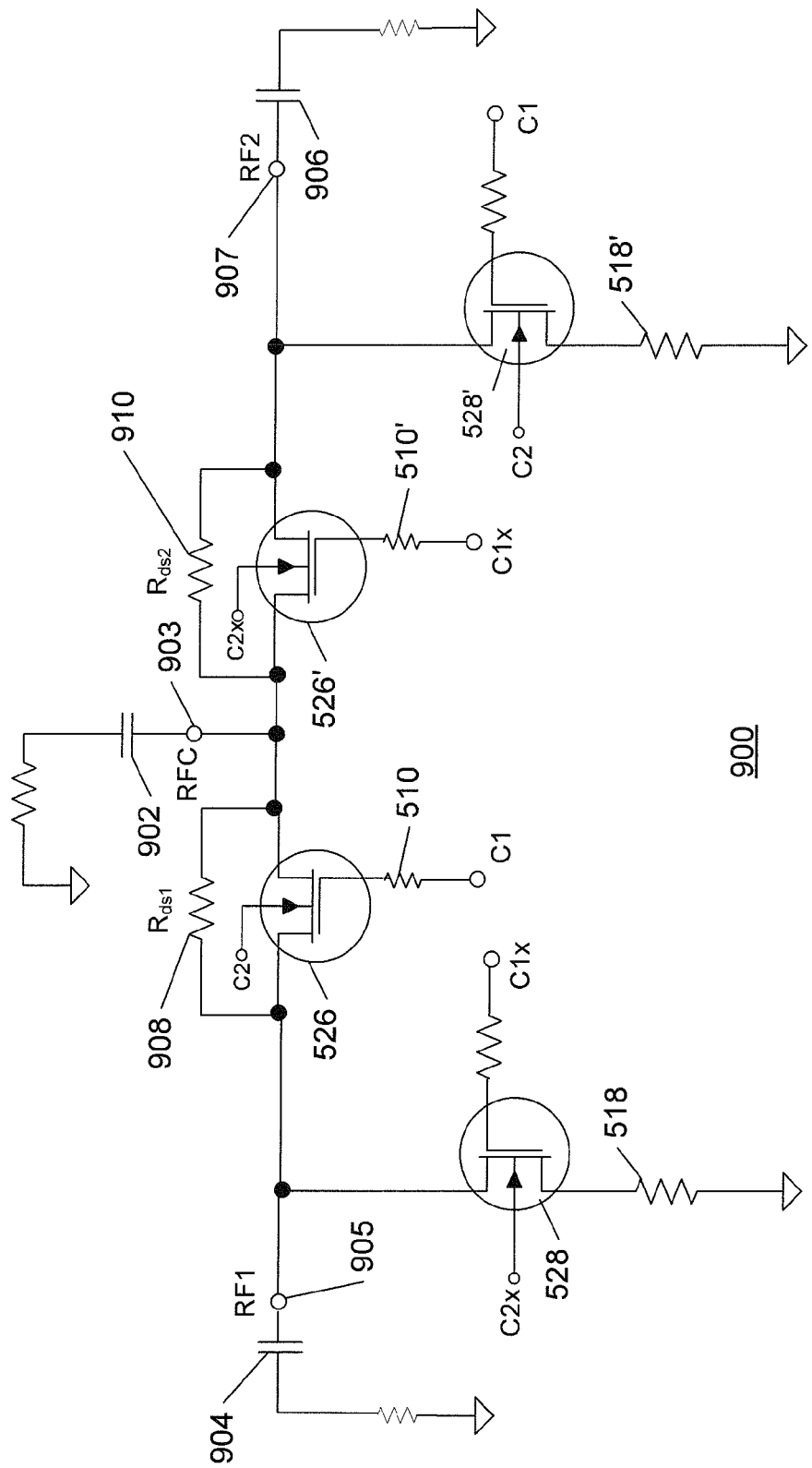
FIG. 9 shows a simplified schematic of an exemplary single-pole double-throw (SPDT) RF switch circuit made in accordance with the present disclosure, wherein drain-to-source resistors are shown across the switching ACC SOI MOSFETs.

FIGS. 8 and 9 show schematics of additional exemplary embodiments of RF switching circuits made in accordance with the disclosed method and apparatus for use in improving linearity of MOSFETs having an ACS. As described in more detail below with reference to FIGS. 8 and 9, in some exemplary embodiments of RF switch circuits made in accordance with the present disclosure, it may be desirable to include drain-to-source resistors, Rds, and thereby improve some switch performance characteristics when the switch is used in a particular application. These exemplary RF switch circuits are now described in more detail.

Exemplary Rf Switch Implementations Using Stacked Transistors Having Source to Drain Resistors FIG. 8 shows one exemplary embodiment of an RF switch circuit 800 made in accordance with the present disclosure. As shown in FIG. 8, some embodiments of RF switches made in accordance with the present disclosure may include drain-to-source ($R_{ds}$) resistors electrically connected to the respective sources and drains of the ACC MOSFETs. For example, the exemplary switch 800 of FIG. 8 includes drain-to-source $R_{ds}$ resistors 802, 804, and 806 electrically connected to the respective sources and drains of the shunting ACC SOI NMOSFETs 620, 622, and 624, respectively. Motivation for use of the drain-to-source $R_{ds}$ resistors is now described.

As shall be appreciated by skilled persons from the present teachings, removal of the accumulated charge via the ACS terminal causes current to flow from the body of the ACC SOI MOSFET. For example, when a hole current flows from the body of an ACC SOI MOSFET via the ACS, an equal electron current flows to the FET source and/or drain. For some circuits (e.g., the RF switch circuit of FIG. 8), the sources and/or drains of the ACC SOI NMOSFETs are connected to other SOI NMOSFETs. Because off-state SOI NMOSFETs have a very high impedance (e.g., in the range of 1 Gohm for a 1 mm wide SOI NMOSFET), even a very small drain-to-source current (e.g., in the range of 1 nA) can result in an unacceptably large drain-to-source voltage Vds across the ACC SOI NMOSFET in satisfaction of Kirchhoffs well known current and voltage laws. In some embodiments, such as that shown in the RF switch circuits of FIGS. 8 and 9, such resultant very large drain-to-source voltages Vds undesirably impacts reliability and linearity of the ACC SOI NMOSFET. The drain-to-source resistors $R_{ds}$ provide a path between the ACC FET drain and source whereby currents associated with controlling the accumulated charge may be conducted away from the sources and drains of ACC SOI NMOSFETs when implemented in series with high impedance elements such as other ACC SOI NMOSFETs.

Exemplary operating voltages for the NMOSFETs 602-606 of FIG. 8, and the ACC NMOSFETs 620-624, may include the following: $V_{th}$ approximately zero volts, Vg, for the on-state, of +2.5 V, and Vg, for the off-state, of −2.5 V. In an exemplary embodiment, the ACC SOI NMOSFET 622 of FIG. 8 may have a width of 1 mm, and an electron-hole pair generation rate for accumulated charge producing a current of 10 pA/μm for operation in the accumulated charge regime. For the electron current supplied equally by the source and drain, and an impedance of the ACC SOI NMOSFETs 620 and 622 on the order of 1 Gohm, then an unacceptable bias of −5 V would result on the source and drain of the ACC SOI NMOSFET 622 without the presence of $R_{ds}$ resistors 802 and 806. This bias voltage would also be applied to the interior nodes of the ACC SOI NMOSFETs 620 and 624.

Even currents smaller than the exemplary currents may produce adverse affects on the operation of the RF switching circuit 800 by reducing Vgs and/or Vgd of the ACC SOI MOSFETs 620-624 in the off-state, thereby reducing the power handling capability and reliability of the circuit by increasing leakage (e.g., when either Vgs or Vgd approaches $V_{th}$), by increasing hot-carrier damage caused by excess leakage, etc. Linearity of the MOSFETs is also degraded by reducing Vgs and/or Vgd when either value approaches $V_{th}$.

Exemplary values for the $R_{ds}$ resistors 802 to 806 may be selected in some embodiments by selecting a value approximately equal to the resistance of the gate resistors 632-636 divided by the number of ACC SOI NMOSFETs in the stack (in the exemplary embodiment, there are three ACC FETs in the stack). More generally, the value of the $R_{ds}$ resistors may be equal to the gate resistor value divided by the number of ACC SOI NMOSFETs in the stack. In one example, a stack of eight ACC SOI NMOSFETs may have gate resistors of 80 kohm and $R_{ds}$ resistors of 10 kohm.

In some embodiments, the $R_{ds}$ resistors may be selected so that they do not adversely affect switch performance characteristics, such as, for example, the insertion loss of the switch 800 due to the off-state ACC SOI NMOSFETs. For example, for a net shunt resistance greater than 10 kohm, the insertion loss is increased by less than 0.02 dB.

In other embodiments, the $R_{ds}$ resistors may be implemented in circuits comprising a single ACC SOI MOSFET (as contrasted with the stacked shunting configuration exemplified in FIG. 8 by the shunting ACC FETs 620, 622 and 624). For example, such circuits may be desirable if there are other high-impedance elements configured in series with an ACC SOI MOSFET that may cause a significant bias voltage to be applied to the source or drain as a result of the current flow created when removing or otherwise controlling accumulated charge. One exemplary embodiment of such a circuit is shown in FIG. 9.

FIG. 9 shows an exemplary single-pole double-throw (SPDT) RF switch circuit 900 made in accordance with the present teachings. As shown in FIG. 9, a DC blocking capacitor 904 is connected to a first RF input node 905 that receives a first RF input signal RF1. Similarly, a DC blocking capacitor 906 is connected to a second RF input node 907 that receives a second RF input signal RF2. Further, a DC blocking capacitor 902 is electrically connected to an RF common output node 903 that provides an RF common output signal (RFC) selectively conveyed to the node RFC 903 by the switch circuit 900 from either the first RF input node 905 or the second RF input node 907 (i.e., RFC either outputs RF1 or RF2, depending upon the operation of the switch as controlled by the control signals C1 and C1x described below in more detail).

A first control signal C1 is provided to control the operating states of the ACC SOI NMOSFETs 526 and 528' (i.e., C1 selectively operates the FETs in the on-state or the off-state). Similarly, a second control signal C1x is provided to control the operating states of the ACC SOI NMOSFETs 528 and 526'. As is well known, and as described for example in the above incorporated commonly assigned U.S. Pat. No. 6,804,502, the control signals C1 and C1x are generated so that the ACC SOI NMOSFETs 526 and 528' are in an on-state when the ACC SOI NMOSFETs 528 and 526' are in an off-state, and vice versa. This configuration allows the RF switch circuit 900 to selectively convey either the signal RF1 or RF2 to the RF common output node 903.

A first ACS control signal C2 is configured to control the operation of the ACS terminals of the SOI NMOSFETs 526 and 528'. A second ACS control signal C2x is configured to control the ACS terminals of the ACC SOI NMOSFETs 528 and 526'. The first and second ACS control signals, C2 and C2x, respectively, are selected so that the ACSs of the associated and respective NMOSFETs are appropriately biased in order to eliminate, reduce, or otherwise control their accumulated charge when the ACC SOI NMOSFETs operate in an accumulated charge regime.

As shown in the RF switch circuit 900 of FIG. 9, in some embodiments, an $R_{ds}$ resistor 908 is electrically connected between the source and drain of the switching ACC NMOSFET 526. Similarly, in some embodiments, an $R_{ds}$ resistor 910 is electrically connected between the source and drain of the switching ACC NMOSFET 526'. According to this example, the circuit 900 is operated so that either the shunting ACC NMOSFET 528 or the shunting ACC NMOSFET 528' operate in an on-state at any time (i.e., at least one of the input signals RF1 at the node 905 or RF2 at the node 907 is always conveyed to the RFC node 903), thereby providing a low-impedance path to ground for the node 905 or 907, respectively. Consequently, either the $R_{ds}$ resistor 908 or the Rd, resistor 910 provides a low-impedance path to ground from the RF common node 903, thereby preventing voltage bias problems caused as a result of ACC current flow into the nodes 903, 905 and 907 that might otherwise be caused when using the DC blocking capacitors 902, 904 and 906.

Additional Exemplary Benefits Afforded by the ACC MOSFETs of the Present Disclosure As described above, presence of the accumulated charge in the bodies of the SOI MOSFETs can adversely affect the drain-to-source breakdown voltage (BVDSS) performance characteristics of the floating body MOSFETs. This also has the undesirable effect of worsening the linearity of off-state MOSFETs when used in certain circuits such as RF switching circuits. For example, consider the shunting SOI NMOSFET 528 shown in FIG. 9. Further consider the case wherein the shunting NMOSFET 528 is implemented with a prior art SOI NMOSFET, rather than with the ACC NMOSFET made in accordance with the present teachings. Assume that the RF transmission line uses a 50-ohm system. With small signal inputs, and when the NMOSFET 528 operates in an off-state, the prior art off-state shunting NMOSFET 528 may introduce harmonic distortion and/or intermodulation distortion in the presence of multiple RF signals This will also introduce a noticeable loss of signal power.

When sufficiently large signals are input that cause the NMOSFET 528 to enter a BVDSS regime, some of the RF current is clipped, or redirected through the NMOSFET 528 to ground, resulting in a loss of signal power. This current "clipping" causes compression behavior that can be shown, for instance, in a RF switch "Pout vs. Pin" plot. This is frequently characterized by P1$d$B, wherein the insertion loss is increased by 1.0 dB over the small-signal insertion loss. This is an obvious indication of nonlinearity of the switch. In accordance with the present disclosed method and apparatus, removing, reducing or otherwise controlling the accumulated charge increases the BVDSS point. Increases to the BVDSS point of the NMOSFET 528 commensurately increases the large-signal power handling of the switch. As an example, for a switch, doubling the BVDSS voltage of the ACC NMOSFET increases the P1 dB point by 6 dB. This is a significant accomplishment as compared with the prior art RF switch designs.

In addition, as described above in more detail, presence of the accumulated charge in SOT MOSFET body adversely impacts the magnitude of Coff and also takes time to form when the FET is switched from an on-state to an off-state. In terms of switch performance, the nonlinearity of $C_{off}$ adversely impacts the overall switch linearity performance (as described above), and the magnitude of $C_{off}$ adversely affects the small-signal performance parameters such as insertion loss, insertion phase (or delay), and isolation. By reducing the magnitude of $C_{off}$ using the present disclosed method and apparatus, the switch (implemented with ACC MOSFETs) has reduced insertion loss due to lowered parasitic capacitance, reduced insertion phase (or delay), again due to lowered parasitic capacitance, and increased isolation due to less capacitive feedthrough.

The ACC MOSFET also improves the drift characteristic of SOI MOSFETs as pertains to the drift of the small-signal parameters over a period of time. As the SOI MOSFET takes some time to accumulate the accumulated charge when the switch is off, the $C_{off}$ capacitance is initially fairly small. However, over a period of time while operated in the accumulated charge regime, the off-state capacitance $C_{off}$ increases toward a final value. The time it takes for the NMOSFET to reach a full accumulated charge state depends on the electron-hole pair (EHP) generation mechanism. Typically, this time period is on the order of approximately hundreds of milliseconds for thermal EHP generation at room temperature, for example. During this charge-up time period, the insertion loss and insertion phase increase. Also, during this time period, the isolation decreases. As is well known, these are undesirable phenomena in standard SOI MOSFET devices. These problems are alleviated or otherwise mitigated using the ACC NMOSFETs and related circuits described above.

In addition to the above-described benefits afforded by the disclosed ACC MOSFET method and apparatus, the disclosed techniques also allow the implementation of SOI MOSFETs having improved temperature performance, improved sensitivity to Vdd variations, and improved sensitivity to process variations. Other improvements to the prior art SOI MOSFETs afforded by the present disclosed method and apparatus will be understood and appreciated by those skilled in the electronic device design and manufacturing arts.

Exemplary Fabrication Methods

In one embodiment of the present disclosure, the exemplary RF switches described above may be implemented using a fully insulating substrate semiconductor-on-insulator (SOI) technology. Also, as noted above, in addition to the commonly used silicon-based systems, some embodiments of the present disclosure may be implemented using silicon-germanium (SiGe), wherein the SiGe is used equivalently in place of silicon.

In some exemplary embodiments, the MOSFET transistors of the present disclosure may be implemented using "Ultra-Thin-Silicon (UTSi)" (also referred to herein as "ultrathin silicon-on-sapphire") technology. In accordance with UTSi manufacturing methods, the transistors used to implement the inventive methods disclosed herein are formed in an extremely thin layer of silicon in an insulating sapphire wafer. The fully insulating sapphire substrate enhances the performance characteristics of the inventive RF circuits by reducing the deleterious substrate coupling effects associated with non-insulating and partially insulating substrates. For example, insertion loss improvements may be realized by lowering the transistor on-state resistances and by reducing parasitic substrate conductance and capacitance. In addition, switch isolation is improved using the fully insulating substrates provided by UTSi technology. Owing to the fully insulating nature of silicon-on-sapphire technology, the parasitic capacitance between the nodes of the RF switches is greatly reduced as compared with bulk CMOS and other traditional integrated circuit manufacturing technologies.

Examples of and methods for making silicon-on-sapphire devices that can be implemented in the MOSFETs and circuits described herein, are described in U.S. Pat. No. 5,416,043 ("Minimum charge FET fabricated on an ultrathin silicon on sapphire wafer"); U.S. Pat. No. 5,492,857 ("High-frequency wireless communication system on a single ultrathin silicon on sapphire chip"); U.S. Pat. No. 5,572,040 ("High-frequency wireless communication system on a single ultrathin silicon on sapphire chip"); U.S. Pat. No. 5,596,205 ("High-frequency wireless communication system on a single ultrathin silicon on sapphire chip"); U.S. Pat. No. 5,600,169 ("Minimum charge FET fabricated on an ultrathin silicon on sapphire wafer"); U.S. Pat. No. 5,663,570 ("High-frequency wireless communication system on a single ultrathin silicon on sapphire chip"); U.S. Pat. No. 5,861,336 ("High-frequency wireless communication system on a single ultrathin silicon on sapphire chip"); U.S. Pat. No. 5,863,823 ("Self-aligned edge control in silicon on insulator"); U.S. Pat. No. 5,883,396 ("High-frequency wireless communication system on a single ultrathin silicon on sapphire chip"); U.S. Pat. No. 5,895,957 ("Minimum charge FET fabricated on an ultrathin silicon on sapphire wafer"); U.S. Pat. No. 5,920,233 ("Phase locked loop including a sampling circuit for reducing spurious side bands"); U.S. Pat. No. 5,930,638 ("Method of making a low parasitic resistor on ultrathin silicon on insulator"); U.S. Pat. No. 5,973,363 ("CMOS circuitry with shortened P-channel length on ultrathin silicon on insulator"); U.S. Pat. No. 5,973,382 ("Capacitor on ultrathin semiconductor on insulator"); and U.S. Pat. No. 6,057,555 ("High-frequency wireless communication system on a single ultrathin silicon on sapphire chip"). All of these referenced patents are incorporated herein in their entirety for their teachings on ultrathin silicon-on-sapphire integrated circuit design and fabrication.

Similarly to other bulk and SOI CMOS processes, an SOS enhancement mode NMOSFET, suitable for some embodiments of the present disclosure, may, in some embodiments, be fabricated with a p-type implant into the channel region with n-type source and drain regions, and may have a threshold voltage of approximately +500 mV. The threshold voltage is directly related to the p-type doping level, with higher doping resulting in higher thresholds. Similarly, the SOS enhancement mode PMOSFET may, in some exemplary embodiments, be implemented with an n-type channel region and p-type source and drain regions. Again, the doping level defines the threshold voltage with higher doping resulting in a more negative threshold.

In some exemplary embodiments, an SOS depletion-mode NMOSFET, suitable for some embodiments of the present disclosure, may be fabricated by applying the p-type channel-implant mask to the n-type transistor, resulting in a structure that has n-type channel, source, and drain regions and a negative threshold voltage of approximately −500 mV. Similarly, in some exemplary embodiments, a suitable depletion-mode PMOSFET may be implemented by applying the n-type channel-implant mask to the p-type transistor, resulting in a structure that has p-type channel, source, and drain regions and a positive threshold voltage of approximately +500 mV.

As noted in the background section above, the present ACC MOSFET apparatus can also be implemented using any convenient semiconductor-on-insulator technology, included, but not limited to, silicon-on-insulator, silicon-on-sapphire, and silicon-on-bonded wafer technology. One such silicon-on-bonded wafer technique uses "direct silicon bonded" (DSB) substrates. Direct silicon bond (DSB) substrates are fabricated by bonding and electrically attaching a film of single-crystal silicon of differing crystal orientation onto a base substrate. Such implementations are available from the Silicon Genesis Corporation headquartered in San Jose, Calif. As described at the Silicon Genesis Corporation website (publicly available at "www.sigen.com"), silicon-on-bonded wafer techniques include the so-called Nano-Cleave™ bonding process which can be performed at room temperature. Using this process, SOI wafers can be formed with materials having substantially different thermal expansion coefficients, such as in the manufacture of Germanium-on-Insulator wafers (GeOI). Exemplary patents describing silicon-on-bonded wafer implementations are as follows: U.S. Pat. No. 7,056,808, issued Jun. 6, 2006 to Henley, et al.;

U.S. Pat. No. 6,969,668, issued Nov. 29, 2005 to Kang, et al.; U.S. Pat. No. 6,908,832, issued Jun. 21, 2005 to Farrens et al.; U.S. Pat. No. 6,632,724, issued Oct. 14, 2003 to Henley, et al. and U.S. Pat. No. 6,790,747, issued Sep. 14, 2004 to Henley, et al. All of the above-cited patents are incorporated by reference herein for their teachings on techniques and methods of fabricating silicon devices on bonded wafers.

A reference relating to the fabrication of enhancement-mode and depletion-mode transistors in SOS is "CMOS/SOS/LSI Switching Regulator Control Device," Orndorff, R. and Butcher, D., Solid-State Circuits Conference, Digest of Technical Papers, 1978 IEEE International, Volume XXI, pp. 234-235, February 1978. The "Orndorff" reference is hereby incorporated in its entirety herein for its techniques on the fabrication of enhancement-mode and depletion-mode SOS transistors.

Embodiments of Methods and Apparatuses for Improving Linearity Characteristics in Accordance with the Present CIP The present CIP describes methods and apparatuses for improving linearity characteristics of ACC FETs. Persons skilled in the art of electronics devices will appreciate that the teachings herein apply equally to NMOSFETs and PMOSFETs and other similar devices. For simplicity, the embodiments and examples presented herein for illustrative purposes may include only NMOSFETs, unless otherwise noted. By making well known changes to dopants, charge carriers, polarity of bias voltages, etc., persons skilled in the art of electronic devices will easily understand how these embodiments and examples may be adapted for use with PMOSFETs and other similar devices.

Research shows that the above-described ACC field-effect-transistors (FETs) exhibit linearity sensitivity when the ACC FETs are in an OFF state. This linearity sensitivity is in large part caused by body-gate potential difference when the ACC FET is turned OFF. This sensitivity is most clearly defined as degradation in second and third order inter-modulation harmonic distortion, although it may encompass other signal degradation as well. In many implementations, body-to-gate voltage ($V_{BG}$) is set according to the diode voltage drop, a value that is dependent on body current. Because body current has a delta of several orders of magnitude, $V_{BG}$ likewise varies accordingly. Evidence suggests that parasitic MOS capacitance in the ACS region causes the observed linearity sensitivity. In order to overcome the current sensitivity to linearity, various combinations of two methods are described that provide improvement in the linearity characteristics of the above-described ACC FETs.

The methods and apparatus described herein provide improvements to FET linearity characteristics by modifying the above-described accumulated charge control (ACC) FETs. Harmonic performance is improved using the presently disclosed improved methods and apparatus. In this improved method of using ACSs to improve harmonic performance, the body-to-gate potential sensitivity provides an impetus for providing improved solutions. Because the implant within the ACS itself generates harmonic interference at the desired range of operating voltage in the above described methods and apparatus, an improved method and apparatus is defined as an optimization of using ACSs to improve even and odd harmonics.

An overview of two methods providing linearity improvement is now presented. The first method comprises controlling the doping levels and the doping materials of the implant (also referred to herein as "improved body contact") in the ACS region, so that the worst case harmonic peak is shifted away from standard or desired operating conditions. This method is described in additional detail in the section below entitled "Modification to ACS Implant." The second method comprises providing a structure that cancels, in part or entirely, the voltage drop across parasitic capacitance between the body and the gate of the MOSFET having an ACS. In such a structure, voltages across non-linear parasitic capacitance terms are consequently set to zero, which advantageously nullifies the generation of non-linearity altogether. This method is described in additional detail in the section below entitled "Dual ACS Device Implementation with AC short."

Modification to ACS Implant

By altering the doping type and the doping levels of the implant in the ACS region, the worst-case peak deviating from linearity can be moved away from standard operating conditions. More specifically, modifications of the implants can move the worst-case harmonic peak either to more negative bias voltages, or closer to zero bias condition. Because each direction has its advantages and disadvantages, there is room for tunability to the application specifications. Characterization of a variety of implants would provide for the desired tunability in future applications.

In silicon processes, selecting different types of the implant and tuning the implant levels will shift the worst-case harmonic peak away from desired operating conditions. More accurately, this shifts the body voltage worst-case harmonics peak away from approximate operational voltage magnitudes to values more or less than operational voltages (a shift from $V_{Bworst} \sim V_{Boperational}$ to $V_{Bworst} < V_{Boperational}$ or $V_{Bworst} > V_{Boperational}$). The N-type and P-type implants are standard process applicable. Even and odd harmonic improvements were seen throughout all testing results.

Figure 10A:
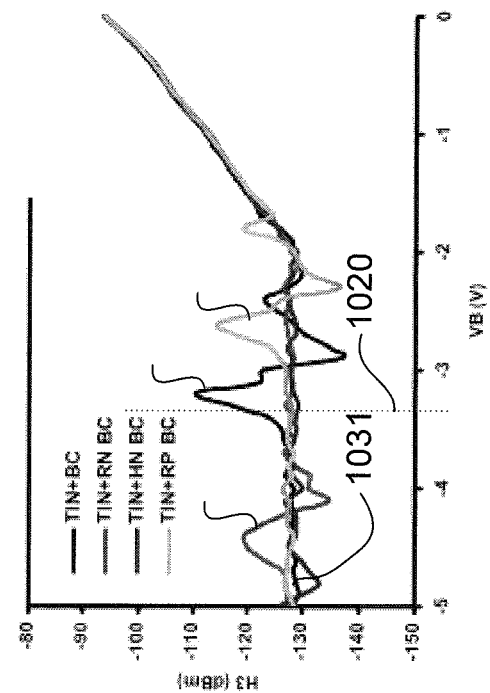
FIG. 10A shows the second order harmonic response on an ACC MOSFET with various dopants and dopant levels in the ACS region.
Figure 10B:
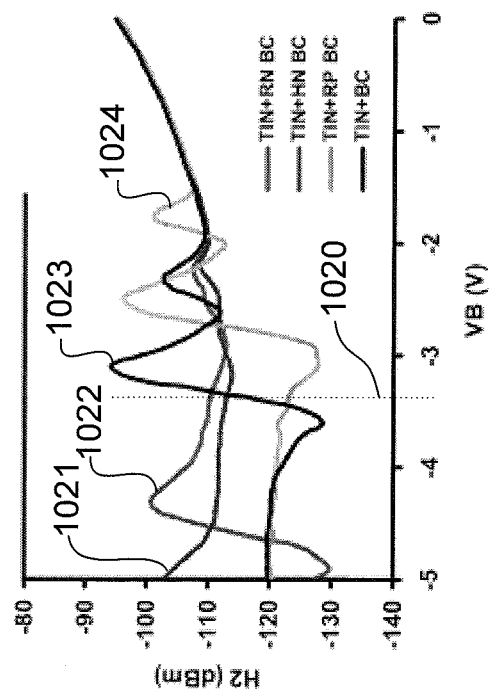
FIG. 10B shows the third order harmonic response on an ACC MOSFET with various dopants and dopant levels in the ACS region.

FIGS. 10A and 10B show the harmonic response of an ACC MOSFET versus body bias voltage with various types of dopants and dopant levels adjustment of the implant in the ACS region. FIG. 10A shows the second harmonic response and FIG. 10B shows the third harmonic response, where vertical line 1020 in both figures represents the operational gate bias voltage of approximately −3.3 volts. Note that in FIGS. 10A and 10B, TIN (thick oxide intrinsic NMOSFET) refers to the processes in which a thick oxide was used to fabricate the NMOSFET under test and the device is an intrinsic NMOSFET. The testing results presented in FIGS. 10A and 10B demonstrate how adjusting the implant in the ACS region shifts the curves of the harmonic responses from the results of an NMOSFET without any engineering in the ACS implant which correspond to Curve 1023 in FIG. 10A and Curve 1033 in FIG. 10B. As shown by FIGS. 10A and 10B, a significant nonlinear response (i.e., a "harmonic wrinkle") occurs around the operational voltage of the device due to the formation of a parasitic MOS capacitor in the ACS region which is turned on when the bias voltage difference between gate and body terminals is approximately zero. Curve 1021 in FIG. 10A and Curve 1031 in FIG. 10B show the results from heavily doped P-type implant in the ACS region. Curve 1022 in FIG. 10A and Curve 1032 in FIG. 10B show the results from lightly doped P-type implant. Curve 1023 in FIG. 10A and Curve 1033 in FIG. 10B show the results from lightly-doped N-type implant. As can be seen from FIGS. 10A and 10B, P-type implants push the worst case harmonic peak toward more negative operational voltage region, while N-type implants push the peak closer to zero bias condition.

As briefly discussed above, the non-linear harmonic response is believed to arise from the parasitic MOS capacitance in the ACS region. Adjusting the implant in the ACS region allows for the voltage threshold in which the parasitic MOS capacitor is turned on to be moved out of the desired operational voltage range to achieve a linear or near-linear response within the specified operating range.

By selecting and controlling the dopant material and dopant levels in the ACS region, undesirable harmonic responses can be moved away from the operational regions of an ACC MOSFET. The adjustment of the implant in the ACS region may be done with nearly any embodiment of an ACC MOSFET in nearly any configuration, such as those discussed above with reference to FIGS. 3A to 3J. Also, as is well-known to those skilled in the electronic device design arts, in other embodiments, an ACC NMOSFET or ACC PMOSFET can be implemented by selecting the appropriate dopant materials used to implement the various FET component regions and then tuning the dopant level of the ACS region to achieve the desired harmonic response.

Dual ACS Device Implementation with AC Short

In accordance with the present method and apparatus, a dual ACS (or "body contact") device retains similarities to a standard H-gate FET device (such as the device shown in FIG. 3K), however, the following proposed layout maintains minimum size connections for the ACS regions contact with the body region. This allows for layouts to be created at the minimum edge of polysilicon spacing, which is easily achieved when the contact is removed.

Figure 15:
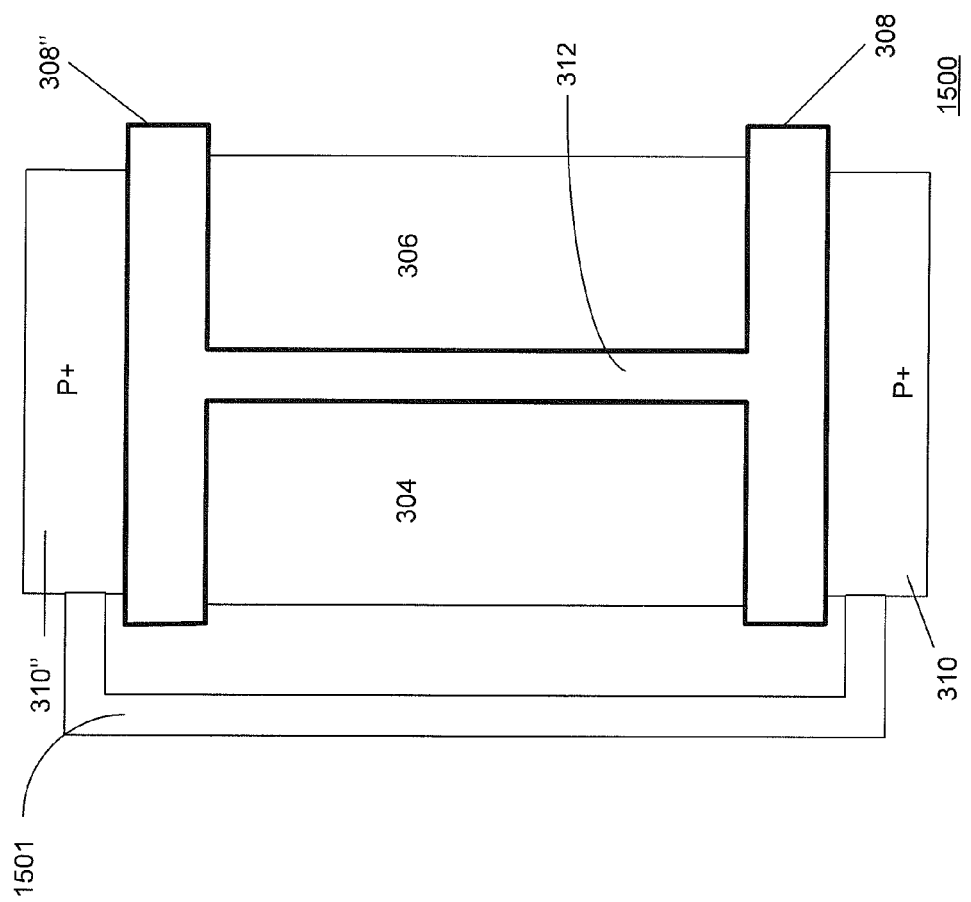
FIG. 15 shows an exemplary simplified layout of a dual body ACS ACC MOSFET with an AC short made in accordance with the present methods and apparatus.

The new H-gate type device is defined by an AC short between the dual-sided ACS regions at the bottom of the FET stack. Because each of the ACS regions on each side of the stack is independently radio-frequency coupled by parasitic capacitance to the gate polysilicon, second-order intermodulation distortion harmonics improve dramatically with symmetry. Because the body contacts on either side of the stack are shorted together, and thus jointly coupling to the gate polysilicon, there is a cancellation of voltage across $C_{BG}$. This cancellation of voltage sets the voltage across nonlinear capacitances to 0V, voiding the generation of nonlinearity altogether. FIG. 15 shows an exemplary simplified layout of a dual body ACS ACC MOSFET with an AC short.

FIG. 15 is similar to the structure of the MOSFET shown in FIG. 3K, except that FIG. 15 shows the addition of an AC short structure. FIG. 15K is a simplified top view schematic of an embodiment of an ACC SOI NMOSFET adapted to control accumulated charge and configured in an "H-gate" configuration. FIG. 3K shows the ACC NMOSFET 1500 without its gate contact 301, gate 302, and gate oxide being visible. With the exception of some structural differences described herein, the ACC NMOSFET 1500 is very similar in design and function to the ACC NMOSFETs described above with reference to FIGS. 3A-3D and 3J. As shown in FIG. 15, the ACC NMOSFET 1500 includes two ACSs, 308 and 308", disposed at opposite ends of the H-gate ACC NMOSFET 1500. P+ electrical contact regions 310 and 310" are formed to abut their respective ACSs, 308 and 308", and provide electrical contact thereto. In accordance with the disclosed method and apparatus, as described above, when the ACC NMOSFET 1500 is biased to operate in the accumulated charge regime, the accumulated charge present in the body 312 is removed or otherwise controlled via the two ACSs 308 and 308". FIG. 15 shows an AC short structure 1501 electrically connecting the two ACSs, 308 and 308", through their respective electrical contact regions 310 and 310". Essentially, the AC short structure 1501 shorts the two ACSs, 308 and 308", together. The AC short structure 1501 may be provided by a metal layer or a conductive semiconductor layer or other methods or techniques.

By evening parasitic capacitance on the source and drain sides of the device (due to symmetry), and connecting the symmetrical body contacts (with the H-gate AC short), 20 to 30 dB improvements in second and third order harmonics versus their worst-case spikes are observed. Also, the layout lowered harmonic body-to-gate potential difference sensitivity.

Figure 11A:
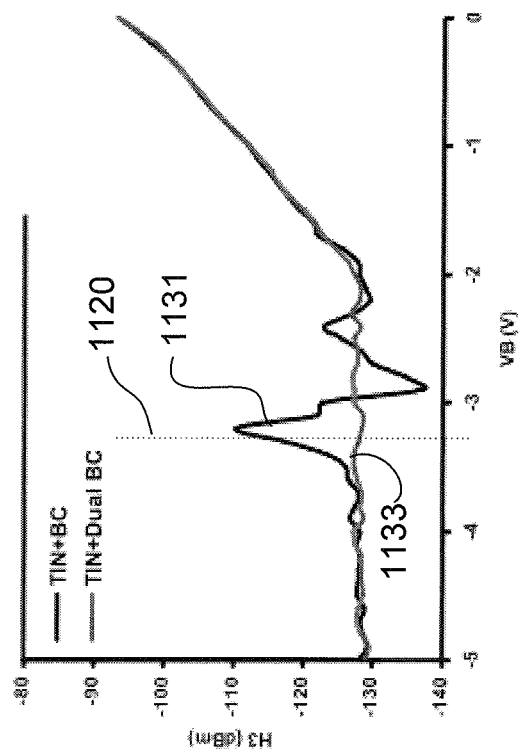
FIGS. 11A and 11B show respectively the second- and third-order harmonic responses of an AC shorted dual ACS ACC MOSFET and a single ACS ACC MOSFET versus body bias voltage without any engineering in the ACS implant of both devices.
Figure 11B:
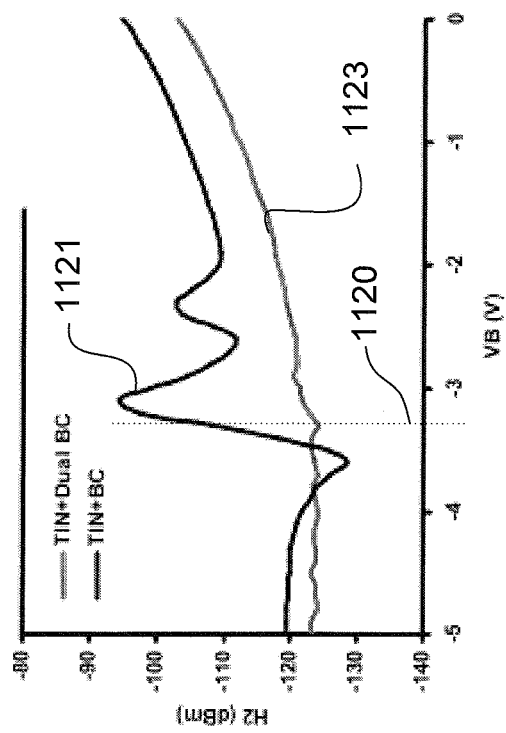

It is also noted that the AC short can be made by any of the interconnect methods, direct or inductive. An example of a direct connection is by use of a metal layer. An example of an inductive connection is use of P+ routing FIGS. 11A and 11B show respectively the second- and third-order harmonic responses of an AC shorted dual ACS ACC MOSFET and a single ACS ACC MOSFET versus body bias voltage without any engineering in the ACS implant of both devices. In FIG. 11A, curve 1121 represents the second-order harmonic response of a single ACS ACC MOSFET with a spike (i.e., a "harmonic wrinkle") around the operating voltage of the device (indicated by line 1120). On the other hand, Curve 1123 represents the harmonic response of an AC shorted dual ACS ACC MOSFET where the spike is almost completely removed. Similar trend can also be observed in terms of third-order harmonic response as shown in FIG. 11B. Together, FIGS. 11A and 11B demonstrate that, the AC shorted dual ACS ACC MOSFET provides an effective way to almost completely remove the harmonic spike (and the accumulation of degrading harmonics) observed in an ACC MOSFET with ACS other than shifting the position of the harmonic spike with the adjustment of the implant in the ACS region.

Figure 12:
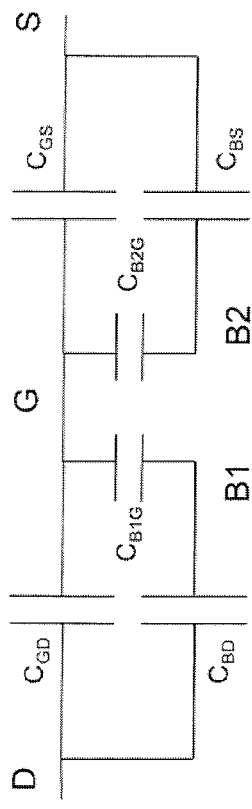
FIG. 12 shows a schematic of an exemplary H-gate dual body contact (ACS) FET device without an AC short present at the bottom of the FET device.
Figure 13:
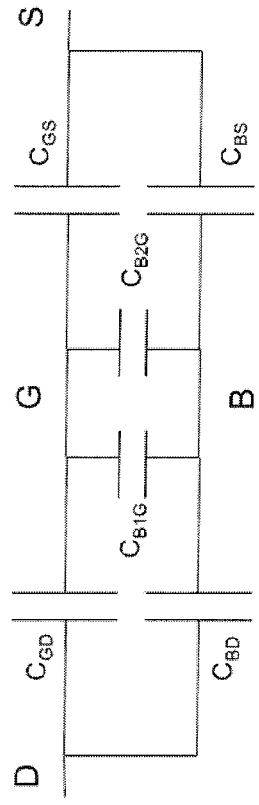
FIG. 13 shows a schematic of an exemplary H-gate dual body contact (ACS) FET device with the AC short shown at the bottom of the FET device.

To illustrate the importance of the AC shorted configuration in a dual ACS ACC MOSFET, FIG. 12 shows a schematic of an exemplary H-gate dual body contact (ACS) FET device without an AC short present at the bottom of the FET device while FIG. 13 shows a schematic of an exemplary H-gate dual body contact (ACS) FET device with the AC short shown at the bottom of the FET device. As exemplified in FIG. 12, with dual ACS but without the AC short, better second-order harmonics is still expected due to symmetry of the switch operation compared to the configuration with single ACS. However, worse third-order harmonics are expected due to the finite voltage difference between the common gate and the individual ACS region which doubles the harmonics contribution compared to the configuration with single ACS if the capacitors between the gate and the ACS regions exhibit nonlinear responses.

With the AC short and balanced capacitances, the voltage difference between the body and the gate is forced to be zero due to the voltage balance. (That is, $C_{GD}=C_{GS}$ and $C_{BD}=C_{BS}$, causing $V_{BG}=0V$). If $V_{BG}=0$, then even if $C_{BG}$ is nonlinear, there is no voltage across the capacitor to generate C(V) nonlinearity.

Figure 14:
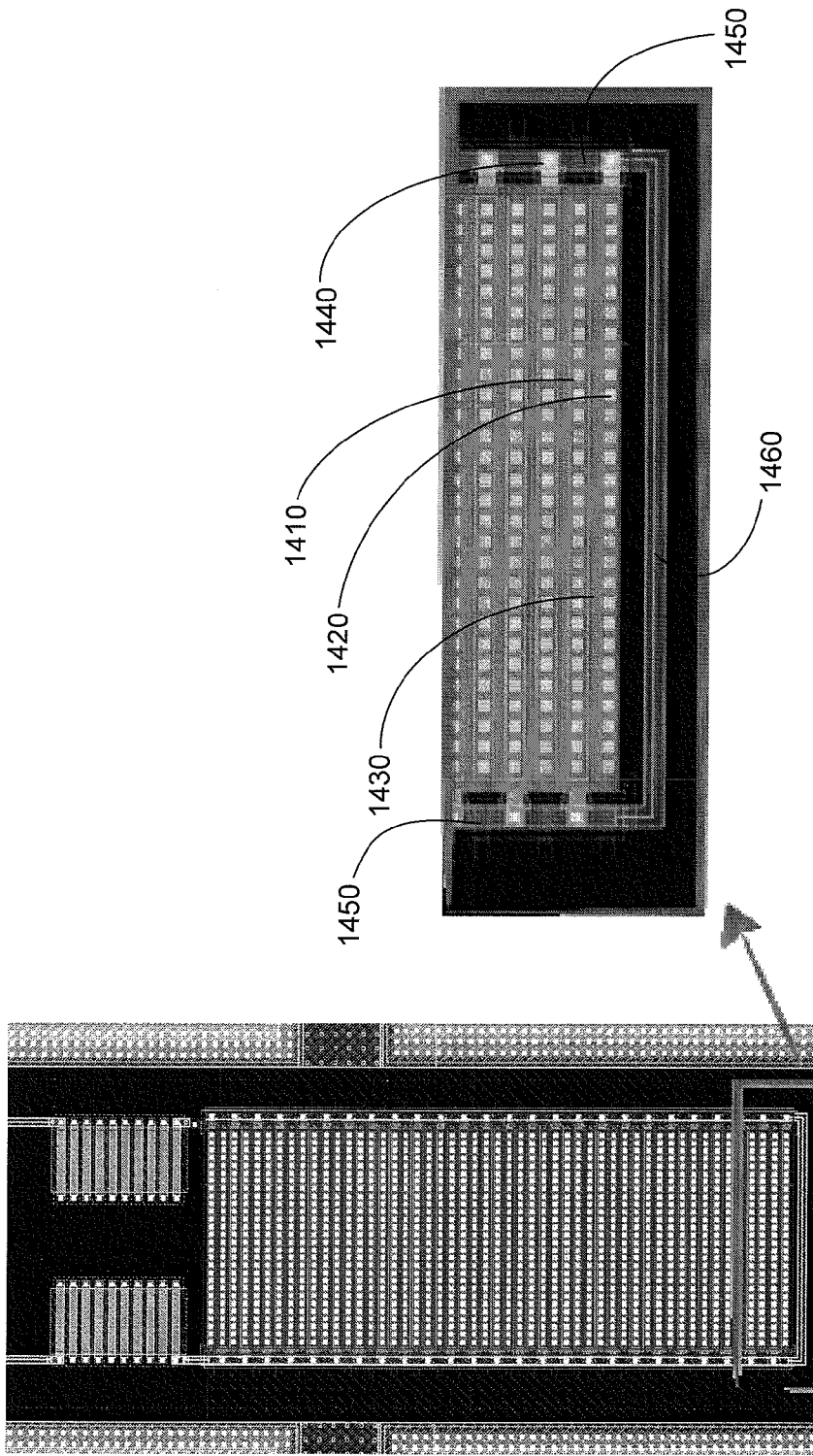
FIG. 14A shows an exemplary dual ACS contact test structure layout in accordance with the present methods and apparatus.
FIG. 14B shows a magnified version of the AC short shown at the bottom of the FET stack shown in FIG. 14A.

FIGS. 14A and 14B show exemplary dual ACS contact test structure layouts in accordance with the present methods and apparatus. FIG. 14B shows a magnified version of the AC short shown at the bottom of the FET stack shown in FIG. 14A. FIG. 14A shows an array of contact vias for source and drain regions where the MOSFET is structured as many small segments of source, drain, and gate regions to provide for desired performance. FIG. 14B shows a row of source region contact vias (shown as the row of small squares where one square is labeled as 1410) and a row of drain region contact vias (shown as the row of small squares where one square is labeled as 1420). The gray area in between the source region contact vias and the drain regions contact vias 1430 is the gate region. Electrical contact to the ACS regions (not shown in FIG. 14B) is provided by ACS electrical contacts 1440 at each end of the gate regions 1430. The ACS electrical contacts 1440 are connected together by body bus bars 1450. A shorting electrical connection to the ACS electrical contacts is provided by a metalized AC short 1460.

The effectiveness of the AC short in reducing the linearity sensitivity of the dual ACS contact MOSFET may be improved by controlling certain layout dependent characteristics. These layout dependent characteristics include controlling layout dependent critical capacitances. These critical capacitances include the following: (1) $C_{GS}$ should be the same as $C_{GD}$; and (2) $C_{BS}$ should be the same as $C_{BD}$; and (3) $C_{GG}$ and $C_{BB}$ should be negligible. Also, for FETs with many fingers, if symmetric, parasitics should be almost identical. Such capacitances may be achieved through a layout where the source and drain are symmetric with respect to a horizontal line passing through a center of the gate. Layout connections may also improve the effectiveness of the AC short. Preferably, contacts to the ACS regions on both sides of the MOSFET should be connected together through a low impedance path. In the layout shown in FIG. 14B, a second metal layer connects the body bus bars 1450 on either side of the structure.

2D and 3D Symmetric "N"-body contact Device Implementation with AC Short

The ideology behind a two-dimensionally symmetric dual ACS (body contact) FET device with an AC short can be extended to a triple-body contact device, quadruple contact device, and so on, up to an "N"-body contact device, as long as two dimensional symmetry is maintained. An N-body contact device may also be thought of as an annular device. Also, should devices be made in three dimensional layers, that is, a series of stacked, two dimensional devices, approximated as three dimensional vis-á-vis a summation technique, again, so long as symmetry is maintained, shorting the three dimensionally layered n-body contacts together will produce better second and third order harmonics.

As indicated above, embodiments according to the present invention are not limited to a single ACS region contacting the MOSFET body at one end of the body or dual ACS regions contacting the MOSFET body at both ends of the body. Alternative MOSFET architectures according to embodiments of the present invention may allow for multiple ACS regions to contact the MOSFET body in a variety of orientations. Preferably, the ACS regions are disposed in a symmetric manner so as to maximize the cancellation of voltage across $C_{BG}$ when shorting the ACS regions, which provides for reduction of the second order harmonic. The multiple ACS regions are also preferably disposed close to the Gate oxide, where the accumulated charges are located. As indicated above, MOSFET architectures may also comprise three dimensional structures. Again, embodiments of the present invention having three dimensional structures may have multiple ACS regions contacting the MOSFET body. ACS regions in such a three dimensional structure are preferably disposed in a symmetric manner.

Still other embodiments of the present invention may use both the method described above of controlling the doping type and doping level of the ACS region and the method described above of shorting the ACS regions to achieve a linearity improvement in a MOSFET. Note also that an electrical contact region or regions to the ACS region may comprise the same material as the ACS region, that is, the two regions may be coextensive. In other embodiments, the two regions may be different materials, such as shown in FIG. 14B, where electrical contacts to the ACS regions are made via a metal layer. In still other embodiments, electrical contact regions and ACS regions may comprise regions doped at different levels and/or doped with different materials.

Electrical connections to MOSFETs incorporating either or both of the described method of controlling the ACS region implant and the AC short may be made in the manner described above in regard to FIGS. 4A through 4G and FIGS. 5A through 5D. For example, an electrical connection may be made from each ACS region to the MOSFET gate, such as shown in FIG. 4B and described above. Embodiments of MOSFETs incorporating the described methods may also be utilized in electrical circuits as described above in regard to FIGS. 6, 8 and 9 and other circuits where such MOSFETS provide desired performance.

The foregoing Detailed Description of exemplary and preferred embodiments is presented for purposes of illustration and disclosure in accordance with the requirements of the law. It is not intended to be exhaustive nor to limit the invention to the precise form or forms described, but only to enable others skilled in the art to understand how the invention may be suited for a particular use or implementation. The possibility of modifications and variations will be apparent to practitioners skilled in the art.

No limitation is intended by the description of exemplary embodiments which may have included tolerances, feature dimensions, specific operating conditions, engineering specifications, or the like, and which may vary between implementations or with changes to the state of the art, and no limitation should be implied therefrom. In particular it is to be understood that the disclosures are not limited to particular compositions or biological systems, which can, of course, vary. This disclosure has been made with respect to the current state of the art, but also contemplates advancements and that adaptations in the future may take into consideration of those advancements, namely in accordance with the then current state of the art. It is intended that the scope of the invention be defined by the Claims as written and equivalents as applicable. It is also to be understood that the terminology used herein is for the purpose of describing particular embodiments only, and is not intended to be limiting. Reference to a claim element in the singular is not intended to mean "one and only one" unless explicitly so stated. As used in this specification and the appended claims, the singular forms "a," "an," and "the" include plural referents unless the content clearly dictates otherwise. The term "several" includes two or more referents unless the content clearly dictates otherwise. Unless defined otherwise, all technical and scientific terms used herein have the same meaning as commonly understood by one of ordinary skill in the art to which the disclosure pertains.

Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising step(s) for . . . "

A number of embodiments of the disclosure have been described. Nevertheless, it will be understood that various modifications may be made without departing from the spirit and scope of the present disclosure. Accordingly, other embodiments are within the scope of the following claims.

What is claimed is:

1. An accumulated charge control (ACC) floating body metal-oxide-semiconductor field effect transistor (MOSFET) comprising:

a gate;

a drain;

a source;

a body, wherein the body comprises a gate modulated conductive channel between the source and the drain;

a gate oxide layer positioned between the gate and the body; and an accumulated charge sink (ACS) operatively coupled to the body, wherein the ACS comprises material selected to shift a capacitance versus voltage inflection inside the ACS outside of an operational body bias voltage range; wherein accumulated charge is present in the body of the floating body MOSFET when the MOSFET is biased to operate in an accumulated charge regime, and wherein the gate modulated conductive channel, source, and drain have carriers of identical polarity when the MOSFET is biased to operate in an on-state and wherein the MOSFET operates in the accumulated charge regime when the MOSFET is biased to operate in a off-state and when the accumulated charge has a polarity that is opposite to the polarity of the source, drain, and gate modulated conductive channel; further comprising an electrical contact region wherein the electrical contact region and the ACS are coextensive.

2. An accumulated charge control (ACC) floating body metal-oxide-semiconductor field effect transistor (MOSFET) comprising:

a gate;
a drain;
a source;

a body, wherein the body comprises a gate modulated conductive channel between the source and the drain;

a gate oxide layer positioned between the gate and the body; and an accumulated charge sink (ACS) operatively coupled to the body, wherein the ACS comprises material selected to shift a capacitance versus voltage inflection inside the ACS outside of an operational body bias voltage range; wherein accumulated charge is present in the body of the floating body MOSFET when the MOSFET is biased to operate in an accumulated charge regime, and wherein the gate modulated conductive channel, source, and drain have carriers of identical polarity when the MOSFET is biased to operate in an on-state and wherein the MOSFET operates in the accumulated charge regime when the MOSFET is biased to operate in a off-state and when the accumulated charge has a polarity that is opposite to the polarity of the source, drain, and gate modulated conductive channel; further comprising an electrical contact region positioned proximate to and in electrical contact with the ACS, wherein the electrical contact region facilitates electrical coupling to the ACS and wherein the electrical contact region comprises same material as material comprising the ACS.

3. An accumulated charge control (ACC) floating body metal-oxide-semiconductor field effect transistor (MOSFET) comprising:

a gate;
a drain;
a source;

a body, wherein the body comprises a gate modulated conductive channel between the source and the drain;

a gate oxide layer positioned between the gate and the body; and an accumulated charge sink (ACS) operatively coupled to the body, wherein the ACS comprises material selected to shift a capacitance versus voltage inflection inside the ACS outside of an operational body bias voltage range; wherein accumulated charge is present in the body of the floating body MOSFET when the MOSFET is biased to operate in an accumulated charge regime, and wherein the gate modulated conductive channel, source, and drain have carriers of identical polarity when the MOSFET is biased to operate in an on-state and wherein the MOSFET operates in the accumulated charge regime when the MOSFET is biased to operate in a off-state and when the accumulated charge has a polarity that is opposite to the polarity of the source, drain, and gate modulated conductive channel; further comprising an electrical contact region positioned proximate to and in electrical contact with the ACS, wherein the electrical contact region facilitates electrical coupling to the ACS and wherein the electrical contact region comprises different material from material comprising the ACS.

4. An accumulated charge control floating body MOSFET (ACC MOSFET) adapted to control charge accumulated in the body of the MOSFET when the MOSFET is biased to operate in an accumulated charge regime, comprising:

a gate, drain, source, floating body, and a gate oxide layer positioned between the gate and the floating body, wherein the ACC MOSFET is biased to operate in the accumulated charge regime when the MOSFET is operated in a non-conducting or near non-conducting state and charge accumulates within the body in a region proximate and underneath the gate oxide layer;

a plurality of accumulated charge sinks positioned proximate portions of the floating body wherein each accumulated charge sink of the plurality of accumulated charge sinks is electrically coupled to the floating body, and wherein, when the MOSFET is operated in the accumulated charge regime, ACS bias voltages are applied to each accumulated charge sink to control the accumulated charge in the MOSFET body or to remove the accumulated charge from the MOSFET body via the plurality of accumulated charge sinks; and a plurality of electrical contact regions positioned proximate to corresponding accumulated charge sinks, wherein each electrical contact region facilitates electrical coupling to the corresponding accumulated charge sink.

5. An accumulated charge control floating body MOSFET (ACC MOSFET) adapted to control charge accumulated in the body of the MOSFET when the MOSFET is biased to operate in an accumulated charge regime, comprising:

a) a gate, drain, source, floating body, and a gate oxide layer positioned between the gate and the floating body, wherein the ACC MOSFET is biased to operate in the accumulated charge regime when the MOSFET is operated in a non-conducting or near non-conducting state and charge accumulates within the body in a region proximate and underneath the gate oxide layer;

b) a first accumulated charge sink (ACS) positioned proximate a first distal end of the floating body, wherein the first ACS is in electrical communication with the floating body, and wherein, when the MOSFET is operated in the accumulated charge regime, a first ACS bias voltage ($V_{ACS1}$) is applied to the first ACS to control the accumulated charge in the MOSFET body or to remove the accumulated charge from the MOSFET body via the first ACS;

c) a second accumulated charge sink (ACS) positioned proximate a second distal end of the floating body, wherein the second ACS is in electrical communication with the floating body and wherein, when the MOSFET is operated in the accumulated charge regime, a second ACS bias voltage ($V_{ACS2}$) is applied to the second ACS to control the accumulated charge in the MOSFET body or to remove the accumulated charge from the MOSFET body via the second ACS;

d) a first electrical contact region positioned proximate to and in electrical communication with the first ACS, wherein the electrical contact region facilitates electrical coupling to the first ACS; and e) a second electrical contact region positioned proximate to and in electrical communication with the second ACS, wherein the electrical contact region facilitates electrical coupling to the second ACS.

6. The ACC MOSFET of claim 1, 2, 3, 4 or 5, wherein the body comprises silicon having a thickness between approximately 100 angstroms to approximately 2,000 angstroms.

7. The ACC MOSFET of claim 1, 2, 3, 4 or 5, wherein a bias voltage is applied to the ACS when the ACC MOSFET is biased to operate in an off-state, and wherein the bias voltage applied to the ACS is substantially negative with respect to ground.

8. The ACC MOSFET of claim 1, 2, 3, 4 or 5, wherein the ACC MOSFET is fabricated in a silicon layer on an insulating layer, and wherein the source and drain extend substantially proximate the insulating layer.

\* \* \* \* \*